United States Patent [19]
Koulopoulos et al.

[11] Patent Number: 5,266,908
[45] Date of Patent: Nov. 30, 1993

[54] MULTIPLE CLOCK SIGNAL GENERATOR APPARATUS

[75] Inventors: Michael A. Koulopoulos, Andover; Russell A. Siggelkoe, Natick; Thomas R. Hegg, Chestnut Hill, all of Mass.

[73] Assignee: Vimak Corporation, Woburn, Mass.

[21] Appl. No.: 9,293

[22] Filed: Jan. 26, 1993

Related U.S. Application Data

[62] Division of Ser. No. 708,061, May 30, 1991.

[51] Int. Cl.⁵ ............................................. H03L 7/099
[52] U.S. Cl. ............................................. 331/2; 331/8; 331/14; 331/17; 331/25
[58] Field of Search ................... 331/8, 14, 17, 25, 2; 369/47, 59

[56] References Cited

U.S. PATENT DOCUMENTS

| | | | |
|---|---|---|---|
| 3,927,384 | 12/1975 | Jezo | 331/2 |
| 4,550,292 | 10/1985 | Smith | 331/2 |
| 4,667,317 | 5/1987 | Baggen | 369/59 |
| 4,914,695 | 4/1990 | Martin | 380/7 |
| 5,056,075 | 10/1991 | Marata et al. | 369/47 X |
| 5,122,763 | 6/1992 | Saeki et al. | 331/2 |

*Primary Examiner*—Siegfried H. Grimm
*Attorney, Agent, or Firm*—Dick and Harris

[57] ABSTRACT

A digital-to-analog converter—preamplifier apparatus serving as an interface between a source of digital audio signal data and an amplifier is disclosed. A digital stage receives multiple digital audio signal inputs, a selected one of which is analyzed by a digital audio interface receiver, processed by a digital signal processing device and a delta-sigma modulator prior to passing to the analog stage for conversion from the digital domain into left and right channel analog audio output signals. Volume control is performed on the audio signal in both the digital domain and the analog domain in order to optimize performance and minimize noise. The present invention automatically adjust for input word lengths of greater than 18-bits.

2 Claims, 72 Drawing Sheets

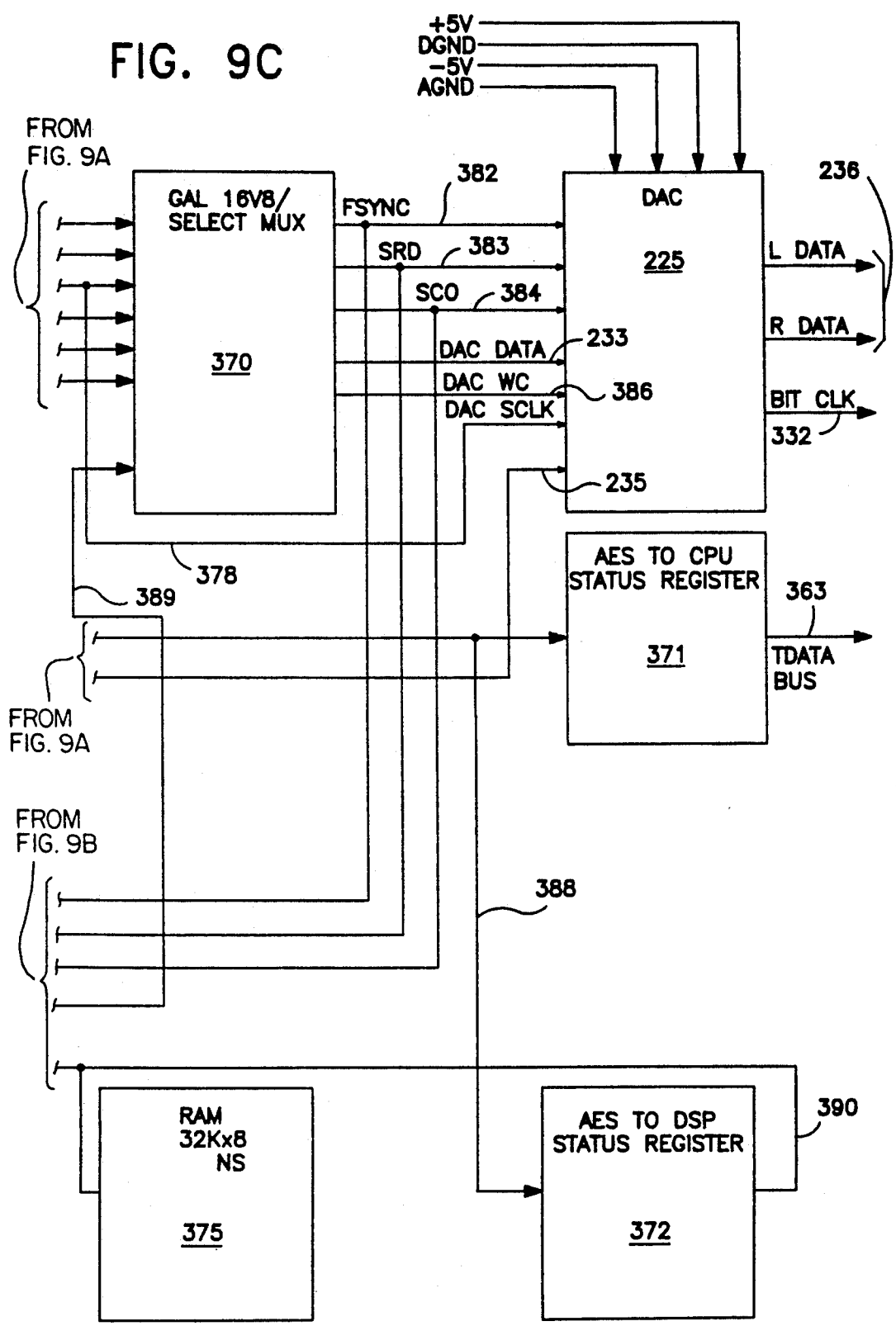

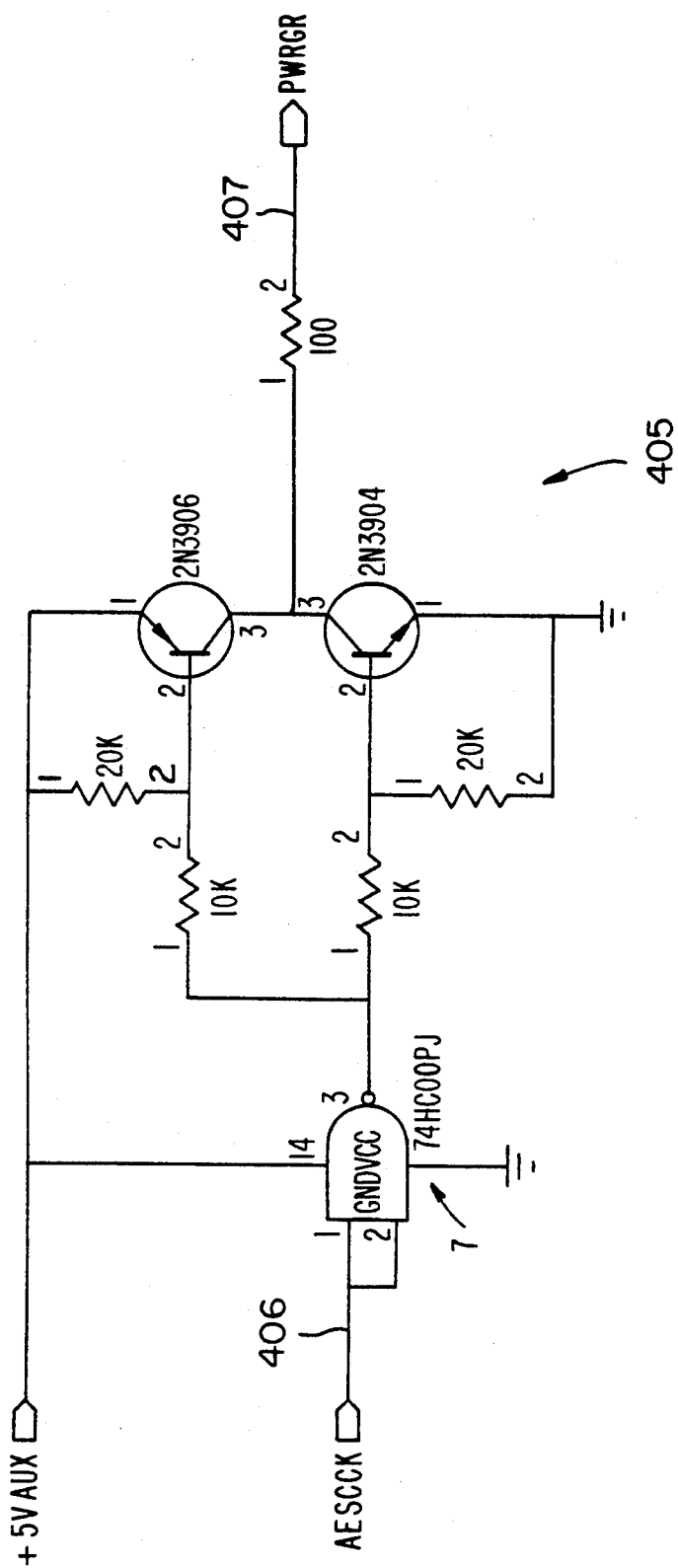
FIG. IIA

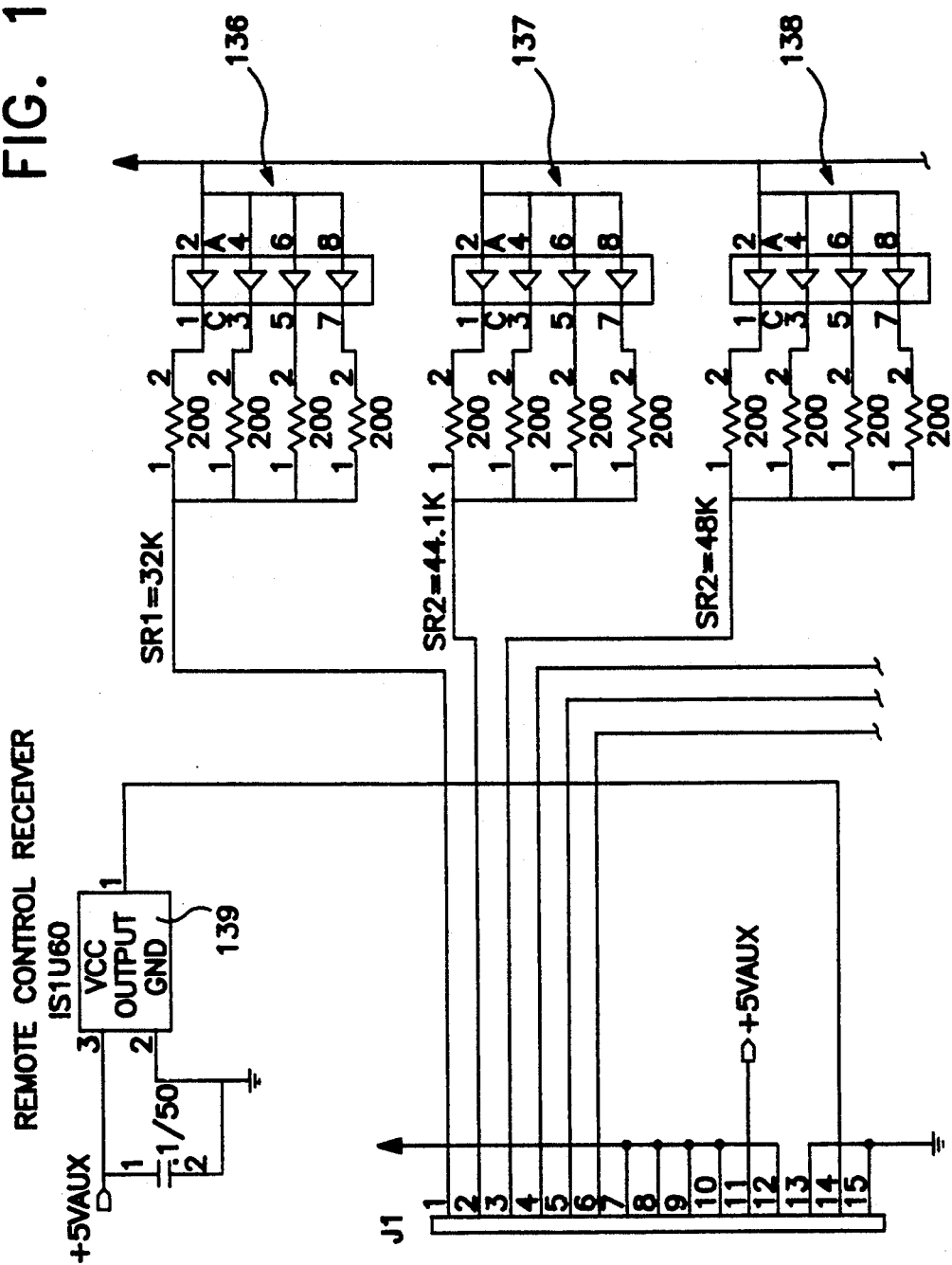

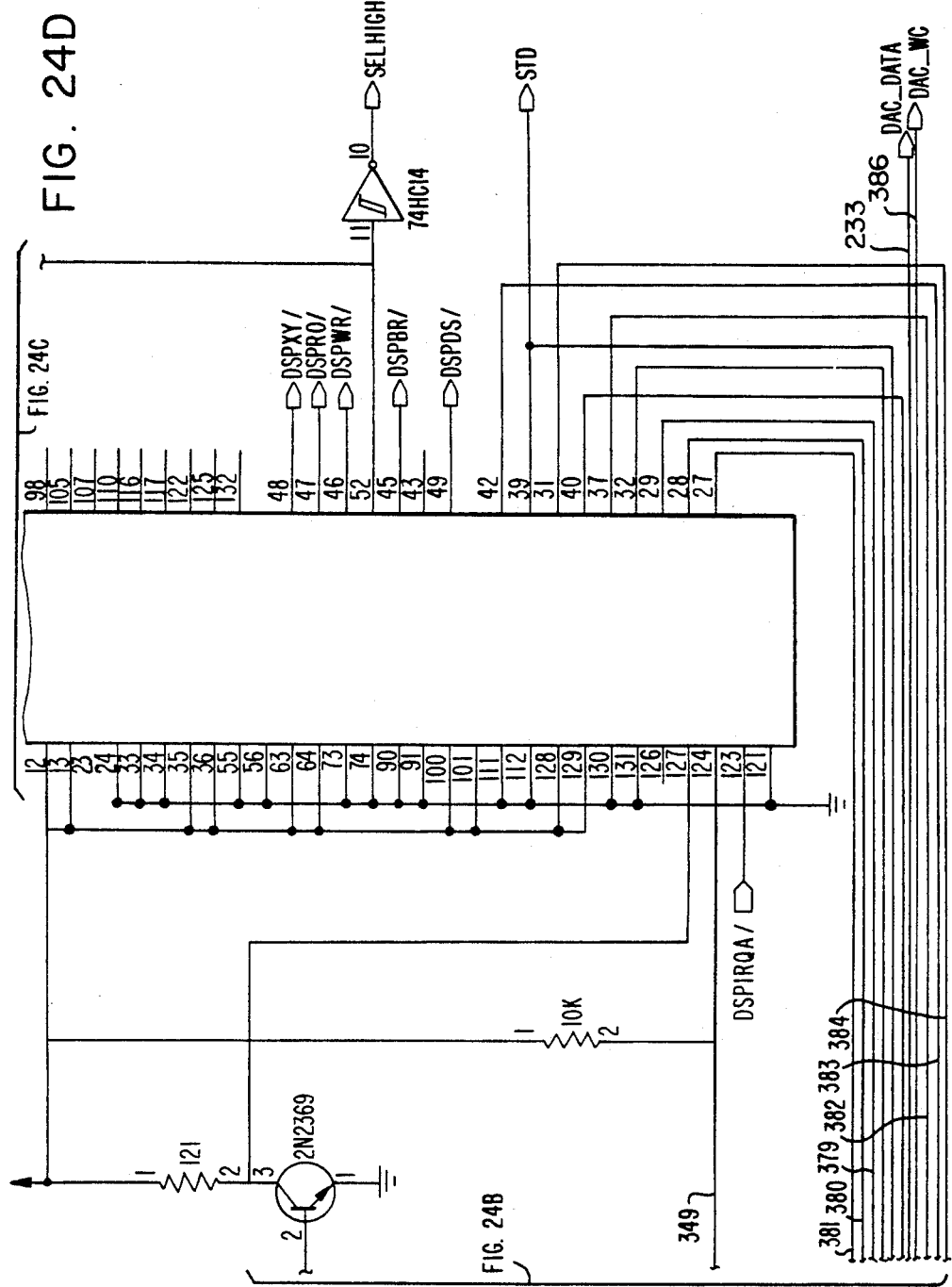

+5V AND LEFT CH. SUPPLIES MONITOR

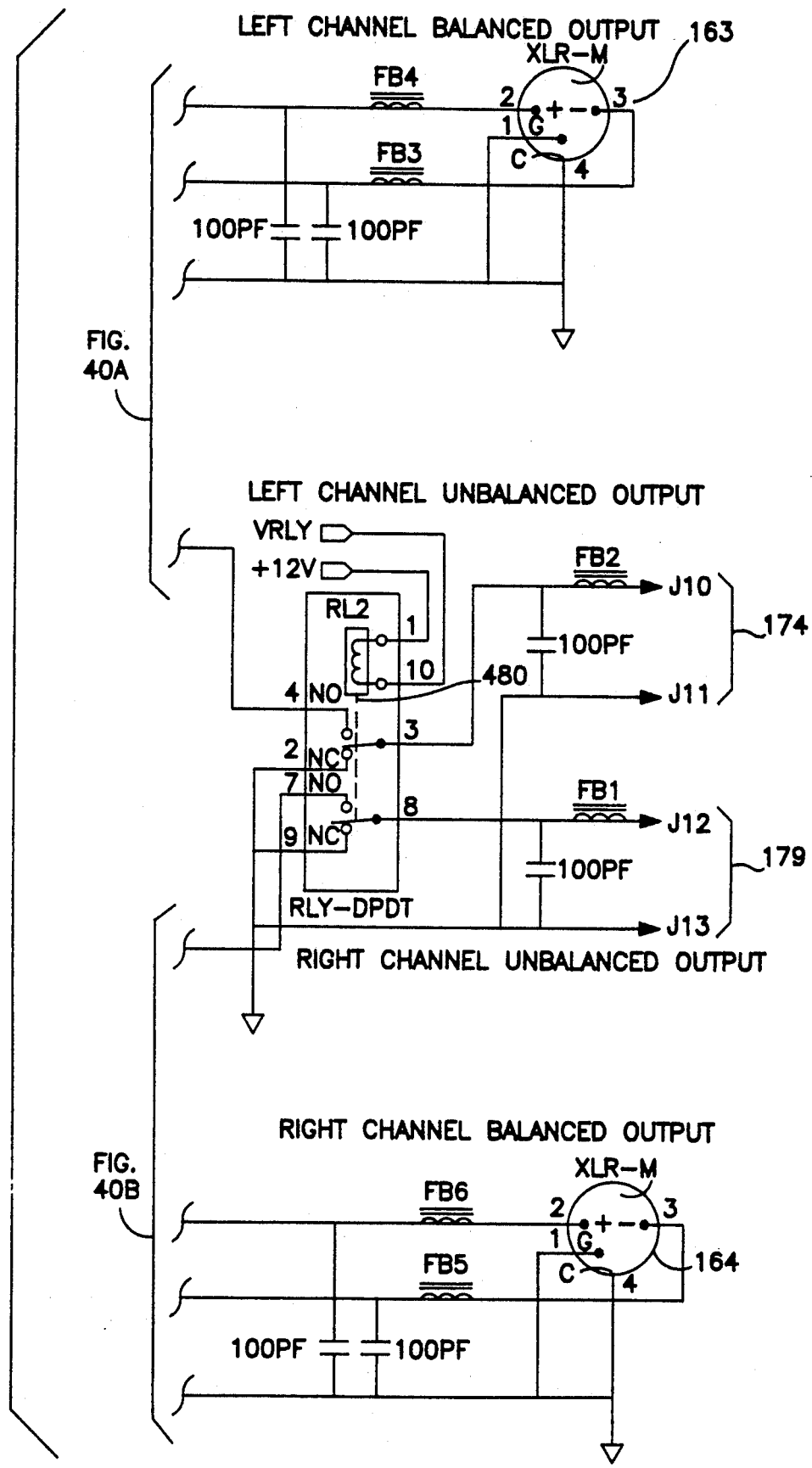

MULTIPLE CLOCK SIGNAL GENERATOR APPARATUS

This is a division of application Ser. No. 07/708,061 filed on May 30, 1991.

BACKGROUND OF THE INVENTION

The present invention relates generally to the conversion of a digital audio signal into an analog audio signal with pre-amplification, and in particular, to a microprocessor controlled, single-bit Pulse Density Modulated (PDM) digital-to-analog converter (DAC) incorporating digital and analog preamplifier stages capable of processing digital audio data formats toward the generation of low-noise analog audio signals. Currently, most digital audio playback devices incorporate single chip, multi-bit digital-to-analog converter technology and provide no internal pre-amplification of the audio signal.

Prior to the advent of digital audio technology, where "live" audio performances are recorded digitally for later playback, sound recording was performed exclusively in the analog domain generating various formats such as LP albums. Such methods utilized a recording process which resulted in the impression of a "physical copy" of the analog signal into a vinyl disk creating a "groove" which was "tracked" by a phonograph needle the physical movement of which would reproduce an electrical "copy" of the groove. This method of sound reproduction, however, suffered from a number of problems including a low signal-to-noise ratio (SNR) and audible distortion. Digital technology sought to overcome these problems by converting the analog audio signal, at its source, into a digital format. The conversion of analog audio signals which are by definition continuous in nature into digital audio signals which are discreet in nature is performed by a process known as quantization which involves taking a "snapshot" of the analog audio signal at various points in time and transforming the voltage at that time to its corresponding digital word, utilizing one of the standard digital audio formats. The process of taking snapshots is otherwise known as sampling and the frequency of sampling is referred to as the sampling rate.

Currently, there are a number of standard formats of encoded digital audio data including: AES/EBU, EIAJ CP-340, and S/PDIF. Most digital technology currently uses a 16-bit digital word format which is the result of the encoding process and which are later used to reproduce or "recover" the original analog sound. Accurate reproduction of the original analog signal requires that the digital sampling to occur at least twice the rate of the highest frequency to be digitized. If the sampling rate is in excess of twice the highest frequency, then it produces greater accuracy in the measurement of the analog signal. This approach to quantization is known as oversampling.

At present, compact audio disks are a common media for "storing" digital audio recordings where the digital audio data is encoded serially o the disk. A typical compact disc player optically reads the digital data off the encoded disc; converts that data using a single chip, multi-bit digital-to-analog converter to an analog audio signal; and presents this signal to various output plugs and pins (RCA, headphones, coaxial) for connection to analog audio components such as preamplifiers or power amplifiers. Higher-end digital audio components in addition to providing analog audio outputs also provide digital audio outputs which contain the digital audio data prior to conversion usually on optical and/or electrical output connectors.

One shortcoming of some current digital audio apparatus is the use of higher order filters to control the signal-to-noise ratio in the outputted analog signal. These higher order filters tend to cause both amplitude and phase aberrations due to the need for cascading. While some compact disc players attempt to compensate for these problems through the use of oversampling, which tends to ease requirements on post conversion filters, these solutions often fall far short of the audio performance that high end audio users desire.

Another limitation in some current compact disc/digital audio designs is the use of the traditional multi-bit digital-to-analog converter devices. The problem with multi-bit digital-to-analog converters is the difficulty balancing the multiple outputs to create a linear signal. This design defect can be overcome by precise balancing of each separate circuit; however, this solution is difficult, expensive and unworkable due to further variations in each bit processor caused by temperature changes within the unit.

A further limitation of single chip digital audio equipment is the introduction of noise through clock jitter and the failure to isolate audio circuits from noise-producing sources such as oscillators. While isolation is desirable, it is impossible to achieve when a single chip component is used since they often contain in an integrated format the various devices which one desires to separate from one another. Jitter reduction presents a greater problem that can be reduced by minimizing the path length between circuits which produce the clock signals and circuits which use the clock signals. However, minimizing the path length may place the oscillator near the audio circuits, thus reintroducing noise, creating a "catch 22" situation.

Accordingly, the present invention seeks to address the foregoing limitations of the prior art digital audio equipment by providing an improved digital-analog pre-amp and converter apparatus which comprises a microprocessor controlled single bit Pulse Density Modulated digital-to-analog converter with hybrid pre-amplification in both digital and analog domains toward improving the recovery of analog audio signals from the digital format with less distortion and lower SNR.

It is an associated object of the present invention to provide means of up-sampling the digital audio data by 128 times the incoming rate through the use of a finite impulse response filter and delta-sigma modulation resulting in noise-shaping converter.

Another object of the present invention is to provide for the utilization of an 18-bit digital audio format, in place of the common 16-bit format thereby allowing for higher dynamic range; obviating the need to truncate data; and providing lower quantization error.

As rule of thumb in digital audio technology, it is considered that each additional bit in a digital audio word contributes 6 dB to system performance, thus the addition of 2 bits from the traditional 16-bit digital audio word to the 18-bit word utilized in the present invention provides an additional 12 dB of dynamic range amounting to over a 10% increase from the prior art. The increased word size in the present invention provides for future digital audio formats which will tend to have longer word lengths. Currently, the AES/EBU format provides for the possibility of 24-bit digital words.

Handling a 24-bit word in a 16-bit digital-to-analog converter would require major truncation of the input word to a 16-bit length, thus losing the additional accuracy provided by the remaining 8 bits. As for quantization error, the addition of 2 bits to the 16-bit word provides 4 times as many quantizable voltage levels, thus allowing for more exact measurement of the analog voltage when converted into digital signals.

One solution in the prior art is to deal with the smaller digital word size which possesses a lower dynamic range was to utilize a process known as dithering. Dithering eliminates harmonic distortion caused by quantization. However, the process tends to create a higher SNR. There are 2 widely used methods for producing the dithering effect, Broadband-Triangular dither and Weighted dither.

Accordingly it is an object of the present invention to be able to process digital audio signal data produced by sources using the 16-bit format as well as to be able to accept up to 24-bit digital audio words.

Another object of the present invention is to provide for the automatic adjustment for input word lengths greater than 16-bits and to properly dither to 18-bits.

Another object of the present invention is to provide for hybrid digital/analog volume control. In the prior art, a digital output signal could be attenuated in either of 2 ways, either in the digital domain before the digital-to-analog conversion or in the analog domain after the digital-to-analog conversion. There are advantages and disadvantages to each of these approaches. Implementing attenuation in the digital domain is done by multiplying the digital word by a gain value which produces extra precision bits in the digital audio word which is then dithered and truncated to the word size of the digital-to-analog converter. This results in a constant noise floor during attenuation, thus as the audio signal becomes smaller, it begins to phase into the constant noise, thus making digital attenuation less optimal in low volume situations.

Implementing attenuation in the analog domain is done with the use of mechanical potentiometers which are often the source of mechanical problems and mechanical "wiper noise" which may be most disturbing at higher gain settings. In addition, analog attenuation often requires the use of dual volume potentiometers which require balancing; and the necessity for connections between the potentiometer and the analog board which may introduce additional noise into the audio output. Analog gain control is however potentially free of constant background noise that is inherent in the digital implementation.

Accordingly the present invention implements a hybrid attenuation scheme where by attenuation in the "lower" part of the gain range is performed digitally and attenuation in the "upper" part of the gain range is performed by analog means.

It is yet another object of the present invention to provide both Broadband-Triangular and Weighted dithering algorithms for user selection to analyze digital audio data of word length greater than 18 bits and when volume control is below the digital attenuation threshold.

These and other objects of the invention will become apparent in light of the present specification and drawings.

SUMMARY OF THE INVENTION

The present invention is designed to provide a very high quality digital-to-analog conversion for digital audio signals transmitted over any one of three different standard interfaces. The present digital-to-analog converter is designed to fit into a high-end audio system and allows owners of CD players, Laserdisc players, digital audio tape decks or direct broadcast satellite receivers to improve upon the digital-to-analog conversion accuracy otherwise performed internally by said existing units. The present invention may serve as a foundation for further digital in/digital out devices such as sound processors, equalizers, crossovers and noise reduction units.

The present invention is designed to receive as an input any one of several digital audio format interfaces, including the AES/EBU (Audio Engineering Society/European Broadcast Union) format aimed at professional audio applications, the EIAJ (Electronic Industries Association of Japan) CP-340 format and the S/PDIF (Sony/Philips Digital Interface) format, the later two being geared toward consumer applications. In addition, any one of these three formats may be received by the present invention as inputs through any one of three types of hardware interfaces, namely, balanced transmission via twisted shielded wire terminated with three pin "XLR" connectors; single ended transmission via coaxial cable terminated with an "RCA" connector; and optical transmission via optical cable terminated with a "TOSLINK" connector. The "AES/EBU" format is specified only for the balanced interface and the S/PDIF format is specified only for a coaxial interface, while the CP-340 is specified for all three.

The present invention supports three industry standard analog audio output formats. A stereo headphone output connector comprising a three conductor "phone" jack is provided for connection to stereo headphones. "RCA" output connectors ar provided for connection of a "line-level" pre-amplifier or other similar analog signal processing device, while a power amplifier may be connected either through balanced left and right channel "XLR" output connectors or "RCA" connectors.

One goal of the present apparatus is to minimize distortion in the processing of the audio signal. Through the use of low-order, and therefore more linear phase, filtering and the positioning of corner frequencies of the analog filters far away from the audio band the present apparatus attempts to minimize distortion, including distortion caused by amplitude aberrations versus frequency ("non-flat" frequency response) and phase aberrations versus frequency ("non-linear" phase response). The use of high-speed analog circuitry with high open loop gain in the present invention minimizes intermodulation and slew-induced distortion.

In addition the use of one-bit pulse density modulated digital-to-analog converter technology serves to minimize distortion. While traditional multi-bit digital-to-analog converter technology depends on extremely close matching of each bit-weight with all of the others in order to achieve good linearity, the one bit digital-to-analog converter implemented in the present apparatus has no matching requirements at all and is inherently linear. Moreover where digital-to-analog converter distortion is most audible, on quiet passages, the multi-bit digital-to-analog converter performs the poorest and the one-bit digital-to-analog converter as implemented excels.

Additionally, the present invention seeks to minimize noise in the audio signal. Noise is caused by many of the same things which cause distortion. Noise is minimized in the present invention through the implementation of low-jitter clocking of the digital-to-analog converters, and low-noise voltage references for the digital-to-analog converters. Additionally, the design of the present invention isolates noise sources from the audio circuitry. Separate power transformers and supply voltages for the digital section and analog section assist in isolating noise from the audio output signals.

The digital audio interface receiver present in the digital stage of the invention incorporates a on-chip PLL which is used to extract the bi-phase encoded data and the word clock from the selected digital audio signal input and generates its various output clocks, one of which is the sample rate (word) clock. The analog stage of the present invention incorporates a high performance PLL which locks on to the extracted word clock. This PLL is the "main" PLL which provides a very low-jitter clock for all sensitive circuits. It is known that jitter, small variations in the clock period, in sampling clocks used in digital-to-analog conversion process reduces the potential signal-to-noise ratio in the presence of signal, commonly referred to as dynamic range. Accordingly, special care has been taken to minimize jitter. The sources of jitter are many as every component in the signal path is a potential source. Since no particular jitter-producing component dominates, jitter can be assumed to be a broadband "white" noise which frequency modulates the clock in question.

The present invention addresses all three of the basic methods for reducing clock jitter. The first is to reduce the bandwidth of the error signal from the output of the phase comparator in the PLL. Thus if the jitter is assumed to be broad-band in nature, reduced bandwidth will have the result of reducing the total jitter energy fed to the oscillator portion of the PLL. In the present invention, the bandwidth of the loop filter in the PLL is extremely low, 2.5 Hz, and this is followed by an additional 2-pole low-pass filter with a cutoff ($-3$ dB) frequency of 16 Hz. Thus, the spectrum of any jitter present at the output of the PLL is limited to the sub-audio (less than 20 Hz) band. Since the jitter at the input was previously assumed to be produced by broadband noise frequency modulation of the clock, only those components of the jitter below the loop cutoff frequency will be passed on to the oscillator and, therefore a majority of this jitter energy will be filtered out.

The second method of minimizing clock jitter is to use an oscillator as "pure" and jitter free as possible, as the loop filter will not have any effect on reducing noise sources which cause jitter within the oscillator itself. Accordingly, a specialized form of voltage controlled crystal oscillator is used. The primary determining factor of oscillator purity is the "Q" of, or quality factor of the reactive components which determine the oscillating resonant frequency. The higher the Q of these components, the less they deviate from their resonant frequency. While low jitter and therefore high Q are needed for high dynamic range, the apparatus must be usable with a variety of digital input sources having different word rates requiring a wide range of frequency. This problem is addressed by implementing three separate voltage controlled crystal oscillator circuits, one for each of the three standardized sample word rates. Each voltage controlled crystal oscillator is based on a quartz crystal oscillating element which has a very high Q. The crystals ar operated in parallel resonant mode whereby their resonant frequency can be adjusted over a very limited range ($+/-300$ to 400 ppm) by means of adjusting the load capacitance presented to them. This load capacitance adjustment is performed by a varactor diode. The limited control range is sufficient to allow phase lock to any source device which conforms to the applicable standards based on the three center frequencies the apparatus supports and yet is sufficiently limited to preclude undesirable deviation.

The third method of minimizing clock jitter is to physically locate the PLL close to the actual conversion circuits thereby minimizing the number of potential jitter producing stages between the PLL output clock and the digital-to-analog converters.

The main PLL is a frequency multiplying type taking the sample rate clock (word clock) at 32, 44.1 or 48 KHz and generating a phase synchronized clock at 256 times this incoming frequency. The source for the main PLL is the word clock extracted by the digital audio interface receiver. This signal feeds the reference input of the phase comparator. These outputs then enter a differential loop filter built around a precision low-bias current opamp. Low-bias current is important in reducing the sidebands generated in a frequency multiplying type PLL. The chosen loop filter has a very low bandwidth and an over damped response to stay within the limited control range of the voltage controlled crystal oscillators. The low bandwidth of the filter and overdamped response results in a lock time that is long, on the order of one second.

The loop filter is followed by a 2nd order lowpass filter having a overdamped response that does not add any overshoot during acquisition. The filter output then drives varactor diodes of the three voltage controlled crystal oscillators. The voltage controlled crystal oscillators outputs feed a digital multiplexer which selects the proper output and sends this to the divider circuitry. The divide by 256 circuit is composed of two 4-bit synchronous counters, the desired outputs of which are re-clocked to maintain edge alignment between all of the outputs. The sample rate output is returned to the variable input of the phase comparator thereby closing the loop. Digital audio data supplied by the external audio sources is first passed through a digital audio interface receiver which identifies the sampling rate and word length associated with the incoming digital audio data.

Digital audio signal processing is handled by a 24-bit fixed point digital signal processor (DSP), and by a 18-bit (input word size) delta-sigma processor. The DSP is a general purpose device for which software routines carry out the desired functions. The delta-sigma processor is a dedicated processor and is not software dependent.

The DSP performs dithering for input signals of greater word length than the up-sampling DSM chip is capable of handling, digital attenuation, balance, and muting functions.

The delta-sigma processor performs the function of up-sampling the stereo audio data by 128 times the incoming rate by way of a technique called "delta-sigma conversion". This type of conversion is often referred to as a "noise-shaping" converter. The input is fed to the device in serial form with up to 18-bits of precision.

The stereo data feeds an 8 times oversampling interpolation filter which generates 7 intermediate sample values between each of the incoming samples by using a large impulse response filter, resulting in digital audio data at eight times the original sampling rate. This data is then fed to the delta-sigma modulator which operates at 16 times the input data rate for a total oversampling ratio of 128. The delta-sigma modulator uses a 5th order noise shaper which allows the reduction of the word size down to a single bit per channel at 128 times the original word rate by shaping the resultant quantization noise spectrum such that the audio band has a minimum amount of in-band noise, at the expense of a large amount of out-of-band noise.

The resulting DSM data is a digital audio data signal which is clocked at 128 times the incoming sampling rate determined by the digital audio interface receiver. The data, along with the associated clock generated by the DSM are optocoupled onto the analog board.

Optocoupling is used to isolate the analog function on the analog board from the digital IC chips located on the digital board which generate a large amount of digital noise. Optocouplers effectively transmit the necessary signals between the digital and analog circuits without requiring the relatively noisy digital board supplies to be directly connected to the analog circuitry.

Once the serial digital audio data reaches the analog board it is reclocked by the main PLL on the analog board. For example as the delta-sigma modulator has upsampled the digital audio word by 128, a clock at 128 times the sampling rate determined by the digit-audio interface receiver is used to clock a serial-to-parallel shift register which takes the incoming serial digital audio word and shifts it one bit at a time. The output of the shift register is fed into AND gates with both regular and inverted inputs. The other input of each AND gate is either the clock signal or its complement. The result of the AND'ing function is that the digital audio data is present for only half of a bit cell period. This is called a "return-to-zero" function. The AND gate outputs are then reclocked in a D type flip-flop with complementary outputs, producing both negative and positive values of the digital word, and then connected to the one bit digital-to-analog converter.

The digital-to-analog converter for each channel is essentially 4 sets of single pole-double throw switches the results of which are then fed into a positive summer and a negative summer. The output of the summers are fed into a differential amplifier which changes the sign of the negative thus subtracting the negative value from the positive value. This has the effect of filtering noise which may have occurred in the digital-to-analog converter and provides the correct analog audio output. The input to the digital-to-analog converter is a voltage reference determined by the gain register.

Implementation of analog gain control is done through the use of 12-bit multiplying digital-to-analog converters, one for each channel. The multiplying digital-to-analog converter simply multiplies the voltage at the reference input by the digital value loaded into it. The reference input to the digital-signal-analog converter is supplied by a very low noise 10 volt reference circuit. The use of the 12 bit multiplying digital-to-analog converter results in a 0.02 dB minimum step size over a 20 dB range or a 0.06 db step over a 30 dB range. Log conversions for the data are performed by the microcontroller and are fed to the control register and to the gain register. The multiplying digital-to-analog converter is a current output device such that precision opamps are used to convert the output to a voltage and thus supplies the reference voltage used by the one bit PDM digital-to-analog converter.

The output of the digital-to-analog converter, an analog audio signal, is passed to a low-pass filter which removes any out-of-band noise created in the signal processing, and especially in the dithering and upsampling by the delta-sigma modulator. The analog audio signal is deemphasized if the digital audio interface receiver has found that the incoming digital audio signal was preemphasized, having signaled the microprocessor accordingly. The output of the low pass filter is passed to an analog output board which contains the power buffers the output of which is a standard analog audio output signal which may be used by any number of standard audio components.

BRIEF DESCRIPTION OF THE DRAWINGS

FIG. 9C of the drawings is a portion of a detailed block diagram illustrating the processing of the audio signal in the digital board of the invention;

FIG. 11A of the drawings is a portion of a schematic circuit diagram for the drivers for the power indicator located on the front panel of the invention;

FIG. 13A of the drawings is a portion of a schematic circuit diagram of the display board for providing bar indicators on the front panel of the invention;

FIG. 24D of the drawings is a portion of a schematic circuit diagram illustrating the digital signal processing integrated circuit and associated memory and framing GAL on the digital board;

FIG. 40C of the drawings is a portion of a schematic circuit diagram of the output amplifier board of the present invention.

DETAILED DESCRIPTION OF THE DRAWINGS

Figure 1:
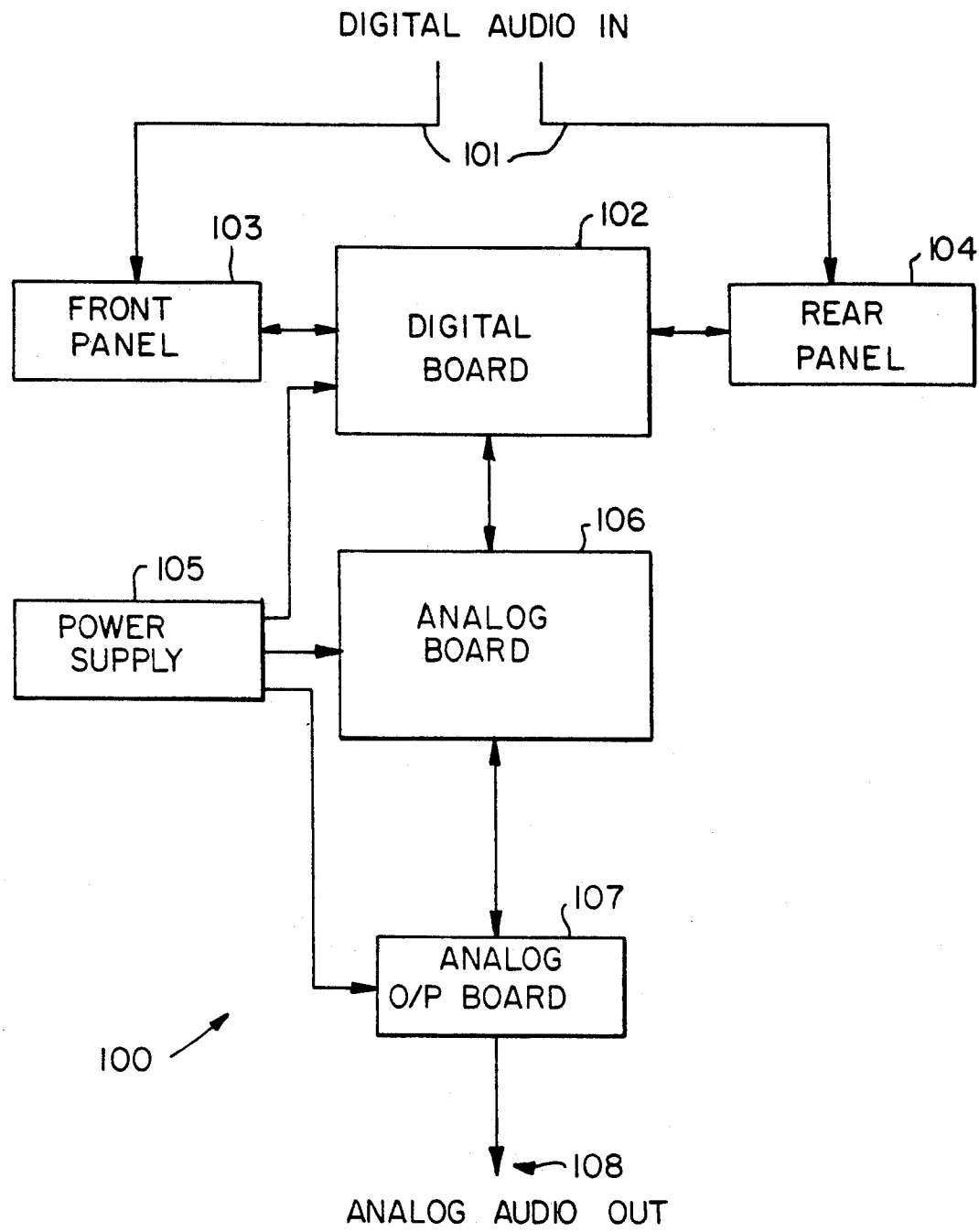
FIG. 1 of the drawings is a simplified block diagram of the functional stages of the present improved digital-to-analog converter—preamplifier apparatus.

While this invention is susceptible of embodiment in many different forms, one specific embodiment is shown in the drawings and will herein be described in detail with the understanding that the present disclosure is to be considered as an exemplification of the principals of the present invention and is not intended to limit the invention to the embodiment illustrated.

FIG. 1 of the drawings is a simplified block diagram of the functional stages of the present improved digital-to-analog converter—preamplifier apparatus 100. Apparatus 100 accepts as an input digital audio signal data in any one of the following digital audio formats: the AES/EBU (Audio Engineering Society/European Broadcast Union); the EIAJ (Electronic Industries Association of Japan) CP-340; and the S/PDIF (Sony/Philips Digital Interface) format. As illustrated, the present invention is implemented in six major "stages" or electronic circuit boards, including digital board 102, analog board 106, power supply 105, rear panel 104, front panel 103 and analog output board 107. Power supply 105 as illustrated generates two regulated voltages of +5 V for use on digital board 102 and unregulated voltages for use on analog boards 106.

Front panel 103 incorporates input selection switches, status LED's and an alpha-numeric display, which permit the user to select which digital audio signal provided by the several connected digital input sources shall be processed by the present invention and displays status information to the user. Rear panel 104 contains the primary input connectors through which the digital audio signals enter apparatus 100. Front panel 103 additionally contains several "auxiliary" input connectors through which sources of digital audio signals may be connected, as may be desired on a temporary basis, all without having to move the apparatus to expose the rear panel and possibly disturb any existing electrical connections.

Digital audio signals 101 are digitally processed by digital board 102 and are converted into analog audio signals 108 by analog board 106. Digital board 102 serves to provide overall control of apparatus 100 via an on-board microprocessor which monitors the status of user accessible switches and indicates the apparatus status through front panel LED's and a vacuum fluorescent display. Digital board 102 further processes the supplied digital audio data by use of a digital signal processor performing gain control and dithering as well as generating gain and control information for use by analog board 106. The output signal of digital board 102 are left and right channel digital audio signals presented in serial form at 128 times the original sampling rate of digital audio input signal 101. The digital audio signals are passed to analog board 106 via a series of optocouplers which protect analog board 106 from any noise generated by the many components located on digital board 102. Analog board 106 performs a number of analog gain operations as well as the digital-to-analog conversion of the digital audio data, thus generating analog audio outputs which are sent to analog output board 107 for audio buffering and amplification resulting in analog audio output 108. Also contained in analog output board 107 are a series of muting circuits which serve to protect apparatus 100 and the external audio equipment connected thereto in the event of a malfunction of apparatus 100. Analog audio output signal 108 is a stereo audio signal suitable for connection to conventional audio components for further pre-amplification, power amplification and/or further processing, all toward playback of the audio signal.

Figure 2:
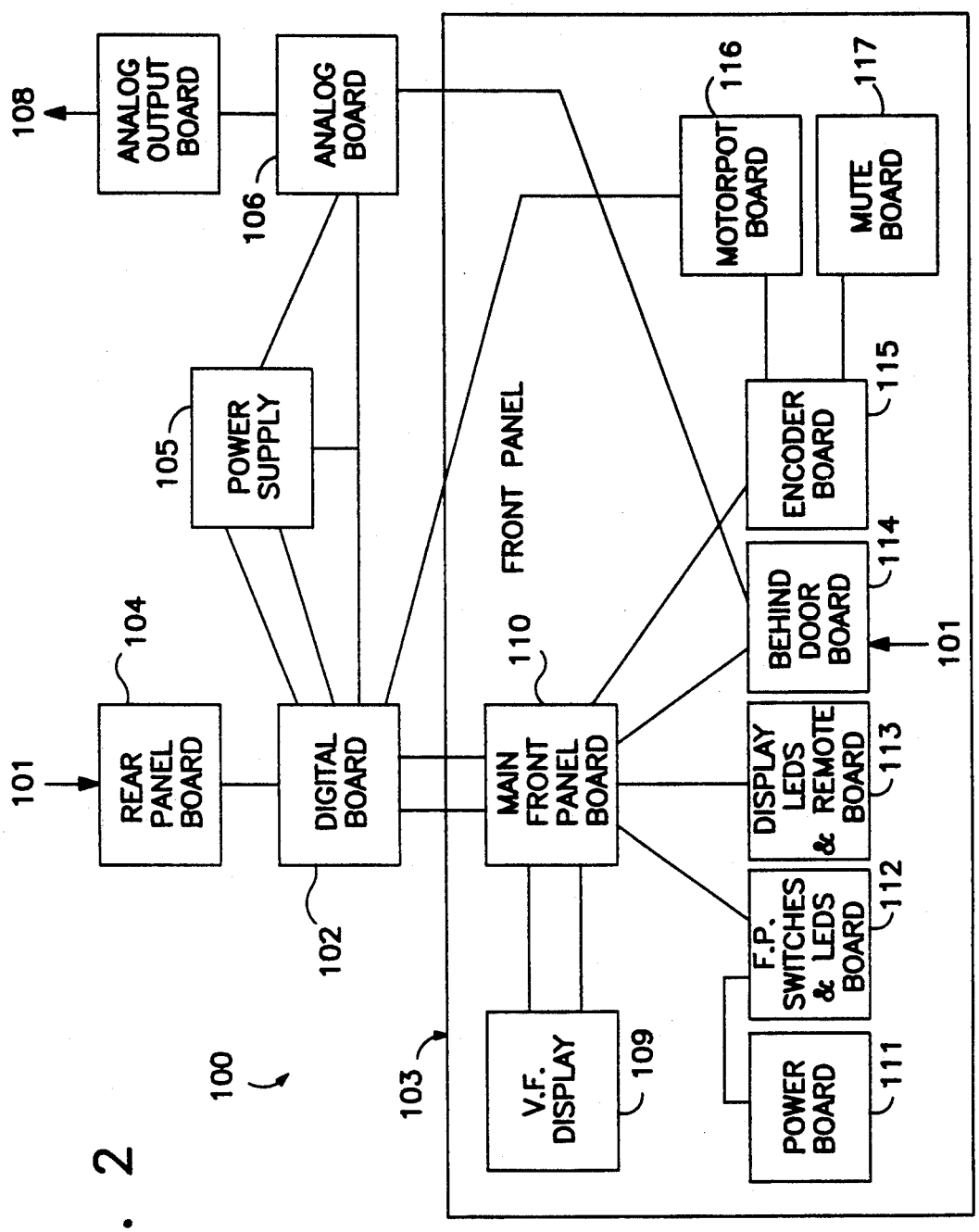
FIG. 2 of the drawings is a block diagram illustrating the interconnection of the various circuit boards which together comprise the present invention.

FIG. 2 of the drawings is a block diagram illustrating the interconnection of various major circuit boards and their sub-boards which together comprise apparatus 100. Front panel 103 is shown comprising multiple circuit boards which in cooperation with digital board 102 serve as the user interface of apparatus 100 through which the user controls the operation of apparatus 100 and monitors its status. Main front panel board 110 is the interface between digital board 102 and the other circuit boards which together form front panel 103. Main front panel board 110 also contains LED latches and drivers as well as motor drivers along with interface connectors for the other front panel boards 109, 111-117.

Front panel power board 111 contains the main power switch and associated LED which the user depresses to activate apparatus 100. The main power switch is a soft switch and includes a bi-color LED status indicator which indicates the three power conditions of apparatus 100, active, standby and diagnostics. Front panel power board 111 is connected to front panel switch and LED board 112 which contains switches and accompanying LED's which are operated by the user in order to select which of the digital audio signal connectors will be enabled toward inputting digital audio signals to apparatus 100. Both the input select switches and power switch are then conveyed from front panel switch and LED board 112 to main front panel board 110 and then on to the microprocessor which is contained within digital board 102.

Front panel status LED and remote receiver board 113 contains various indicator bars for the six status conditions, three sampling rate indicators for 32 KHz, 44.1 KHz and 48 KHz, and one indicator each for "emphasis", "invert" and "validity error". Front panel status LED and remote receiver board 113 also accepts signals from a handheld remote control device used by the operator for adjusting the volume and for operating the various other controls of apparatus 100. Front panel status LED and remote board 113 is likewise electrically connected to main front panel board 110.

Behind door board 114 is a circuit board which contains various auxiliary inputs and control switches concealed behind a door on the front panel of apparatus 100. Behind door board 114 includes two auxiliary inputs through which digital audio signal sources may be connected to apparatus 100. A headphone jack is additionally provided through which the analog audio output signal may be connected to a set of headphones. Behind door board 114 is electrically connected to the microprocessor on digital board 102 through main front panel board 110. Front panel encoder board 115 contains the 32 PPR optical encoder which is driven by the balance knob on the front panel of apparatus 100. Front panel encoder board 115 is electrically connected to main front panel board 110.

Motorized potentiometer board 116 contains the motor driven volume potentiometer positioned on the face of the front panel of apparatus 100. The motorized potentiometer operates on +5 V and is driven by the motor drivers resident on main front panel board 110. Front panel mute board 117 contains the mute switch which when actuated mutes the output volume of apparatus 100 with the status of said mute switch being displayed by an accompanying LED.

Vacuum fluorescent display board 109 is electrically connected to main front panel board 110 and contains an alpha-numeric vacuum fluorescent display through which status message and warnings are communicated by apparatus 100 to the user.

The digital audio signal data 101 connected to rear panel board 104 and front panel 103 by way of behind door board 114 passes to digital board 102 where it is processed in the digital domain, including hybrid digital gain control, the output of which is the digital audio signal in single bit serial form which is in turn connected to analog board 106. Analog board 106 is responsible for the digital-to-analog conversion and the hybrid analog gain control of the analog output signal. Analog board 106 sends output to analog output board 107 is which buffers the signal prior to attachment to analog audio components. Analog output board 107 also contains the muting function controlled by the microprocessor on digital board 102 as dictated by power supply monitor circuit on digital board 102 or power supply monitor circuit on analog board 106.

Power supply 105 is responsible for accepting power from a wall outlet and transforming same for both digital and analog boards utilizing transformers and regulators to maintain the required voltage requirements of +/−12 V, +/−18 V, +5 V and +10 V.

Figure 3A:
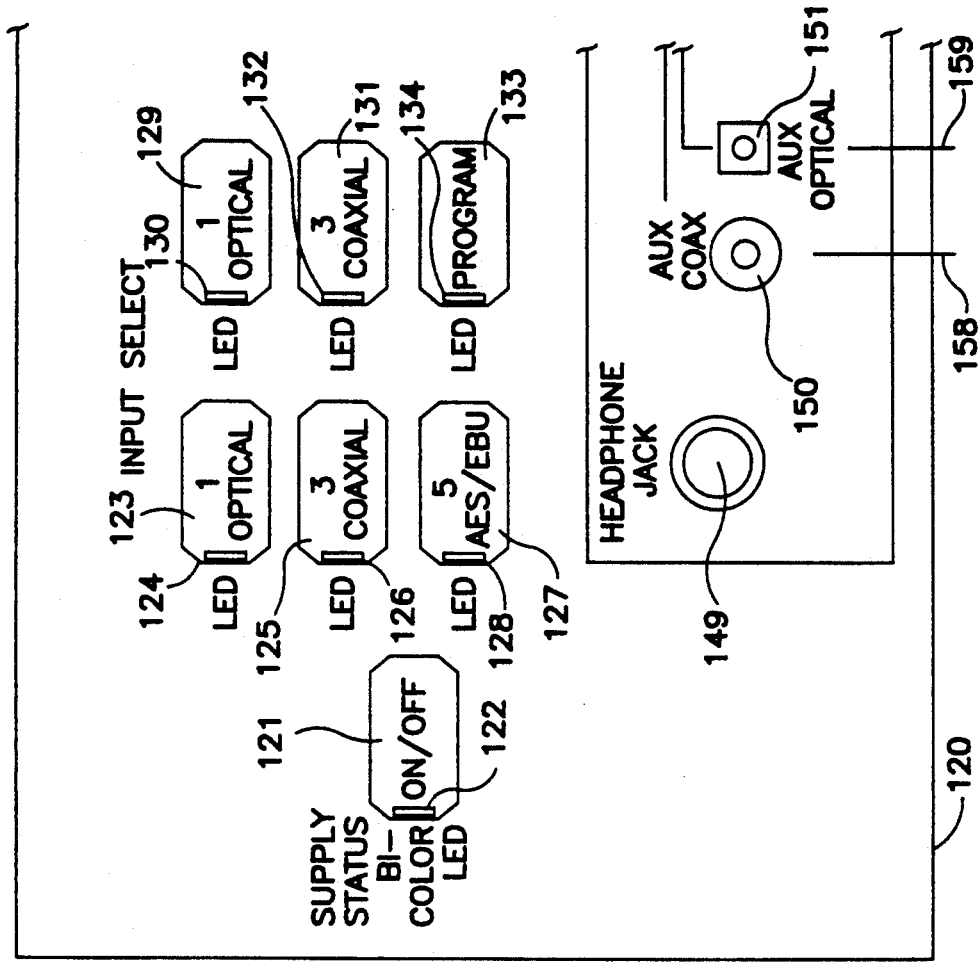
FIG. 3A of the drawings is a portion of a front elevational view of the front panel of the present invention illustrating the various controls and LED indicators.
Figure 3B:
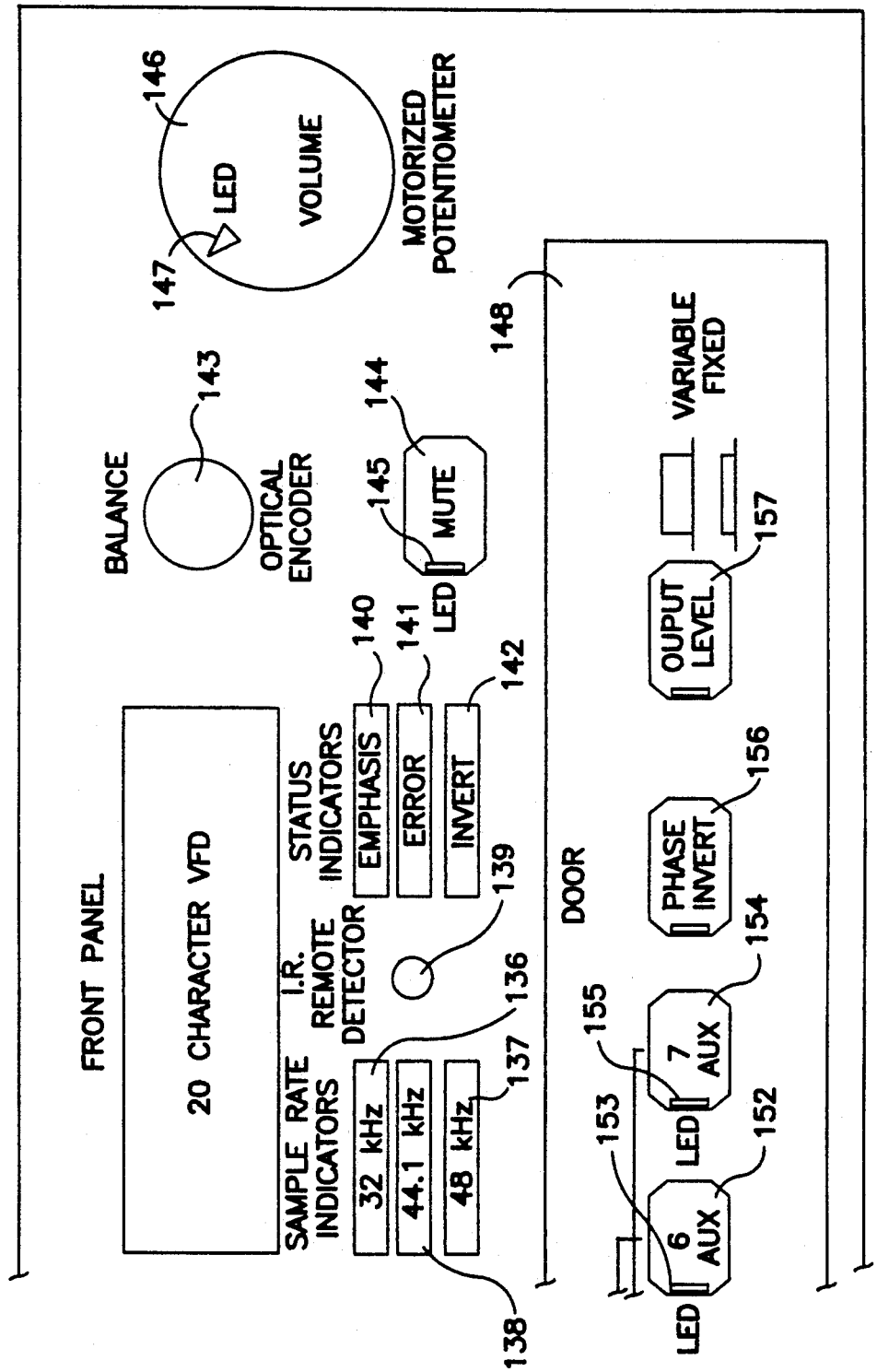
FIG. 3B of the drawings is a portion of a front elevational view of the front panel of the present invention illustrating the various controls and LED indicators.

FIGS. 3A and 3B of the drawings together comprise a front elevational view of the front panel 120 of the present invention. Power switch 121 is provided for the user to select between a "on" mode or a "stand-by" mode. Bi-color LED 122 is shown embedded into power switch 121 and serves to indicate to the user which one of the three possible power states apparatus 100 is operating in (normal, standby or diagnostics mode). Input selection switches 123, 125, 127, 129, 131 and 133 are soft switches whose status is monitored by the microprocessor resident on digital board 102. The input selection switches correspond to the various digital signal input connectors associated with the apparatus and permit the user to select which external source of digital audio signals is to be "connected" for on-line processing. Input selection switches 123, 125, 127, 129, 131 and 133 are each shown incorporating embedded LED's 124, 126, 128, 130, 132 and 134 respectively, the illumination of which indicates that the particular input selection switch is active.

The user may determine the current status of apparatus 100 by observing vacuum fluorescent display (VFD) 135 and the various LED's and bar LED status indicators provided. In the disclosed embodiment of the invention, VFD 135 is a 20-character one line display used to communicate product revision, error messages and other various user interface information to the user. Sample rate indicators 136, 137 and 138 are each four LED-bar-indicators (providing uniform light intensity) which indicate to the user the sampling rate of the incoming audio data signal. Infrared remote detector 139 detects user-inputted commands generated by a handheld remote control device which may be used by the user in place of the controls located on front panel 120 to operate apparatus 100 (except for output level button 157 which must be manually depressed). Use of a remote control is reflected in the operation and design of the associated LED's and motorized volume control knob 146. Emphasis indicator 140 is a LED indicator the illumination of which indicates to the user that the incoming digital audio data signal selected was preemphasized by an external audio component. Error indicator 141 is a LED indicator the illumination of which indicates to the user that the incoming audio digital data signal may be corrupted or invalid. Invert indicator 142 is a LED indicator the illumination of which indicates that phase invert switch 156 is in an 'on' position.

Balance knob 143 is a rotatable knob which drives an internal optical encoder generating 32 pulses per revolution (PPR). This signal is transmitted via front panel encoder board 115 to main front panel board 110 for connection to the microprocessor on digital board 102 which reacts accordingly to alter the left/right channel balance of the outputted analog audio signal.

Volume control knob 146 is a motorized potentiometer which controls the loudness of the analog output audio signal. The analog output audio signal does not pass through the potentiometer itself, as is done by other conventional devices. Rather, volume control knob 146 drives a digital/analog hybrid volume control circuit which, in turn, controls the loudness of the analog output audio signal. Volume LED 147 is a LED indicator the illumination of which indicates to user that output level switch 157 is in a variable position, as opposed to the fixed position, such that volume control knob 146 is enabled.

Controls and connectors 149–157 are shown located behind a movable door which when closed conceals said lesser used controls and connectors, said controls and connectors being deemed auxiliary and needing only infrequent access. Headphone jack 149 is a buffered and amplified headphone jack and serves to provide a connection point for a headphone set. Auxiliary coaxial input 150 is one of the possible input locations for digital audio data. Auxiliary optical input 151 is a "TOSLINK" input for optical digital audio data as generated by an of the above mentioned digital audio components. "Auxiliary 6" button 153 and "auxiliary 7" button 154 are additional input selector controls to select between auxiliary coaxial input 150 and auxiliary optical input 151, respectively. Phase invert selector 156 is a user selected option which inverts the phase of the outgoing analog audio data. Output level selector 157 controls whether the present invention 100 operates in variable or fixed gain mode. Digital audio input signals 158 and 159 connect input connectors 150 and 151 to digital signal input multiplexer 209, shown in FIG. 5B.

Figure 4:
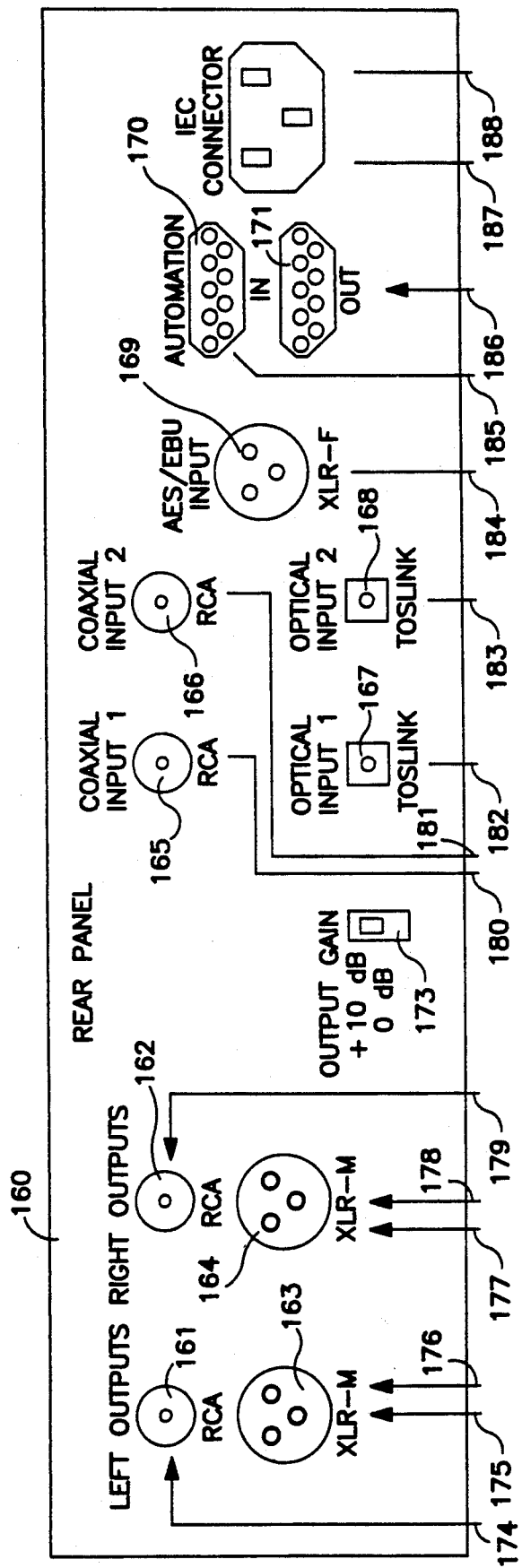
FIG. 4 of the drawings is a front elevational view of the back panel of the present invention illustrating the various input and output connectors.

FIG. 4 of the drawings is a front elevational view of the back panel 160 of the present invention 100. Outputs 161 and 162 are the left and right outputs, respectively, containing the processed analog audio data. Outputs 163 and 164 comprise the left and right outputs, respectively, in XLR-M connector format. Output gain selector 173 controls the fixed gain mode of the output of apparatus 100, by permitting the user to select between a 0 and +10 dB attenuation of the output signal. Coaxial input-1 165 and coaxial input-2 166 accept digital audio data from digital audio components on coaxial cables and feed the data to lines 180 and 181, respectively, which are connected to the digital interface (shown on FIG. 5B). Optical input-1 167 and optical input-2 168 are "TOSLINK" connectors which accept digital audio data in optical form from digital audio equipment and feed into the digital interface on lines 182 and 183, respectively. AES/EBU input 169 is an XLR-F connector which receives digital audio data from digital audio equipment and places it on line 184 which is then fed into digital interface 207 (as shown on FIG. 5B). Digital automation input 170 accepts data input from an RS-232 connector which is then decoded by an RS-232 decoder (as shown in FIG. 22). Digital automation port output 171 accepts an RS-485 connector which transmits data as output from present invention 100 for analysis in debugging and audio translation. IEC connector 172 provides power to apparatus 100 from a common wall receptacle. Said power is fed into both the digital power transformer 229 and analog power transformer 300 by lines 187 and 188 (as shown in FIGS. 5B and 6B, respectively).

Figure 5A:
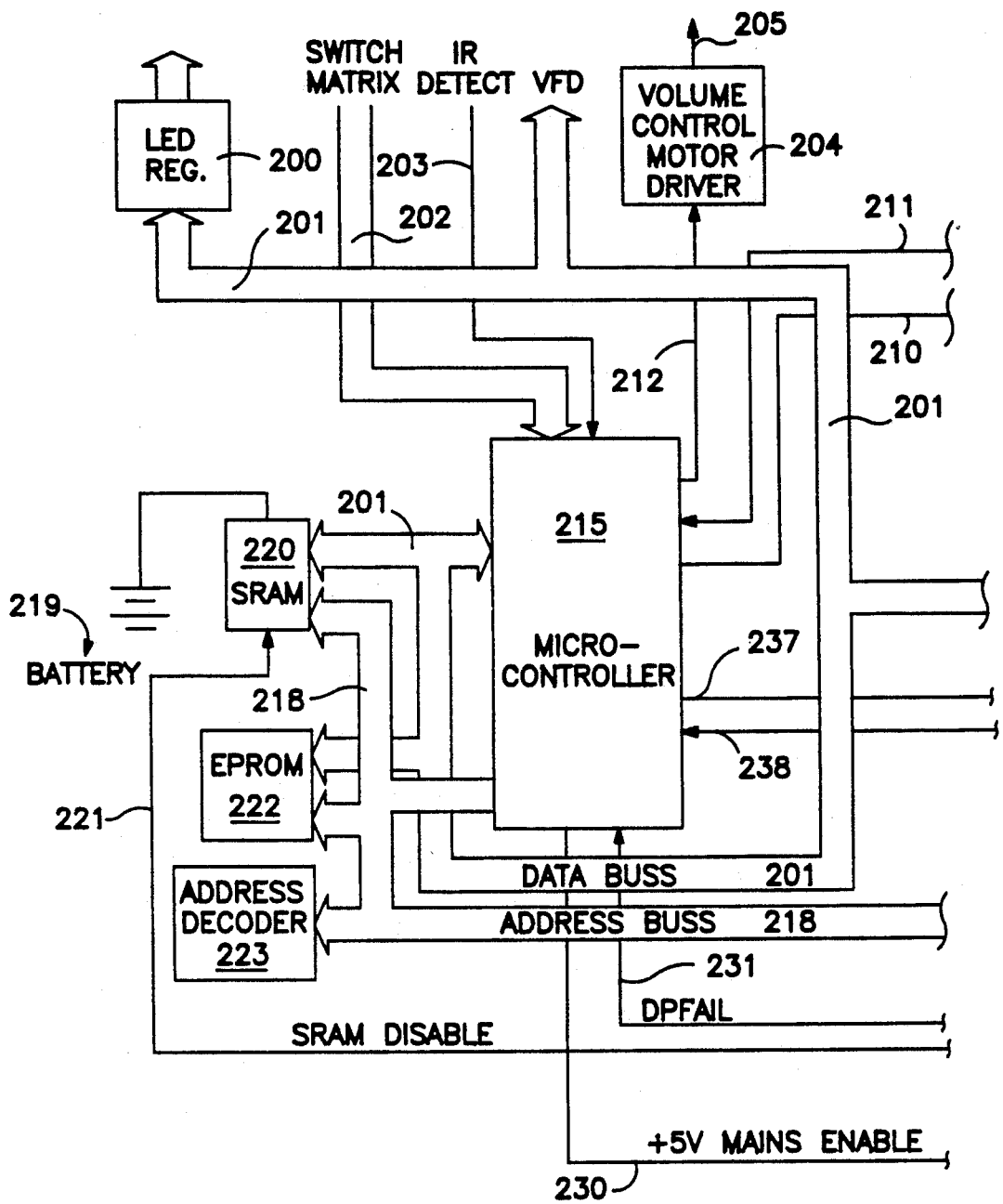
FIG. 5A of the drawings is a portion of a schematic block diagram of the digital board of the present invention.
Figure 5B:
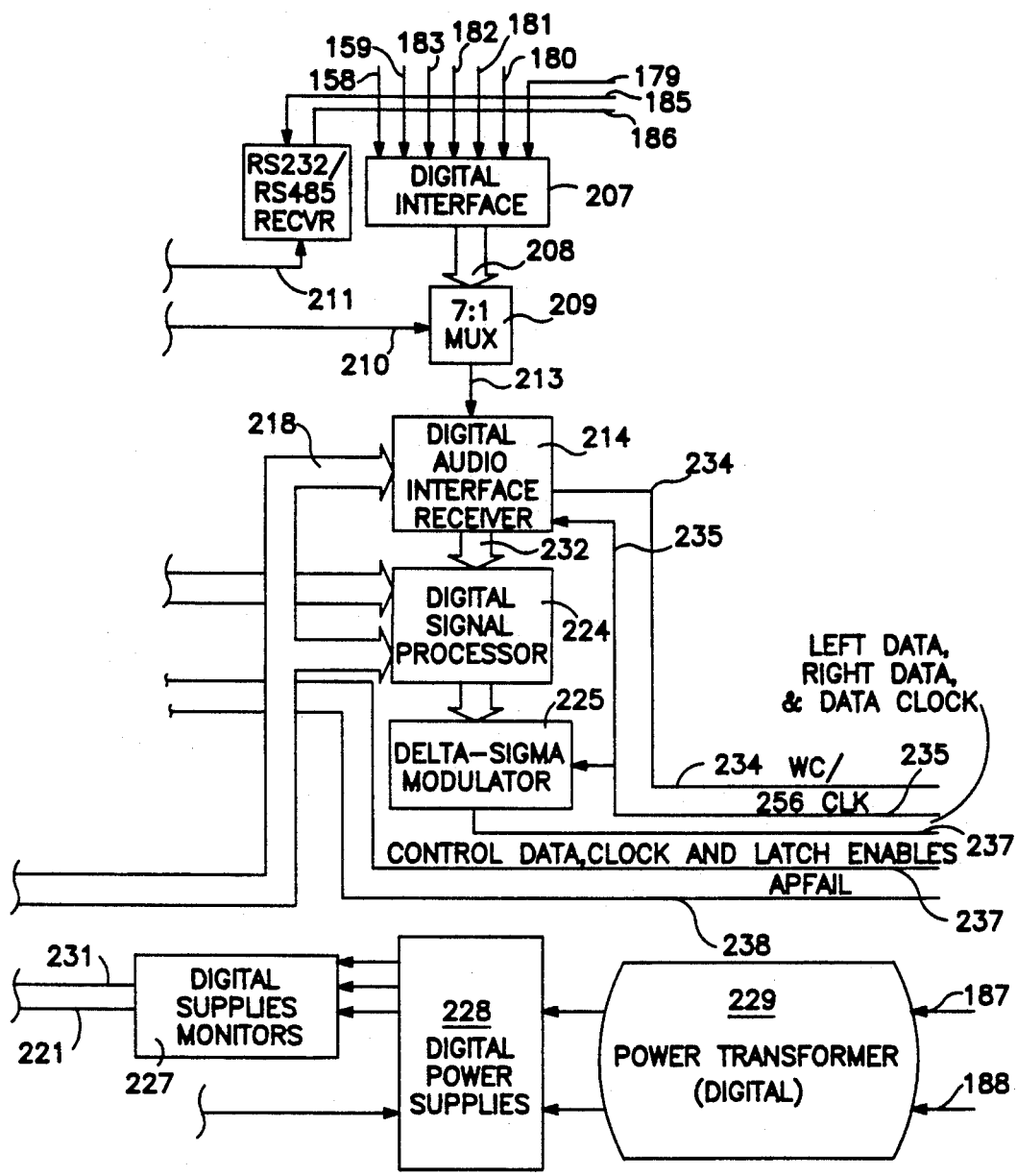
FIG. 5B of the drawings is a portion of a schematic block diagram of the digital board of the present invention.

FIGS. 5A and 5B of the drawings together comprise a schematic block diagram of the digital board 102 of the present invention 100. LED register 200 is shown and comprises a series of latches which contain a copy of the current LED status word as transmitted through data bus 201 from microcontroller 215. The output of LED register 200 is used to determine whether LED's 124, 126, 128, 130, 132, 134, 145, 147, 153 and 155 which are located on front panel 120 are illuminated or not. Switch matrix bus 202 connects microcontroller 215 to the input select switches 123, 125, 127, 129, 131, 133, 144, 152, 154, 156 and 157 such that microcontroller 215 may monitor their respective positions toward responding to user commands. Infra red detector line 203 connects microcontroller 215 to the IR remote control detector 139 positioned on front panel 120. Volume control motor driver 204 controls volume knob 146 through control signal line 205 in response to the signals generated by microcontroller 215 communicated through bus 212. RS-232/RS-485 receiver 206 receives data from RS-232 input 170 as conveyed by line 184 and decodes said data for input into microcontroller 215. Receiver 206 also sends output data through line 185 to output port 171 which is for use with RS-485 connectors.

Digital interface 207 is the port through which all of the incoming digital audio data signals from both front panel 120 and rear panel 160 are received. The outputs of the digital interface 208 are fed into 7-to-1 multiplexer 209 which is used to select which digital audio data signal 158, 159, 180-183 is to be processed by apparatus 100. Multiplexer 209 is controlled by microcontroller 215 which responds to the position of input select switches 123, 125, 127, 129, 131, 133, 152 and 154 such that the appropriate selection code is transmitted by microcontroller 215 to multiplexer 209 via multiplexer selection bus 210. The output of multiplexer 209 is a digital audio signal which is shown connected to digital audio interface receiver 214 which is a standard AES/EBU interface device. Digital audio interface receiver 214 communicates with microcontroller 215 via address bus 218 toward the exchange of data and various instruction codes. Digital audio interface receiver 214 serves to determine the rate at which the selected digital audio signal 213 was originally sampled, (sampling rate). The sampling rate referred to herein sometimes as the word clock "WC/" is transmitted to analog board 106 via line 234. Digital audio interface receiver 214 is clocked by clock signal 235 designated as the "256CLK". The output 232 of digital audio interface receiver 214 is shown connected to digital signal processor (DSP) 224.

In the disclosed embodiment of the invention, DSP 224 is a commercially available type 56001 digital signal processor integrated circuit which is suitable for digital audio words having a word length of up to 24 bits in length. DSP 224 is used to perform gain control and, where necessary, dithering. DSP output 233 is fed into delta-sigma modulator 225 which, in the disclosed embodiment of the invention comprises a digital-to-analog converter device which is being used solely to perform the delta-sigma modulation operation. Delta-sigma modulator output 236 which consists of left data, right data and the data clock is connected to analog board 106 shown in FIG. 6A.

When apparatus 100 is initially powered up, the internal programs for DSP 224 are downloaded to DSP 224 from EPROM 222 under the control of microcontroller 215 on data and address busses 201 and 218. Downloading of the DSP program directly onto DSP 224 reduces system costs and allows for greater processing speed. DSP 224 utilizes SRAM 220, EPROM 222 and address decoder 223 to perform digital gain, and dithering functions. All data and addresses used in allowing microcontroller 215 to control the DSP functions travel through buses 201 and 218 respectively. In addition to controlling the digital audio data path, microcontroller 215 is responsible for the control of analog board 106, front panel 103, rear panel 104 and the remainder of digital board 102. The microcontroller 215 also utilizes SRAM 220, EPROM 222 and address decoder 223 to carry out its functions and in accessing its software control instructions. Line 235 is shown connecting the "256CLK" signal to both digital audio interface receiver 214 and delta-sigma modulator 225.

Power to operate digital board 102 is supplied by power transformer 229 which is connected to an external source of AC power via lines 187 and 188 which in turn are connected to the IEC connector 172 located on rear panel 160. Digital power supply 228 regulates the power supplied by power transformer 229 and supplies the various voltages needed to operate the integrated circuit components utilized in digital board 102. Digital supply monitor 227 determines whether the voltage needs of the digital board 102 can be properly met, detects any power related problems and signals microcontroller 215 of any such problems should they occur via control line 231 labeled DPFAIL, (digital board power fail). In addition APFAIL (analog board power fail) line 238 is shown terminating at microcontroller 215 and likewise serves to signal a power fail condition in the analog power supply circuits.

Figure 6A:
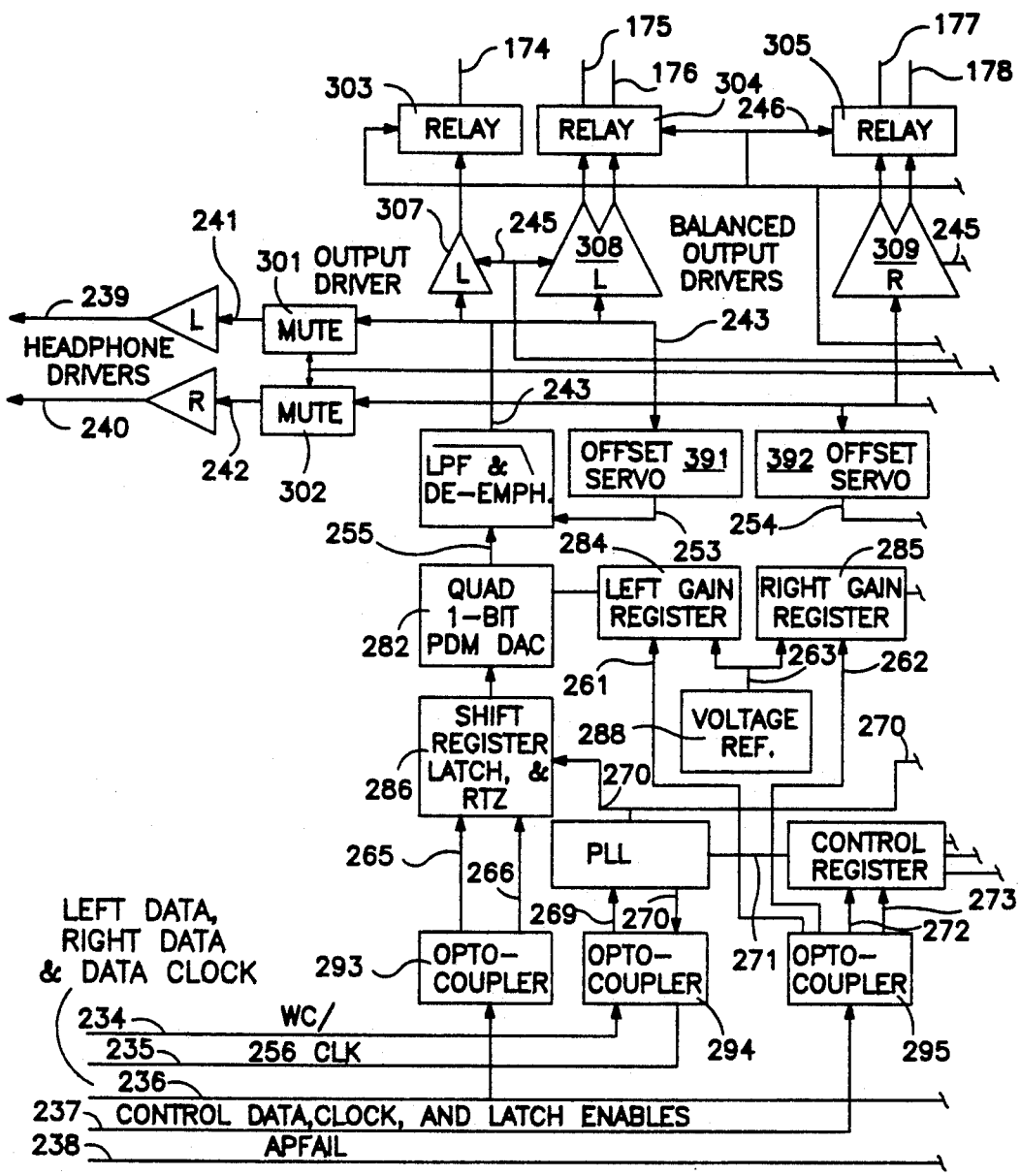
FIG. 6A of the drawings is a portion of a detailed functional block diagram of the analog board of the present invention.
Figure 6B:
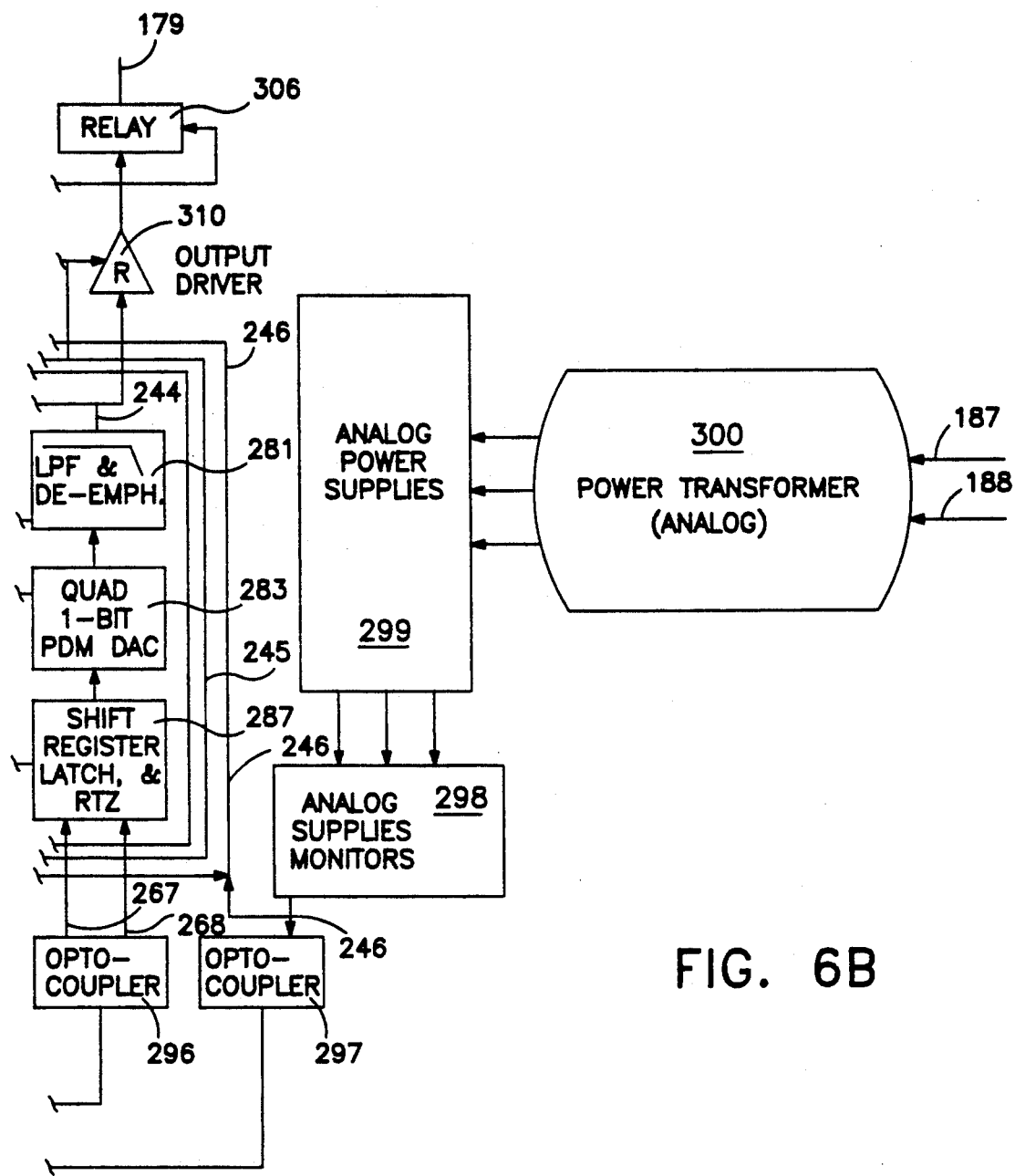
FIG. 6B of the drawings is a portion of a detailed functional block diagram of the analog board of the present invention.

FIGS. 6A and 6B of the drawings together comprise a schematic functional block diagram of analog board 106 of present invention. Analog board 106 exchanges various signals with the digital board 102 (as shown on FIGS. 5A and 5B) including WC/234; 256CLK 235; left data, right data and data clock bundle 236; CDATA (serial packet containing the control data for analog board) bundle 106, CCLK (control clock for clocking control register 290), latch enables 237; and APFAIL 238 which are optocoupled to analog board 106 through optocouplers 293, 294, 295, 296, and 297 respectively. Optocouplers are utilized to minimize noise crossover from digital board 102 to analog board 106.

As both left and right channel digital audio signals are generated by delta-sigma modulator 225 and as the left and right channels of digital audio data follow separate but functionally identical paths within analog board 106, only the left channel path will be discussed herein with the understanding that identical operations are performed on the right channel signal.

The left channel digital audio signal and data clock signal are passed to analog board 106 via optocoupler 293 the outputs of which are left-data signal 265 and data-clock signal 266 which are shown connected to shift register latch and return-to-zero function (RTZ) 286. Return-to-zero function 286 changes the digital audio data 265 from NRZ (non-return-to-zero) format to RTZ format. RTZ 286 is implemented in digital logic using AND and NOR gates which are clocked by 256CLK 270 towards providing an output of both negative and positive values representing the digital audio data 265. RTZ output 257 is fed into a quad one bit pulse density modulated digital-to-analog converter 282 which translates the digital audio signal 257 to its analog equivalent while performing gain in the analog domain, where required. Digital-to-analog converter output 255 is fed into low-pass filter and de-emphasizer circuit 280 where the analog audio data 255 passes through a low-pass filter. De-emphasis occurs only where the input digital audio signal was originally emphasized. The output of the low-pass filter de-emphasize circuit 243 is fed into output drivers 307 and 308 and headphone mute 301. Output drivers 307 and 308 are used to amplify the analog audio signal for use by other analog stereo components. The output driver outputs 247, 248 and 249 are fed into relay circuits 303 and 304 which are controlled by analog power supply monitor 298. Output 246 signals a power problem within apparatus 100 and trips relay circuits 303 and 304 thus isolating apparatus 100 from connected audio components to prevent damage. When the relays are closed, the analog audio output appears on output lines 174, 175 and 176 respectively which connects to outputs 161 and 163 of FIG. 4. Headphone mute 301 is used to protect the headphone driver 239 which drives the left part of a standard set of headphones whose design is well known in the art. The output of the headphone drivers have their terminal in headphone jack 149 shown on FIG. 3.

Phase locked loop (PLL) 289 is used to lock onto the incoming digital audio word clock 269 and produce a low-jitter clock 264 to be used in the digital-to-analog conversion of the digital audio data thus producing a cleaner low-noise version analog audio signal 255. The PLL 289 receives the incoming WC/234 through optocoupler 294 as DAC clock 269. PLL 289 also generates 256CLK 235 which is used as feedback for the PLL and by digital audio interface receiver 214 and for timing DSM 225 On digital board 102 as shown in FIG. 5B. PLL 289 is controlled by control register 290 which receives optocoupled signals 272 and 273 from microcontroller 215 on digital board 102 through optocoupler 295.

Control register 290 receives serial control data 273 and latches it on control-clock 272 for use in the various blocks of analog board 106.

Voltage reference 288 is a high precision 10 V reference which is used to feed left gain register 284 through line 263. Left gain register 284 is controlled by data received from opto coupler 295 and is used to set a reference voltage which is sent to the digital-to-analog converter through output 259 towards determining gain in the 'analog' domain. Offset servo 291 is a DC amplifier which uses a low offset opamp in non-inverting integrator configuration to lower the amount of D.C. error in the audio output signal through using feedback from low-pass filter 280.

Analog power supply 299 accepts voltages from power transformer 300 and regulates them into standard voltage signal which are safely usable by analog board 106. Analog supply monitor 298 monitors lines 274, 275 and 276 which provide the three voltages ($+/-12$ V, $+/-18$ V, $+5$ V) used on analog board 106. Should one of these voltages fail to meet standards programmed into monitor 298, signal 246 is held high to protect the outside digital audio equipment and internal circuitry from variations in voltages by cutting off their performance during the voltage disruption.

Figure 7:
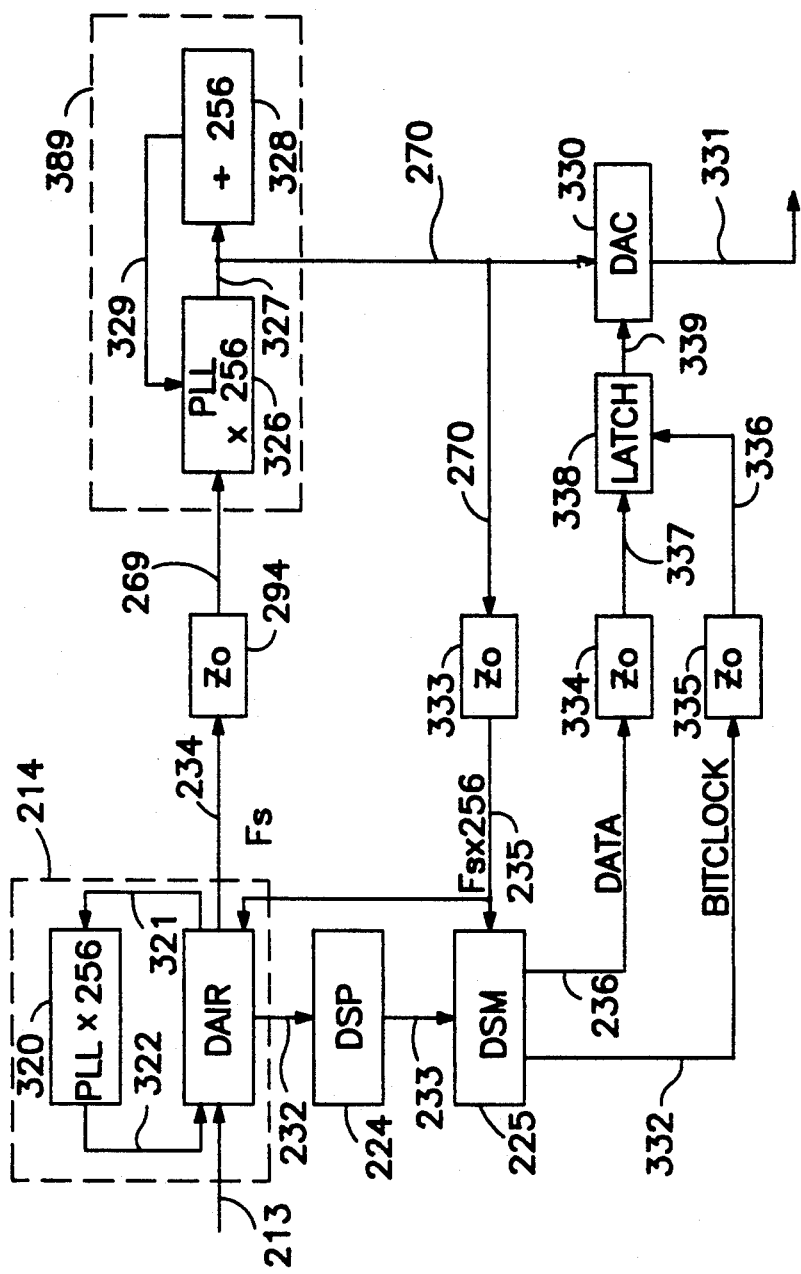
FIG. 7 of the drawings is a functional block diagram illustrating the generation of clock signals within the present invention.

FIG. 7 of the drawings is functional block diagram illustrating the generation of the clock signals within apparatus 100 Digital audio multiplexer output 213 is connected to digital audio interface receiver (DAIR) 214 where the sampling rate of the input audio data 213 is fed onto line FS 234 which is optocoupled in 294 and sent on line 269 into PLL 289. PLL 289 comprises a X 256 PLL 326 and divide by 256 circuit 328. PLL 326 generates low-jitter-clock 327 which is 256 times sampling rate shown on 269.

Figure 31:
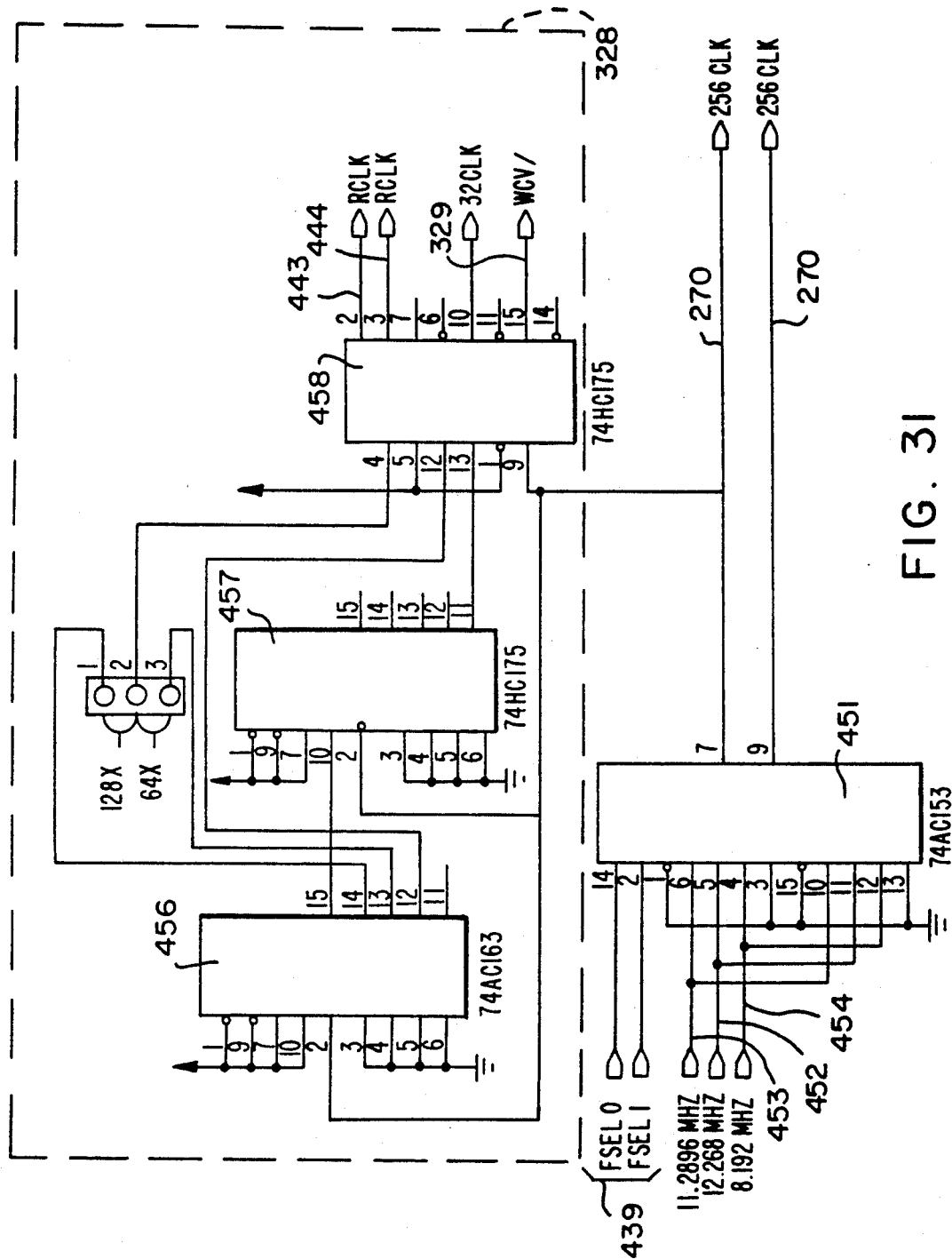
FIG. 31 of the drawings is a schematic circuit diagram of a "divide by 256" circuit.

Feedback 329 closes the loop and is generated by divide-by-256 circuit 328 which divides low-jitter-clock 327 by 256 using 2 cascaded 4-bit counters (shown on FIG. 31). Digital audio interface receiver 214 has on board its own PLL 320 which displays the incoming sampling rate 321 at 256 times its actual rate which is then fed back into the digital audio interface receiver main circuitry on line 322 and used to verify the phase for further correction and matching of digital audio input sample 213's actual sampling rate. Output 232 of digital audio interface receiver 214 is fed into digital signal processor 224 and later via line 233 into delta-sigma modulator 225. The delta-sigma modulator is timed by 256 times sampling rate determined by digital audio interface receiver 214. This signal comes into DSM 225 through the output of optocoupler 333 on line 235 which is connected to PLL 326 output 327. The data output by the DS line 236 is fed into optocoupler 334 which outputs line 337 into latch 338 which is clocked by bit clock 332 as fed through optocoupler 335 and out onto 336. Output 338 of latch 339 is the non-return-to-zero version of the digital audio data which is fed into DAC 330 for translation from digital audio data to analog audio signal. Digital-to-analog converter 330 is timed by 256CLK signal 270 and generates output 331.

Digital audio interface receiver 214 is a digital interface receiver which is used to extract the bi-phase encoded digital audio data and the word clock from the selected digital audio input 213 and generates various output clocks, one of which is the sample rate clock. In deriving word clock 234 from the incoming digital audio data 213, digital audio interface receiver 214 uses on-board PLL 320 and uses the output of PLL 322 as feedback into the digital audio interface receiver circuit phase comparator to phase lock to the incoming sampling rate. If digital audio interface receiver 214 is unable to lock onto the incoming sample rate, it utilizes 256CLK 270 which is digital board 102's version of the low-jitter-clock 327 created by PLL 289 on analog board 102. Digital audio interface receiver's 214 decoding of the digital audio data input 213 is fed onto line 232 remaining in digital audio format into DSP 224.

Digital signal processor (DSP) 224 utilizes the 20 MHz clock which is found on digital board 102.

The data output by the DSP 224 is fed into delta sigma modulator (DSM) 225 where it is upsampled 128 times the sampling rate determined by digital audio interface receiver 214 as locked down by main PLL 289 on analog board 106 and fed back to digital board 102 through optocoupler 333 as Fax 256 signal 235. The DSM alters the 18-bit digital audio word into serial digital audio data which is then output and clocked by bitclock 332. Hence both the serial data 236 and accompanying bitclock 332 are sent to analog board 106 and used to latch the digital audio data into the digital-to-analog converter 330.

Digital-to-analog converter 330 is timed by low-jitter-clock 327 and resulting in analog audio output 331 which is fed into the low pass filter and de-emphasize circuit on analog board 106.

Figure 8A:
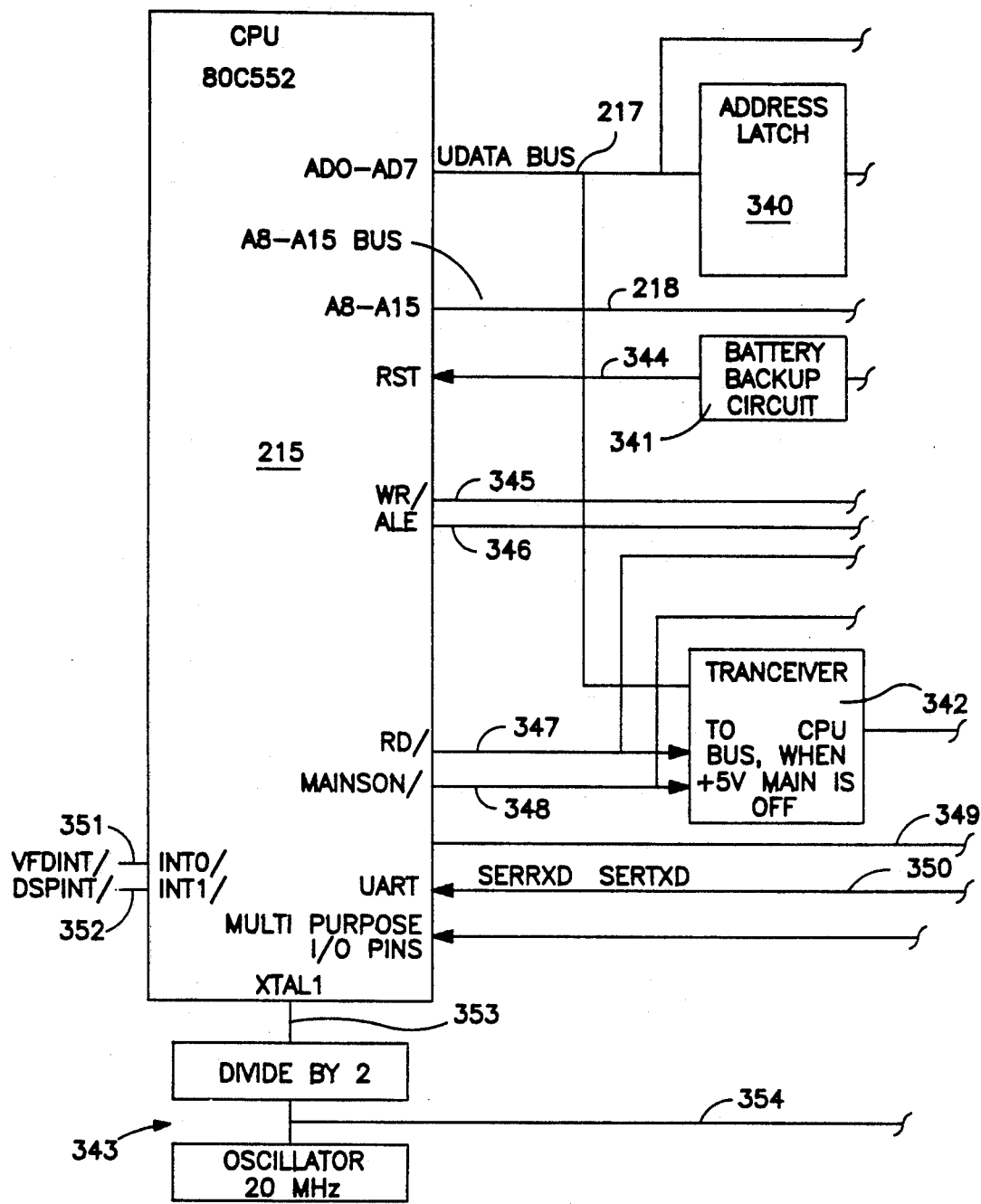
FIG. 8A of the drawings is a portion of a schematic block diagram illustrating the microprocessor unit of the present invention.
Figure 8B:
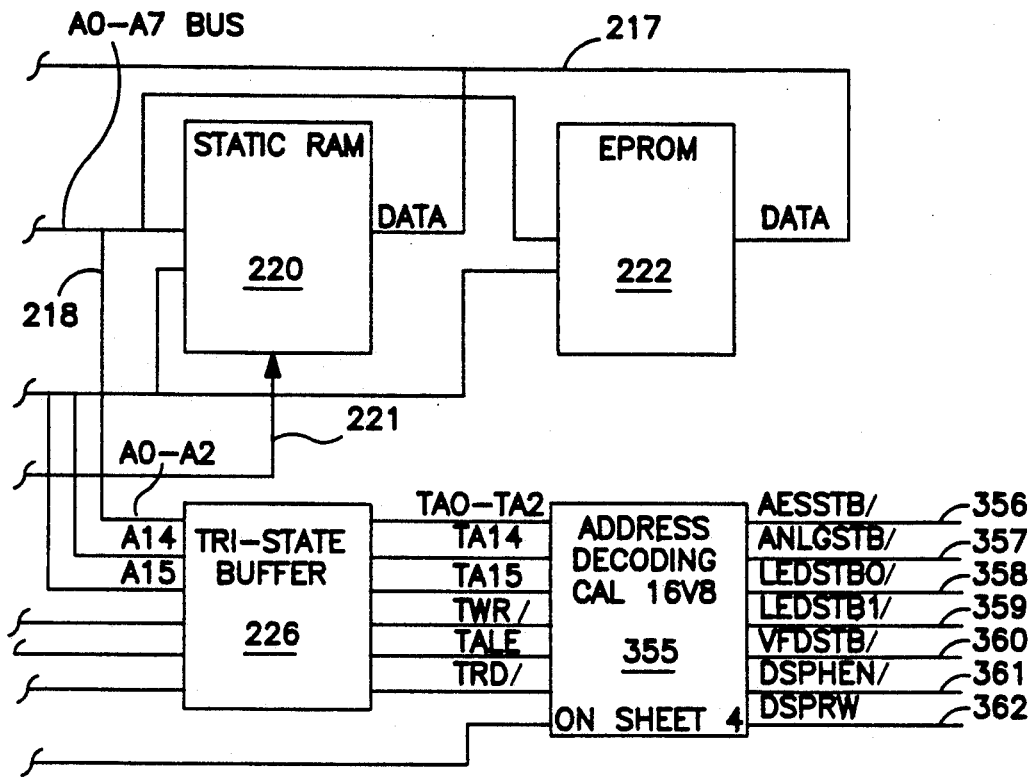
FIG. 8B of the drawings is a portion of a schematic block diagram illustrating the microprocessor unit of the present invention.
Figure 8B:
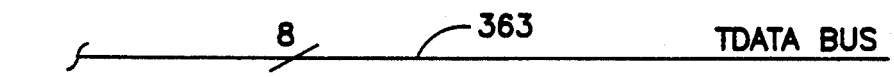
Figure 8B:
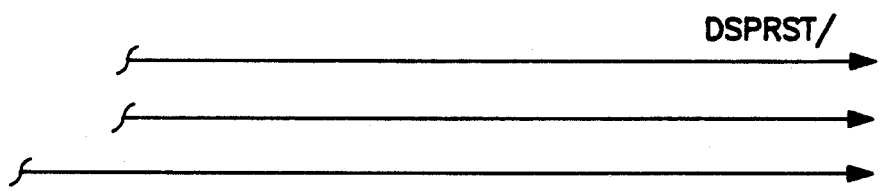
Figure 8B:
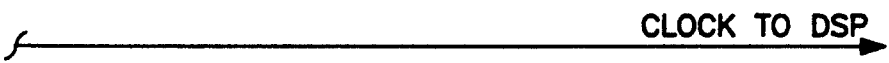

FIGS. 8A and 8B of the drawings together comprise a schematic block diagram illustrating the microprocessor unit 215 of the apparatus 100. Microprocessor 215 uses the U-data bus 217 to transport multiplexed address and data information to address latch 340, SRAM 220, EPROM 222 and transceiver 342. Microprocessor 215 is also connected to the SRAM 220 and EPROM 222 and tri-state buffer 226 through A8-A15 bus 218. Battery backup circuit 341 monitors the +5 V AUX power supply allowing, under normal voltage and current conditions, SRAM 220 to be powered directly by digital power supplies 228. However, if supply is cut off (the unit is unplugged) battery backup circuit 341 automatically switches to its connected battery or power which is used by SRAM 220 to maintain the user status data which is in SRAM and sends reset signal 344 to microcontroller 215 once power is reconnected. RD/347 and MAINSON/348 are connected to tri-state buffer 226 along with WR/345 and ALE 346 which control the writing and latching abilities of buffer 226. The outputs of tri-state buffer 226 are fed into address decoding GAL 355 which processes signals 364, 365, 366, 367, 368 and 369 and determines the timing of outputs 356, 357, 358, 359, 360, 361 and 362 dependent on timing signals from microcontroller 215. Transceiver 342 is a bi-directional latch which isolates microcontroller 215 when +5 V power supply is turned off to prevent damage to the microprocessor's circuitry due to spurious signals on T-data bus 363 (see FIG. 5A). UART 350 is a serial bi-directional transmission line communicating data to RS-232 and RS-485 connectors, 170 and 171. Microprocessor 215 is clocked by local oscillating unit 343 composed of 20 MHz oscillator and "Divide-by-2" circuit which provides a 10 MHz clock 353 to microcontroller 215 and 20 MHz clock 354 to DSP 224 and a number of other circuits throughout apparatus 100.

Figure 9A:
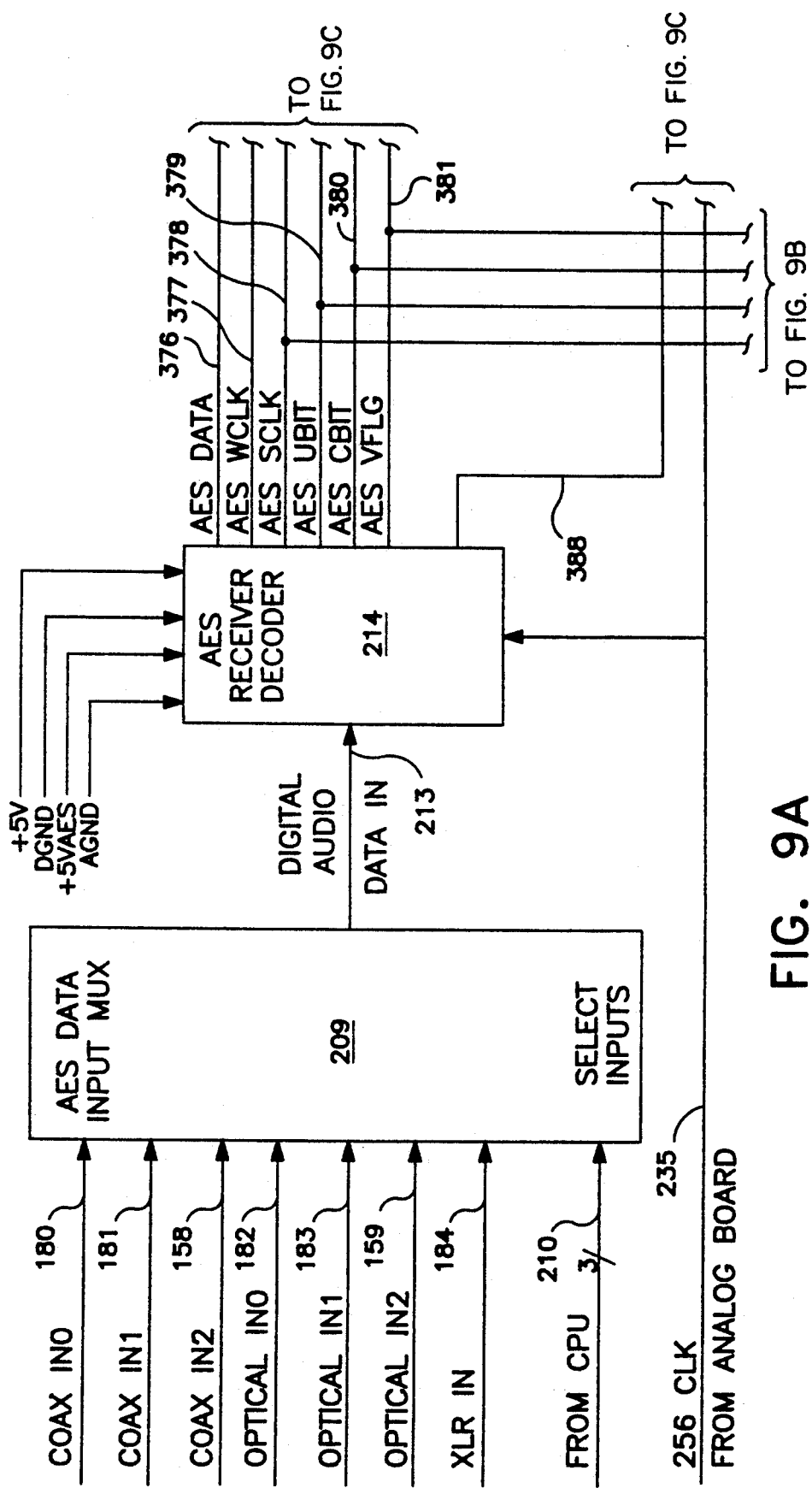
FIG. 9A of the drawings is a portion of a detailed block diagram illustrating the processing of the audio signal in the digital board of the invention.
Figure 9B:
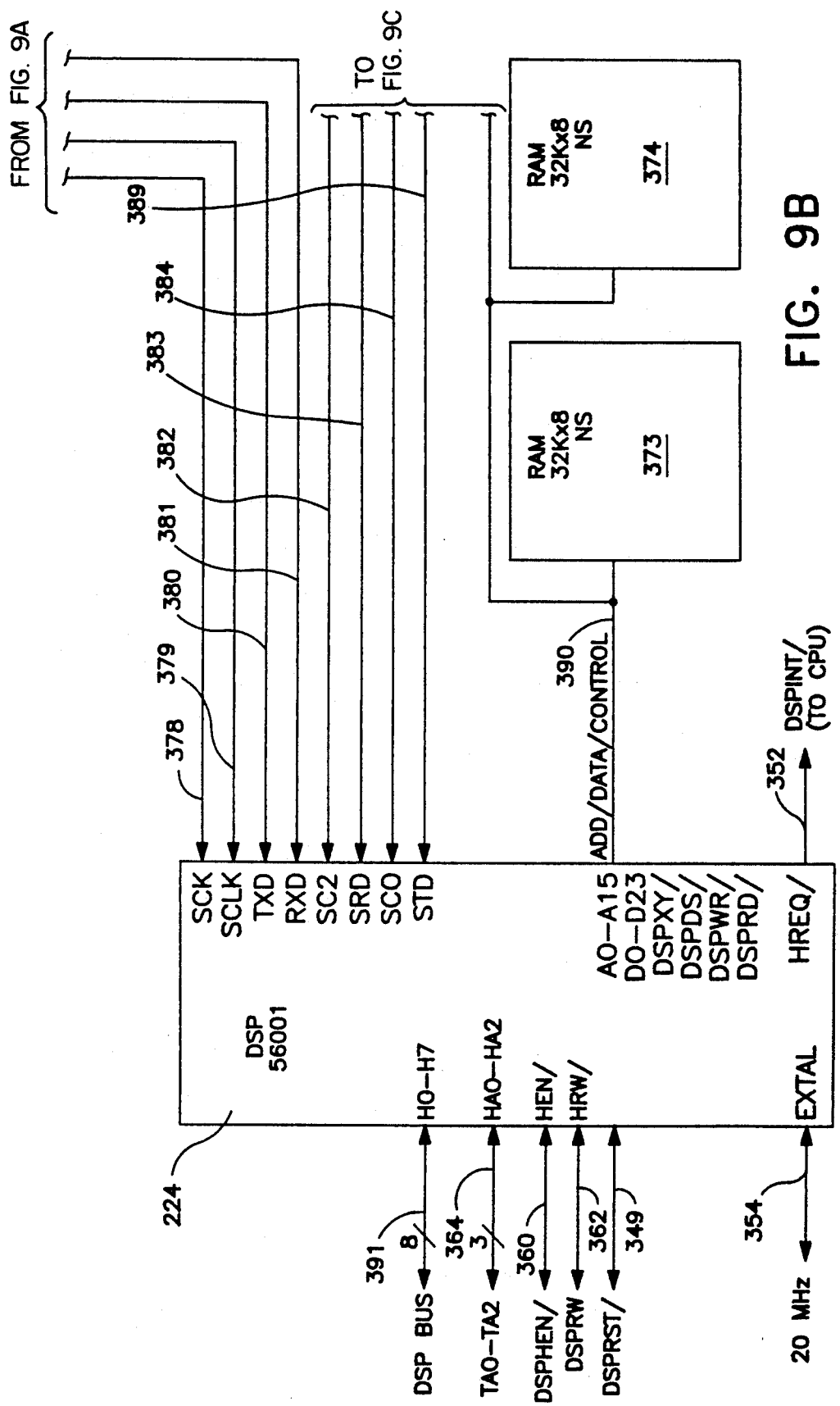
FIG. 9B of the drawings is a portion of a detailed block diagram illustrating the processing of the audio signal in the digital board of the invention.

FIGS. 9A, 9B and 9C of the drawings together comprise a detailed block diagram illustrating the processing of digital audio signal 101. The user may connect an externally generated digital audio signal 101 to any one the input connectors available on front panel 103 and/or rear panel 104 which are electrically connected through lines 180, 181, 158, 182, 183, 159 and 184 to digital data input multiplexer 209. The user selects which input is processed using input select buttons 123, 125, 127, 129, 131, 133, 152 and 154. (shown on FIG. 3A) which are fed to microcontroller 215. The encoded selection is communicated on multiplexer-select bus 210 resulting in the electrical connection of the selected input line to multiplexer-output 213 which is connected to digital audio interface receiver 214. Digital audio interface receiver 214 reads digital audio signal 101 from multiplexer-output 213 to determine its sampling rate, AES_WC 377, which is determined by the phase lock loop (PLL) resident on digital audio interface receiver 214. The decoded digital data (AES_DATA) 376 is shifted out of digital audio interface receiver 214 clocked by AES_SCLK 378 along with validity flag (AES_VFLG) 381, channel status bit (AES_CBIT) 380, and channel status block start flag (AES_BLKS) 384. These signals are synchronized by framing GAL 370 for use by DSP 224. Framing GAL 370 also coordinates data transfer between digital audio interface receiver 214 and DSP 224 by using DSTAESRD/ to strobe AES-DSP status register 372 which is located on DSP memory bus 390 along with the RAM. Digital audio interface receiver 214, in turn, communicates with microcontroller 215 through AES_CPU status register 371, and T-data bus 363, which continues on FIG. 8A, into transceiver 342 before reaching the CPU.

DSP 224 is responsible for the digital signal processing in apparatus 100 including dithering, digital attenuation, balance, muting, and phase inversion. DSP 224 is a 24-bit fixed point digital signal processor integrated circuit device which is controlled by microcode downloaded from microcontroller 215 to DSP 224 through T-data bus 363, an 8-bit wide bi-directional bus; DSP host control bus 364, 3 bits wide; DSPHEN 360; and DSPRW signal 362. The downloaded programming and collected data are stored in the DSP 224 internal 512×24-bit wide RAM. The programming implemented by apparatus 100 in DSP 224 is described below. DSP 224 is clocked by 20 MHz clock signal 354 generated by the local oscillator shown in FIG. 8 and can interrupt microcontroller 215 with DSPINT/352 for additional status or control data.

The programs implemented by DSP 224 act upon AES_Data 376 which is framed by framing GAL 370. The data is then processed and is shifted out on DSPData 389 into framing GAL 370 where it is retimed and transmitted to DSM 225 on DAC_DATA 233.

Delta-Sigma Modulator 225 up samples DAC_DATA 233 by 128 times DAC_WC 386. The audio stereo data feeds an 8 times oversampling interpolation filter, which generates 7 intermediate sample values between each of the incoming samples by the use of a large finite impulse response filter, resulting in audio data at 8 times the original sample rate. This data is fed into the Delta-Sigma modulator which operates at 16 times its input data rate, for a total oversampling ratio of 128. This modulator uses a fifth order noise-shaper which allows reduction of the word size down to a single bit per channel (at 128 times the original word rate) by shaping the resultant quantization noise spectrum such that the audio band has a minimal amount, at the expense of a large amount of out-of-band noise. The higher the order of the noise shaper, the greater the reduction of in-band quantization noise. Apparatus 100 incorporates a fifth order noise shaper, the highest order noise shaper available today.

DSM_data 236, digital audio data clocked at 128 times its incoming rate, is passed onto analog board 106 through optocouplers 294 and 296 (shown on FIGS. 6A and 6B).

Dithering is used to eliminate the harmonic distortion caused by quantization and to extend the audible dynamic range of the digital audio signal at the expense of some loss in the SNR. There are 2 situations where dithering is used in apparatus 100: when digital audio data 101 contains more than 18 bits of precision or when volume control is below the threshold where digital attenuation begins. DSP 224 has 2 user-selectable types of dither, Broadband-Triangular and Weighted dither, each having qualities which are better for certain audio signals and less desirable for others. Accordingly, apparatus 100 allows user to select either type of dithering by using VFD 135 and balance control knob 143 to select the particular dithering algorithm preferred by user.

Figure 10:
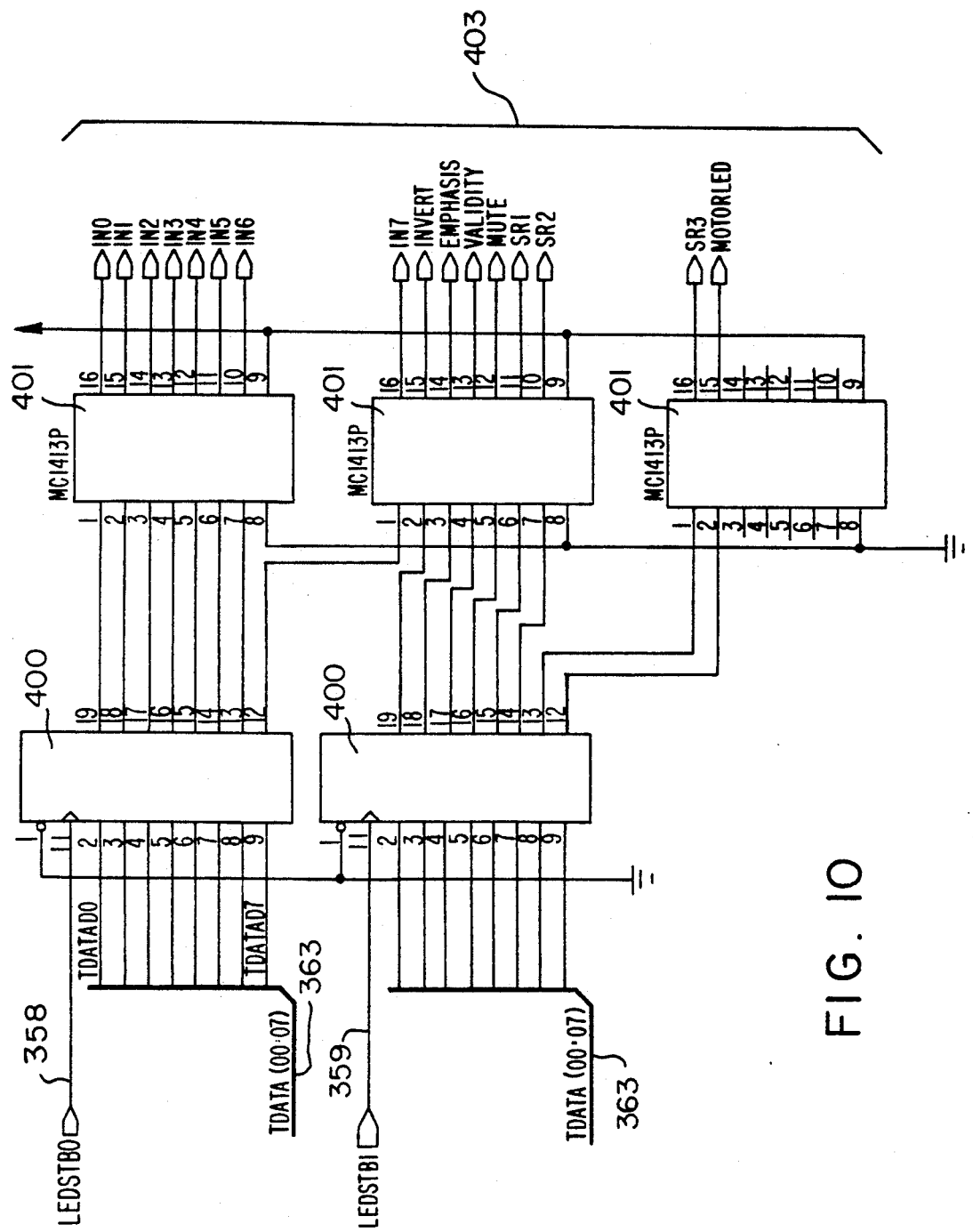
FIG. 10 of the drawings is a schematic circuit diagram of the LED drivers for the front panel indicators.

FIG. 10 of the drawings is a schematic circuit diagram of the LED drivers for the front panel status indicators on front panel switch and LED board 112; front panel status LED and remote board 113; and behind door board 114 on front panel 103. Microprocessor 215 controls all of the LED's on front panel 103. T-data 363 contains the LED's status signals when LEDSTB 358 and 359 signals to latches 400 the new status of the LED's. This LED status word is fed to high-current LED drivers which drive the 16 LED's residing throughout front panel 103 via LED signals 403.

Figure 11B:
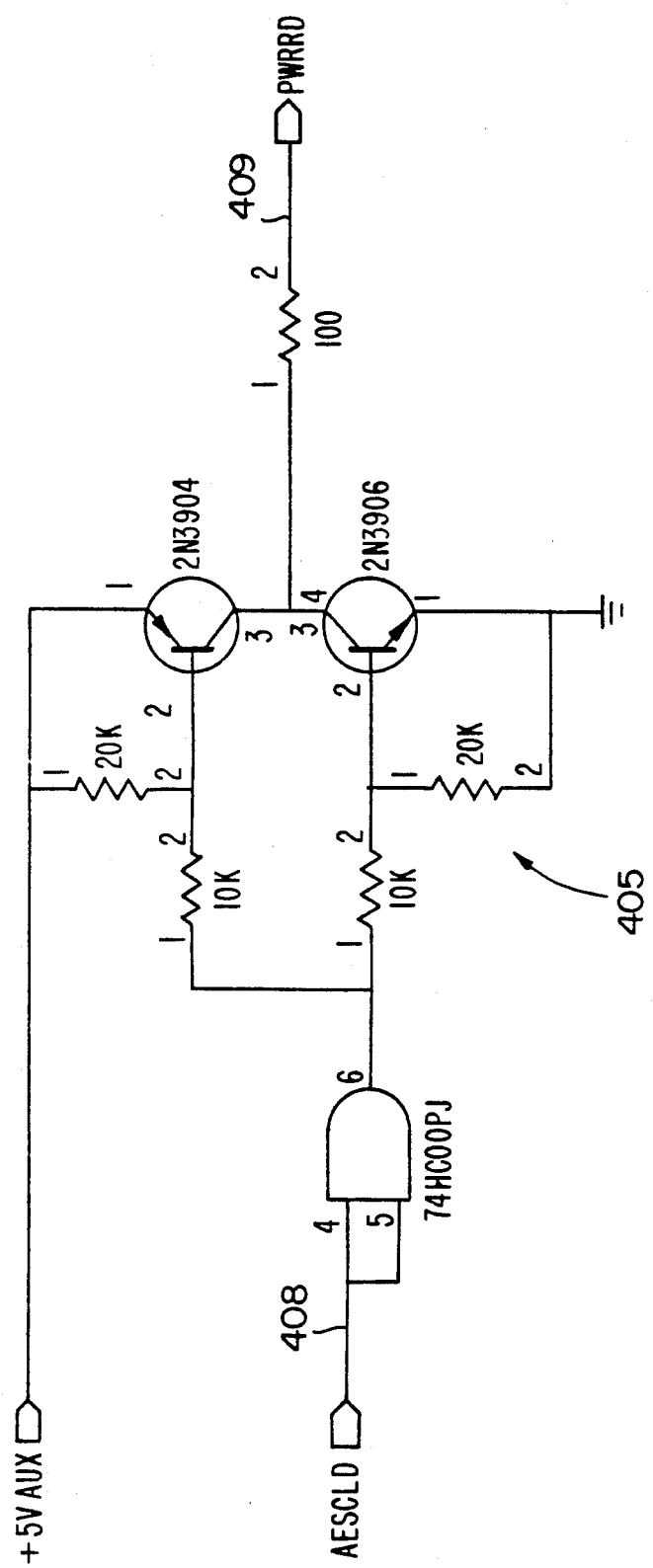
FIG. 11B of the drawings is a portion of a schematic circuit diagram for the drivers for the power indicator located on the front panel of the invention.

FIGS. 11A and 11B of the drawings together compare a schematic circuit diagram of the bicolor power indicator LED driver on power board 111. Power status signals 406 and 408 are inverted because they initialize HIGH and would drive the LED green which would give the wrong status. The inverted outputs are then buffered and amplified by transistors which is connected to current limiting resistor and then to the LED's through 407 and 409.

Figure 12:
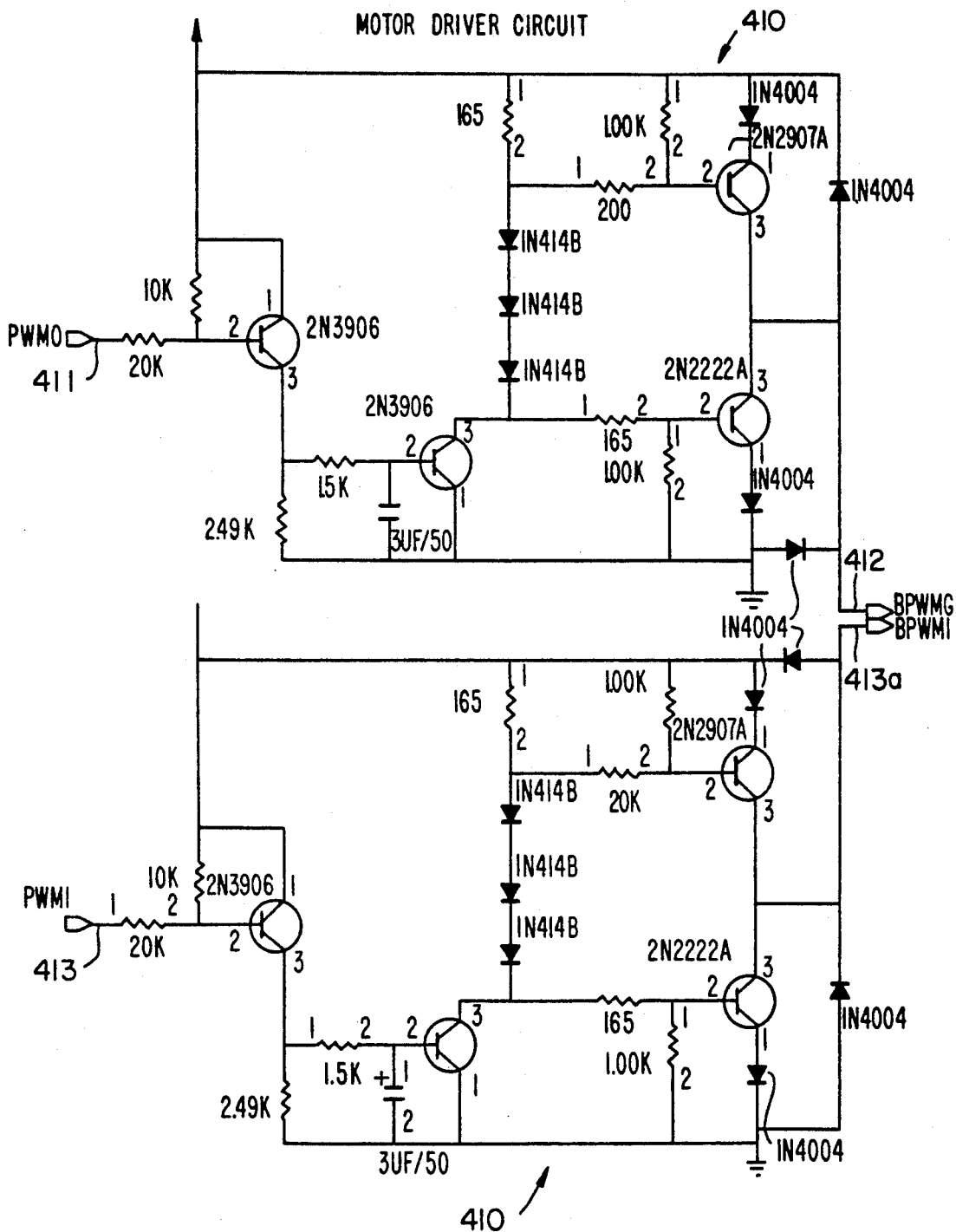
FIG. 12 of the drawings is a schematic circuit diagram of the motor driver circuits for the volume potentiometer located on the front panel of the invention.

FIG. 12 of the drawings is a schematic circuit diagram of motor driver circuit 410 for volume knob 146 located on motor potentiometer board 116 of apparatus 100. Rotation-codes 411 and 413 are fed into separate motor driver circuits 410 which amplify the signals to the voltage levels required to rotate potentiometer 146 rotation right signal 412 and rotation left signal 413a.

Figure 13B:
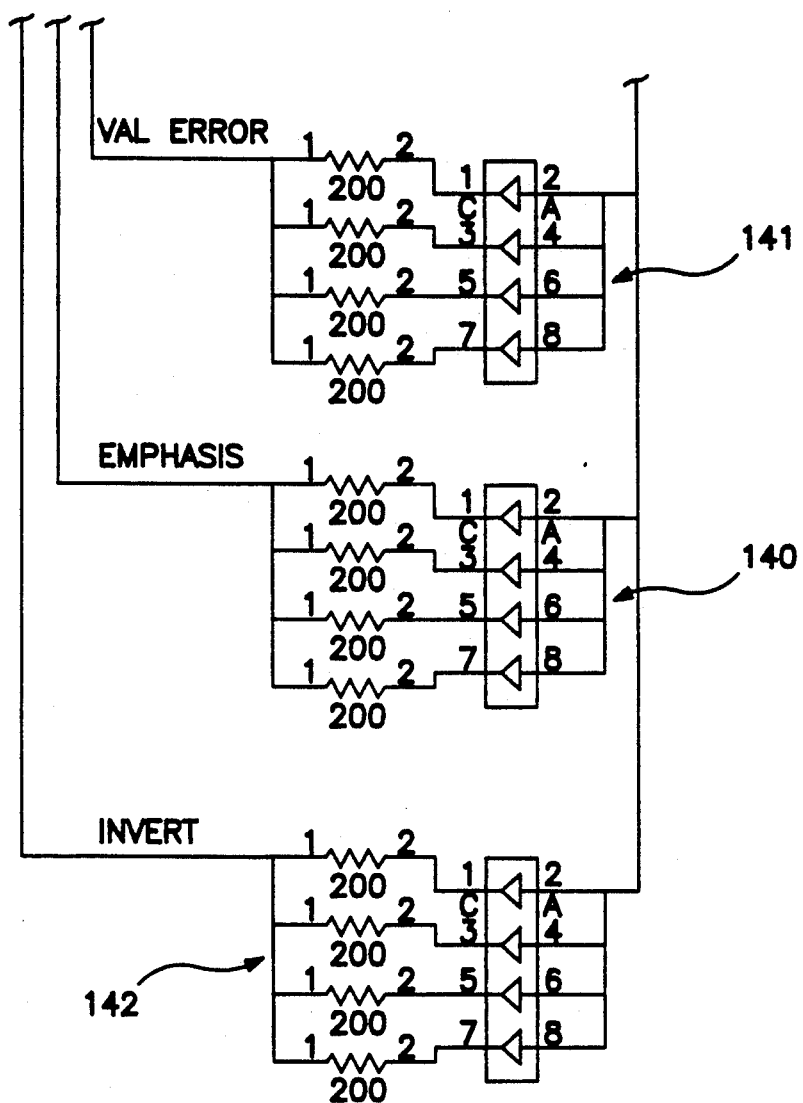
FIG. 13B of the drawings is a portion of a schematic circuit diagram of the display board for providing bar indicators on the front panel of the invention.

FIGS. 13A and 13B of the drawings together comprise a schematic circuit diagram of display board 113 on front panel 103. LED indicator bars 136, 137, 138, 141, 140 and 142 are driven by LED drivers 401 shown on FIG. 10 and appear as uniformly illuminated bars as shown in FIG. 3.

Figure 14A:
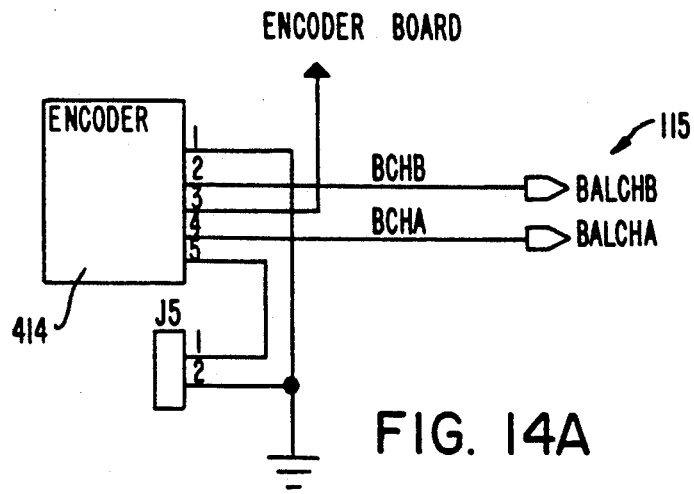
FIG. 14 of the drawings is a schematic circuit diagram of the encoder board for the balance control knob.
Figure 14B:
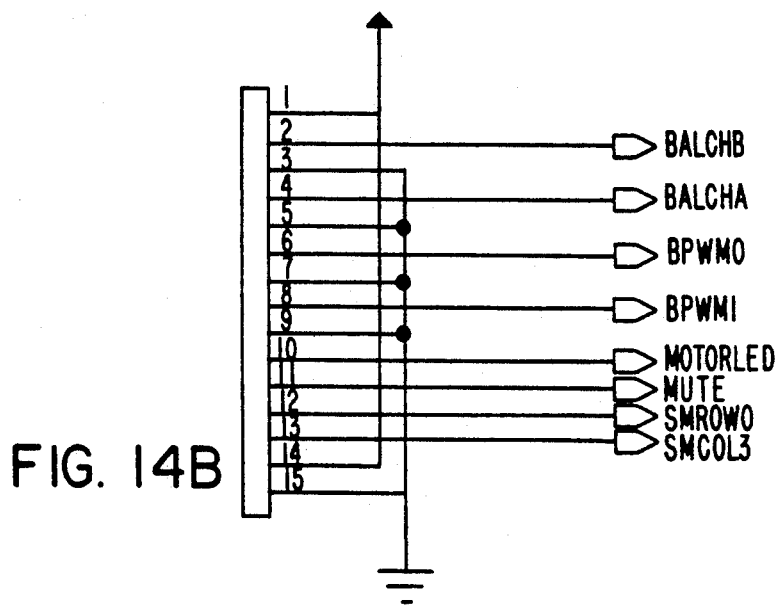
Figure 14C:
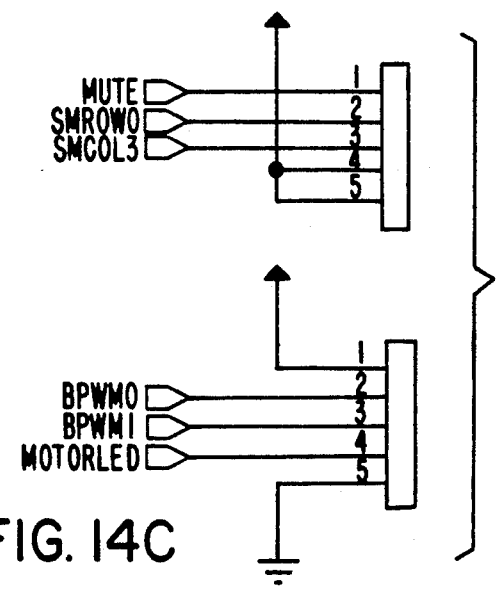

FIG. 14 of the drawings is a schematic circuit diagram of encoder board 115 on front panel 103 of the current invention. Encoder board 115 consists of optical encoder 414 which is a quadrature phase optical encoder operating at 32 PPR. Its 2 outputs are quadrature out-of-phase relative to whether the encoder moved clockwise or counter-clockwise. This data is fed directly to microcontroller 215.

Figure 16:
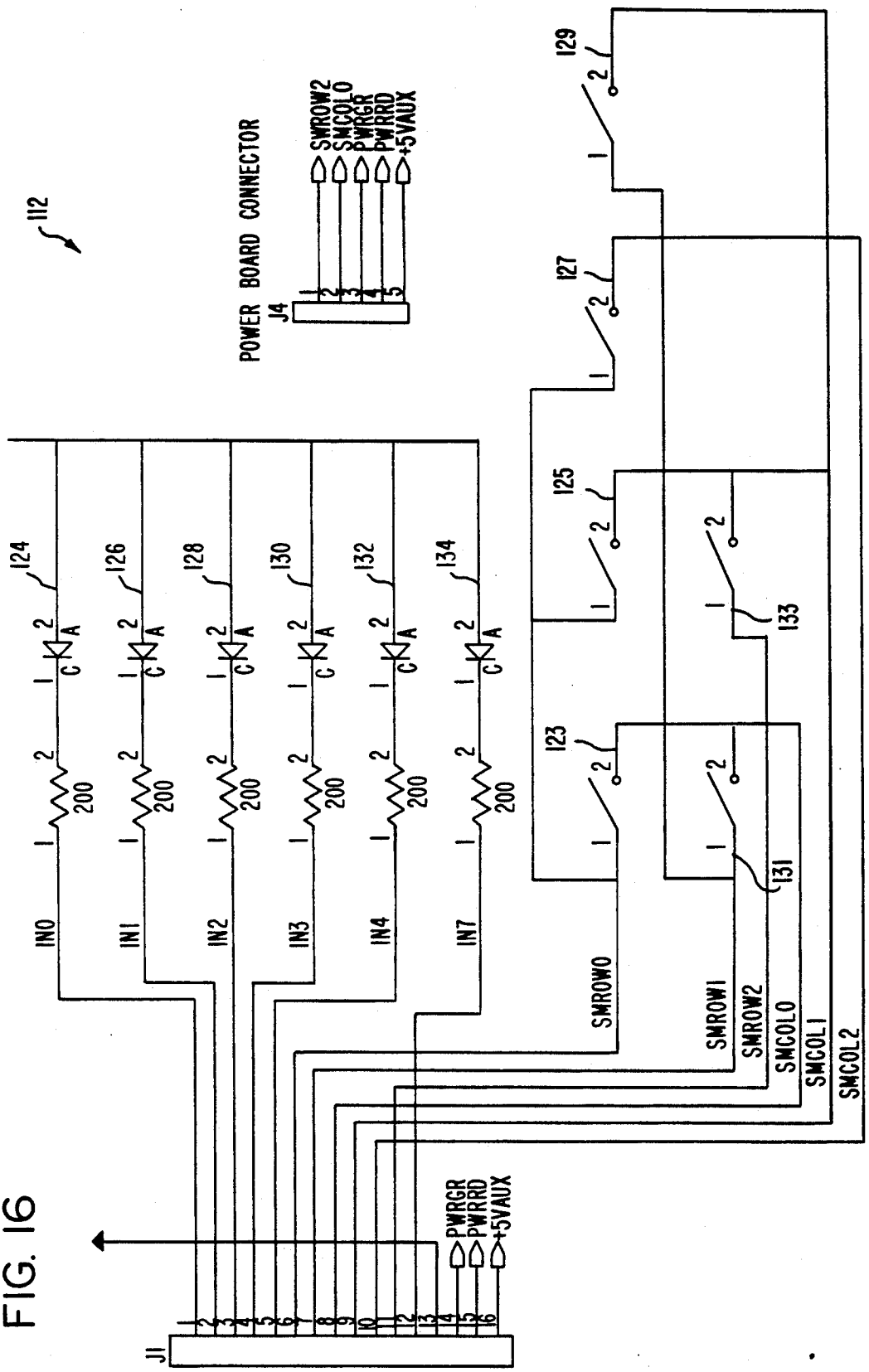
FIG. 16 of the drawings is a schematic circuit diagram of the input selection switch array and the accompanying LED indicators.

FIG. 16 of the drawings is a schematic circuit diagram of the input select switch array and accompanying LED's found on front panel switch and LED board 112. Input select indicator switches 123, 125, 127, 129, 131 and 133, pictured in FIG. 3, are part of a 3×4 switch matrix used to convey user-control status to microcontroller 215. Input select indicator LED's 124, 126, 128, 130, 132 and 134, shown embedded in the input select switches in FIG. 3, are driven by LED drivers 401 shown in FIG. 10.

Figure 15:
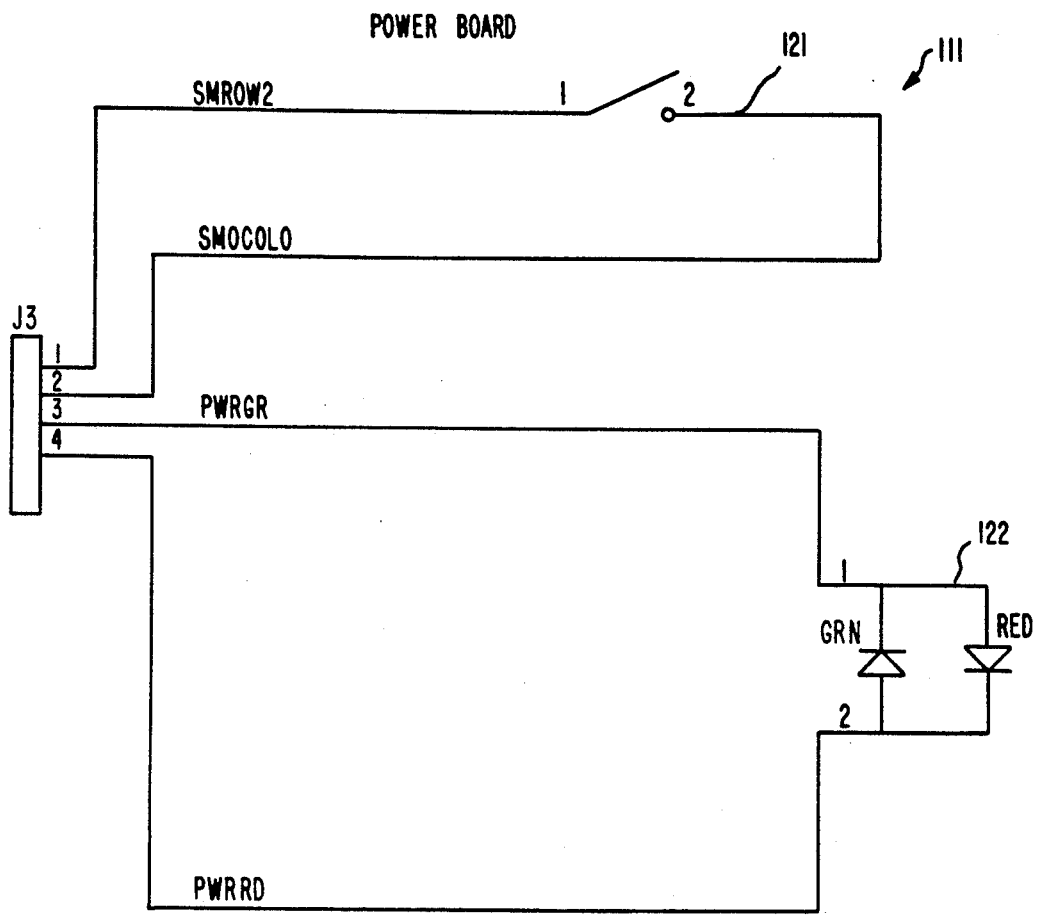
FIG. 15 of the drawings is a schematic circuit diagram of the power board illustrating the power switch and LED indicator.

FIG. 15 of the drawings is a schematic circuit diagram of power board 111 illustrating power switch 121, which is part of the 3×4 switch matrix, and its associated bi-color LED 122, operably shown in FIG. 3. Bi-color LED 122 is driven by LED driver 405 as shown in FIG. 11.

Figure 17:
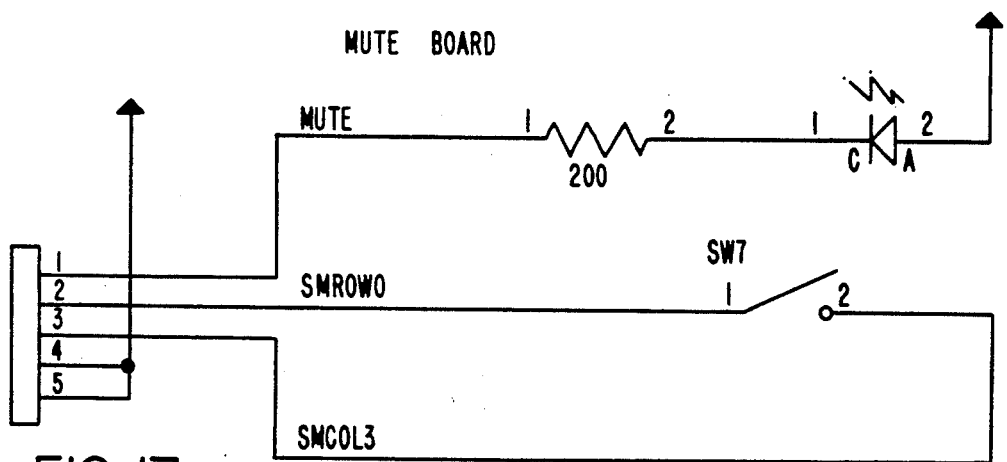
FIG. 17 of the drawings is a schematic circuit diagram of the mute board illustrating the mute switch and LED indicator.

FIG. 17 of the drawings is a schematic circuit diagram of mute board 117 illustrating the mute switch 144, which is part of the 3×4 switch matrix, and the associated LED 145.

Figure 18:
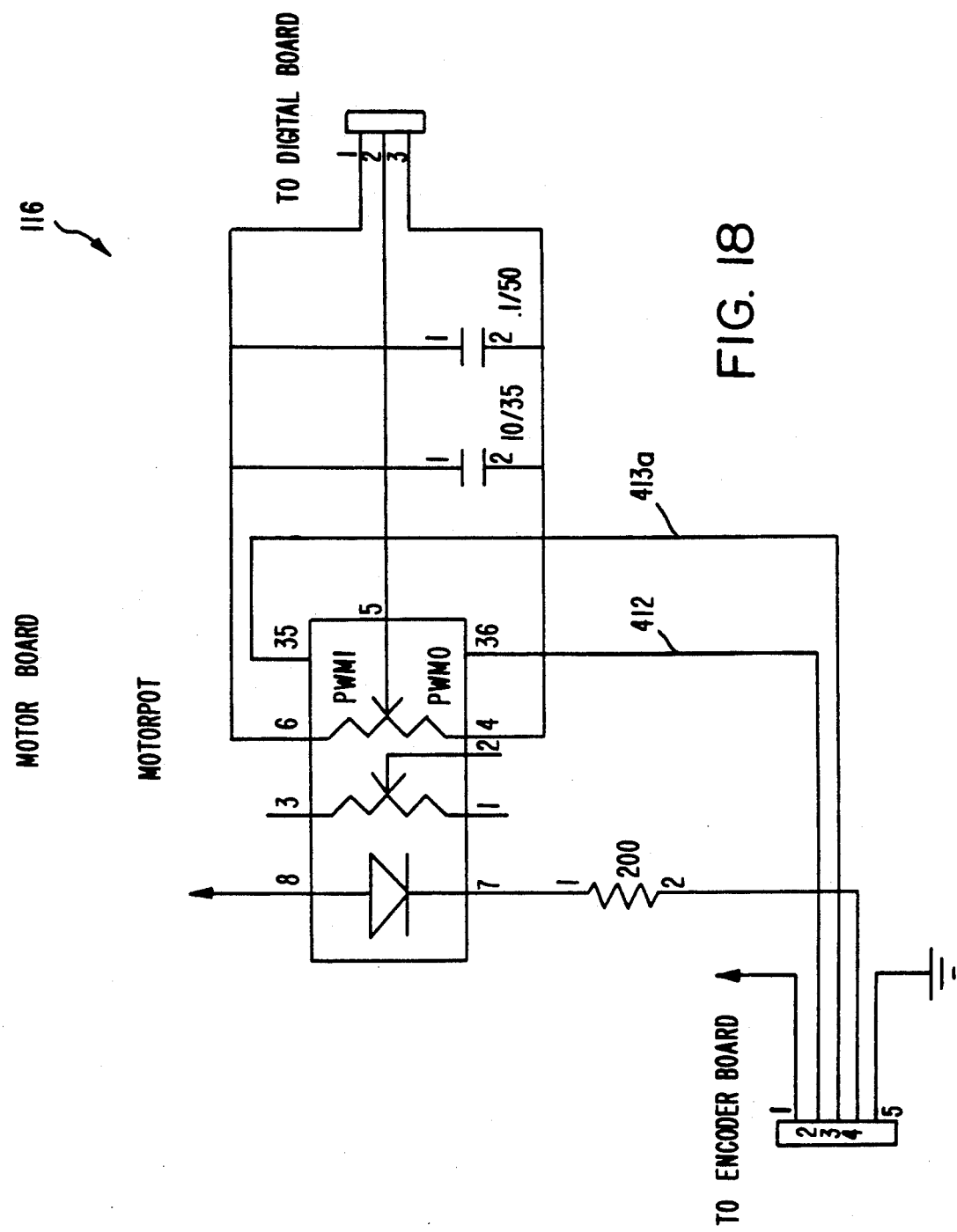
FIG. 18 of the drawings is a schematic circuit diagram of the motor board for the volume potentiometer.

FIG. 18 of the drawings is a schematic circuit diagram of motor board 116 which serves to rotate volume knob 146 which is controlled by two motor driver circuits 410 shown in FIG. 12 with rotation-right signal 412 and rotation-left signal 413a.

Figure 19A:
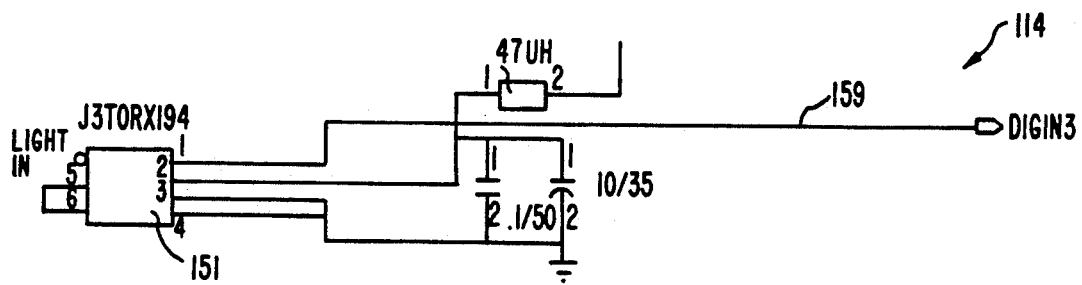
FIG. 19 of the drawings is a schematic circuit diagram illustrating auxiliary digital signal input connections on the front panel and associated selection switch and LED indicators.
Figure 19B:
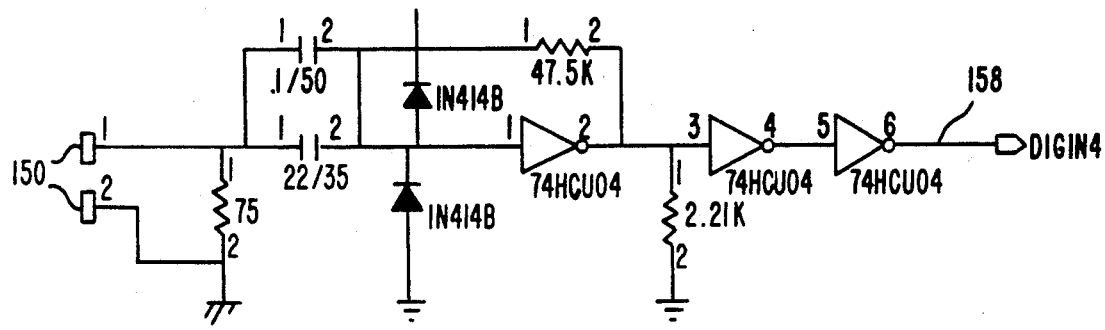
Figure 19C:
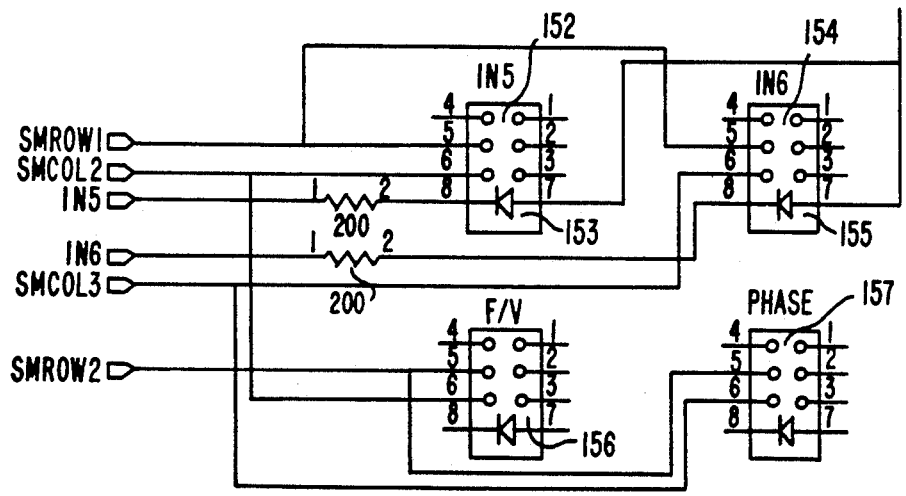

FIG. 19 of the drawings is a schematic circuit diagram illustrating auxiliary digital input connections 165, 166, 167 and 168 located on behind door board 114. Optical input 151 (shown on FIG. 4) is received by "TOSLINK" receiver 151 which receives, decodes and translates the optical data creating digital audio signals. "TOSLINK" decoded data 159 feeds into digital audio multiplexer 209 shown in FIGS. 5 and 9. Coaxial input 150 corresponding to RCA plug 150 in FIG. 4 is amplified, buffered and inverted through three inverter stages resulting in digital audio signal 158 which is connected to digital audio multiplexer 209 on digital board 102. Switches 152, 154, 156 and 157 are part of the 3×4 switch matrix. LED's 153 and 155 associated with auxiliary-6 switch 152 and auxiliary-7 switch 154 are embedded in said switches.

Figure 20A:
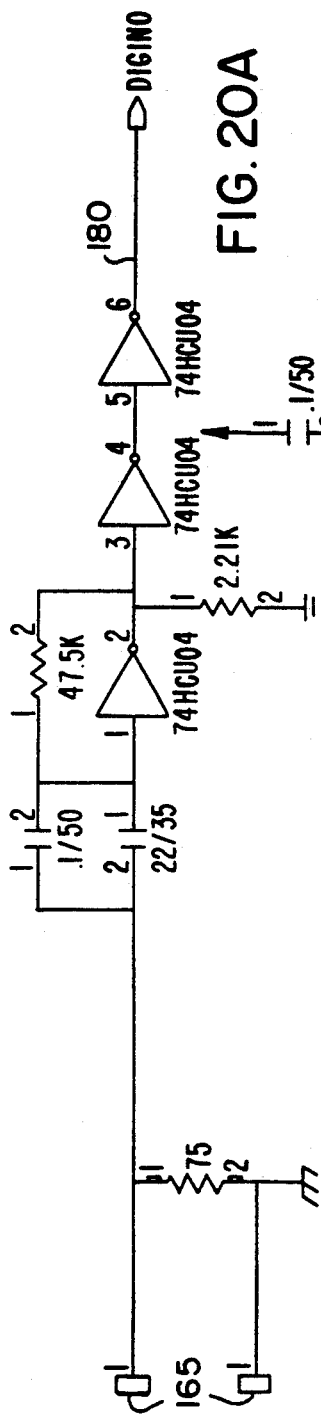
FIG. 20 of the drawings is a schematic circuit diagram of digital signal input connectors located on the rear panel of the present invention.
Figure 20B:
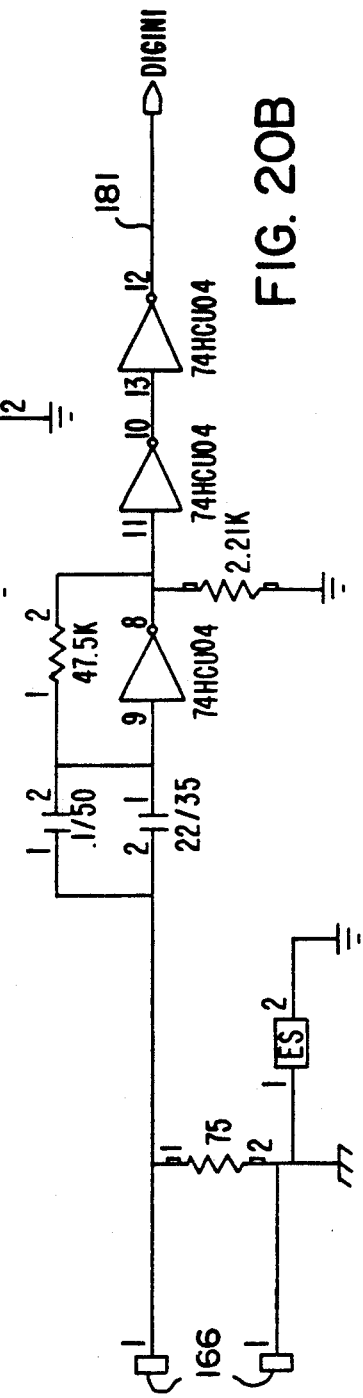
Figure 20C:
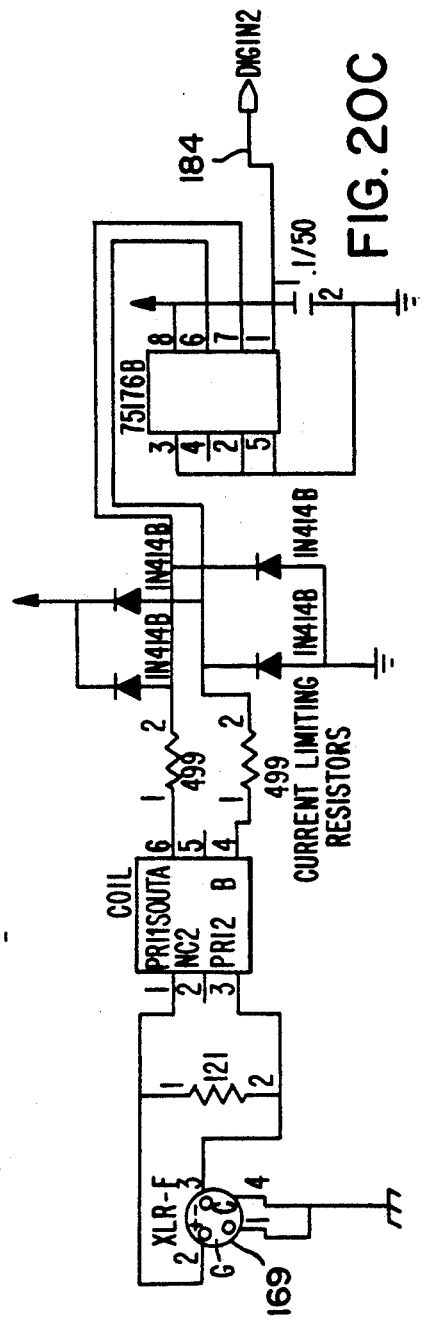

FIG. 20 of the drawings is a schematic circuit diagram of digital signal input connectors on rear panel board 104. Coaxial inputs 165 and 166 corresponding to RCA connections 165 and 166 on rear panel 160 are amplified, buffered and inverted through three inverter stages each resulting in digital audio signals 180 and 181 which are connected to digital audio multiplexer 209 shown in FIGS. 5 and 9. Connection 169 is XLR-F type which is decoded and buffered into digital audio signal 184 which is connected to digital audio multiplexer 209 shown in FIGS. 5 and 9.

Figure 21:
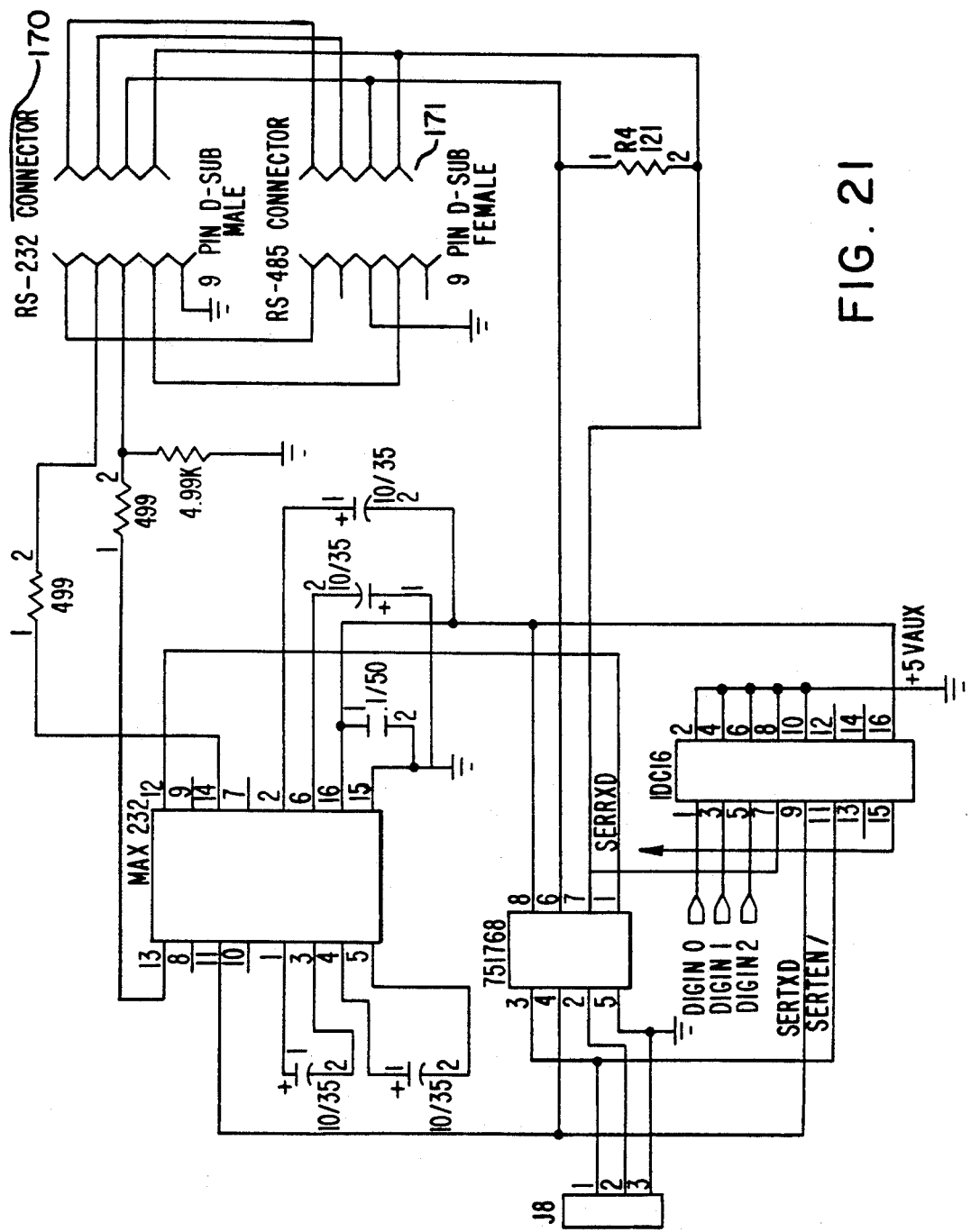
FIG. 21 of the drawings is a schematic circuit diagram illustrating the automation ports located on the rear panel of the present invention.

FIG. 21 of the drawings is a schematic circuit diagram illustrating the automation ports located on the rear panel of the present invention. RS-232 connector port 170 and RS-485 connector port 171 are illustrated.

Figure 22A:
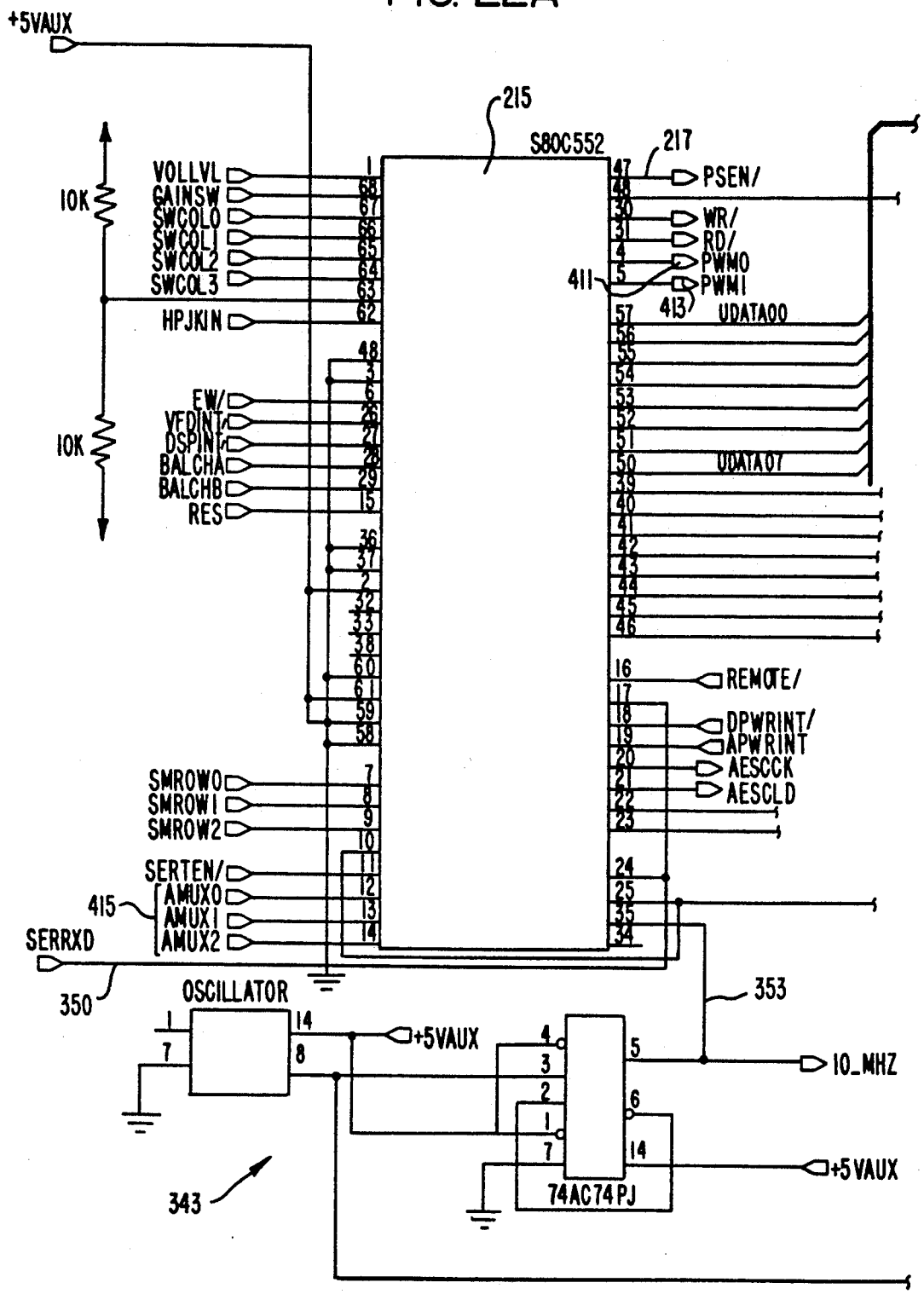
FIG. 22A of the drawings is a portion of a schematic circuit diagram illustrating the CPU, ROM and RAM components of the digital board.
Figure 22B:
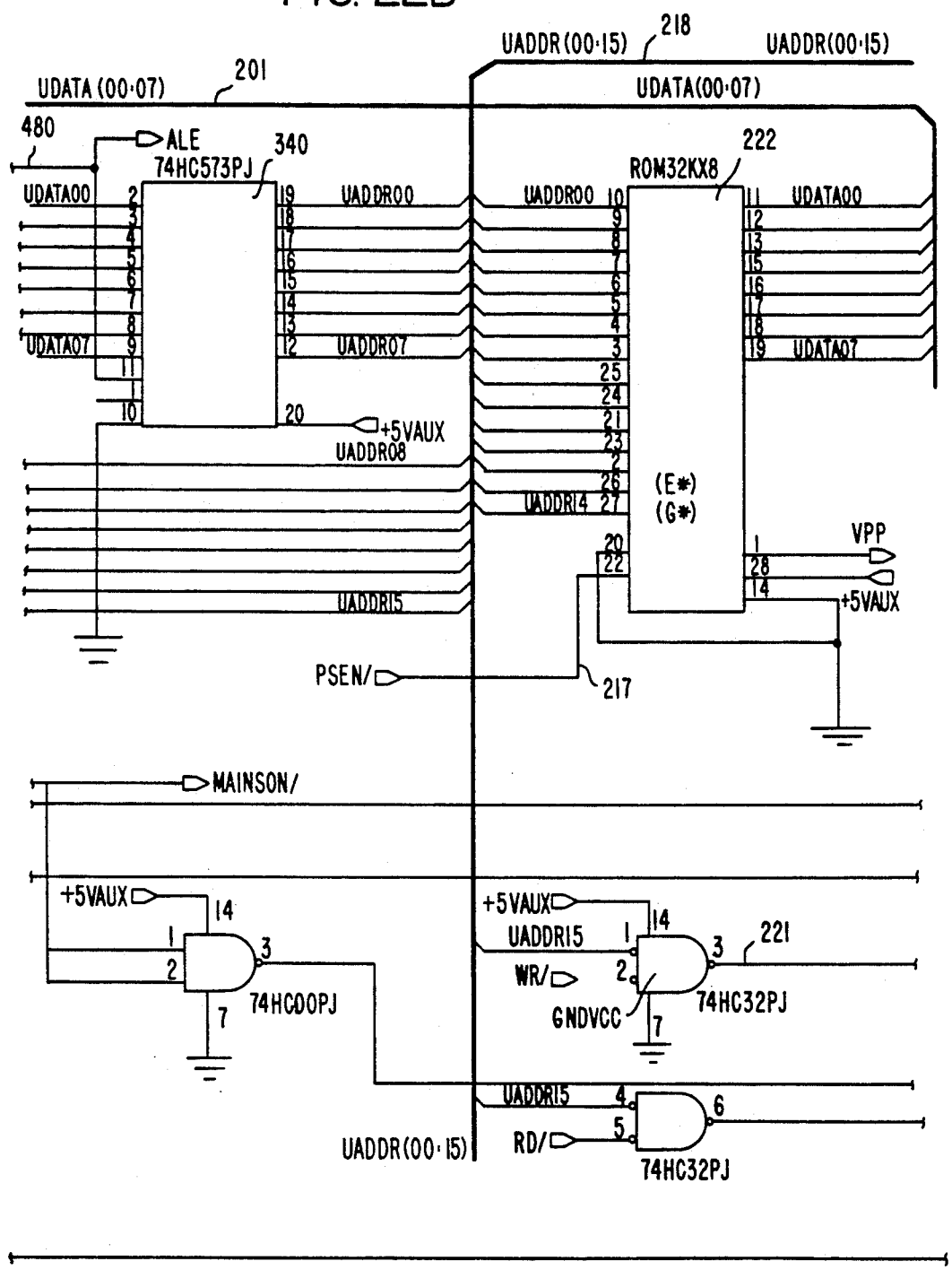
FIG. 22B of the drawings is a portion of a schematic circuit diagram illustrating the CPU, ROM and RAM components of the digital board.
Figure 22C:
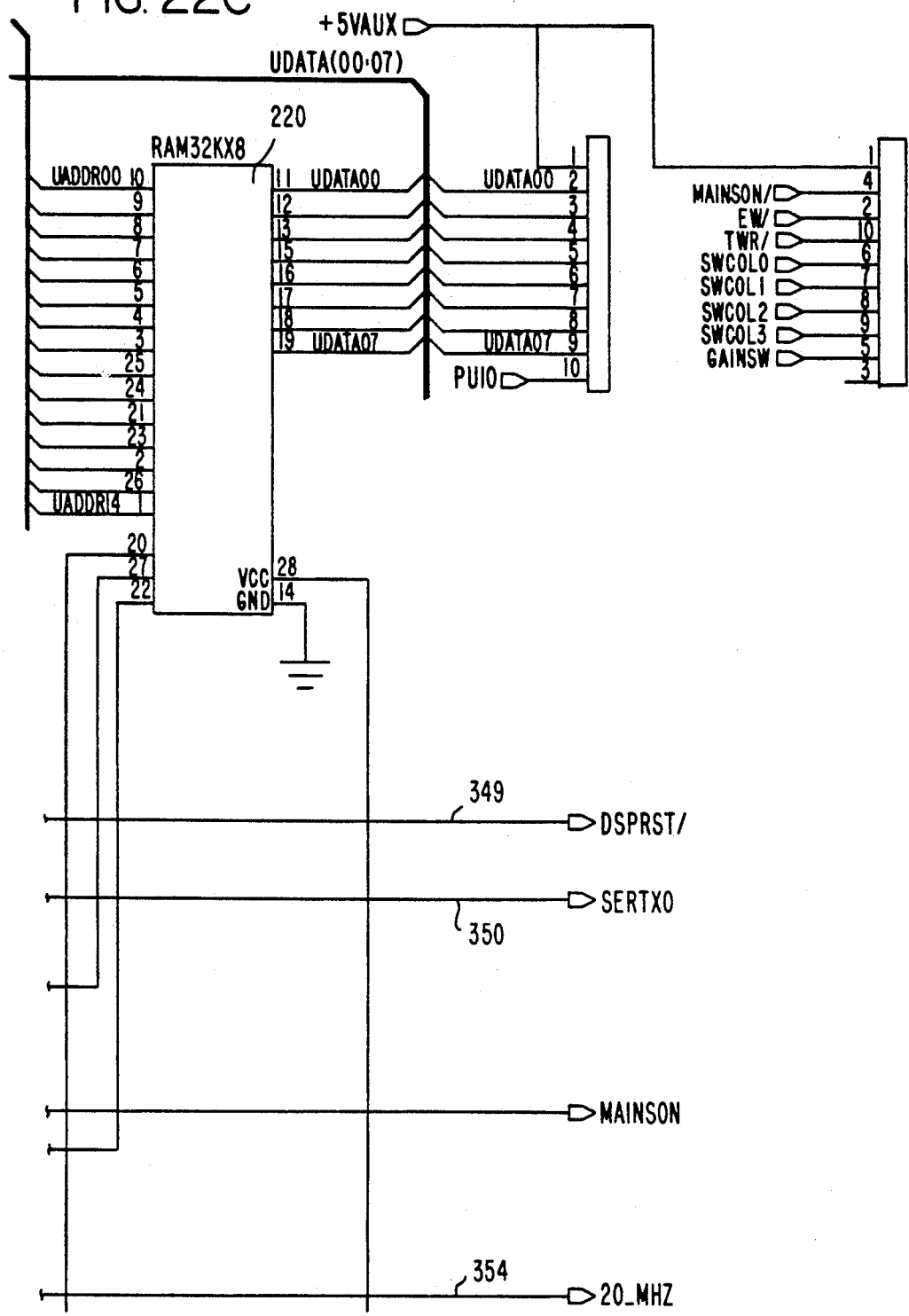
FIG. 22C of the drawings is a portion of a schematic circuit diagram illustrating the CPU, ROM and RAM components of the digital board.

FIGS. 22A, 22B and 22C of the drawings together comprise a schematic circuit diagram illustrating the CPU, ROM and RAM components of digital board 102. CPU 215 shown in the present embodiment of the invention is a Signetics/Phillips microcontroller 80C552. CPU 215 generates multiplexed address and data on data bus 201 which is latched to address buffer 340 when ALE signal 480 from microcontroller 215 is on its falling edge, otherwise it is considered data. ROM 222 is used in its always enable mode. Therefore, the reading of the chip is controlled solely by signal 217 from microcontroller 215. When 217 is low, the ROM is enabled on to data bus 201, otherwise the output remains in a high-impedance condition. Control of the ROM is accomplished through its output enable signal which allows access time to the ROM to be reduced by 40%, allowing the present invention to use slower and therefore less expensive ROM packages. RAM 220 is controlled in a manner similar to ROM 222. However, due to the degradable nature of the data, the RAM is supported by the auxiliary +5 VAUX power supply which is attached through various logic circuitry to protect the user selectable parameters which need to be preserved during power down or power disconnection. The most significant bit of address bus 218 is used to distinguish between SRAM and external input/output port locations. Data coming off of both the SRAM 220 and ROM 222 is fed on to data bus 201 for use in various components. Microcontroller 215's output outputs 415 control the digital audio multiplexer 209. These signals are determined by software based upon input data from the switch matrices shown in FIGS. 16 and 19.

Figure 23:
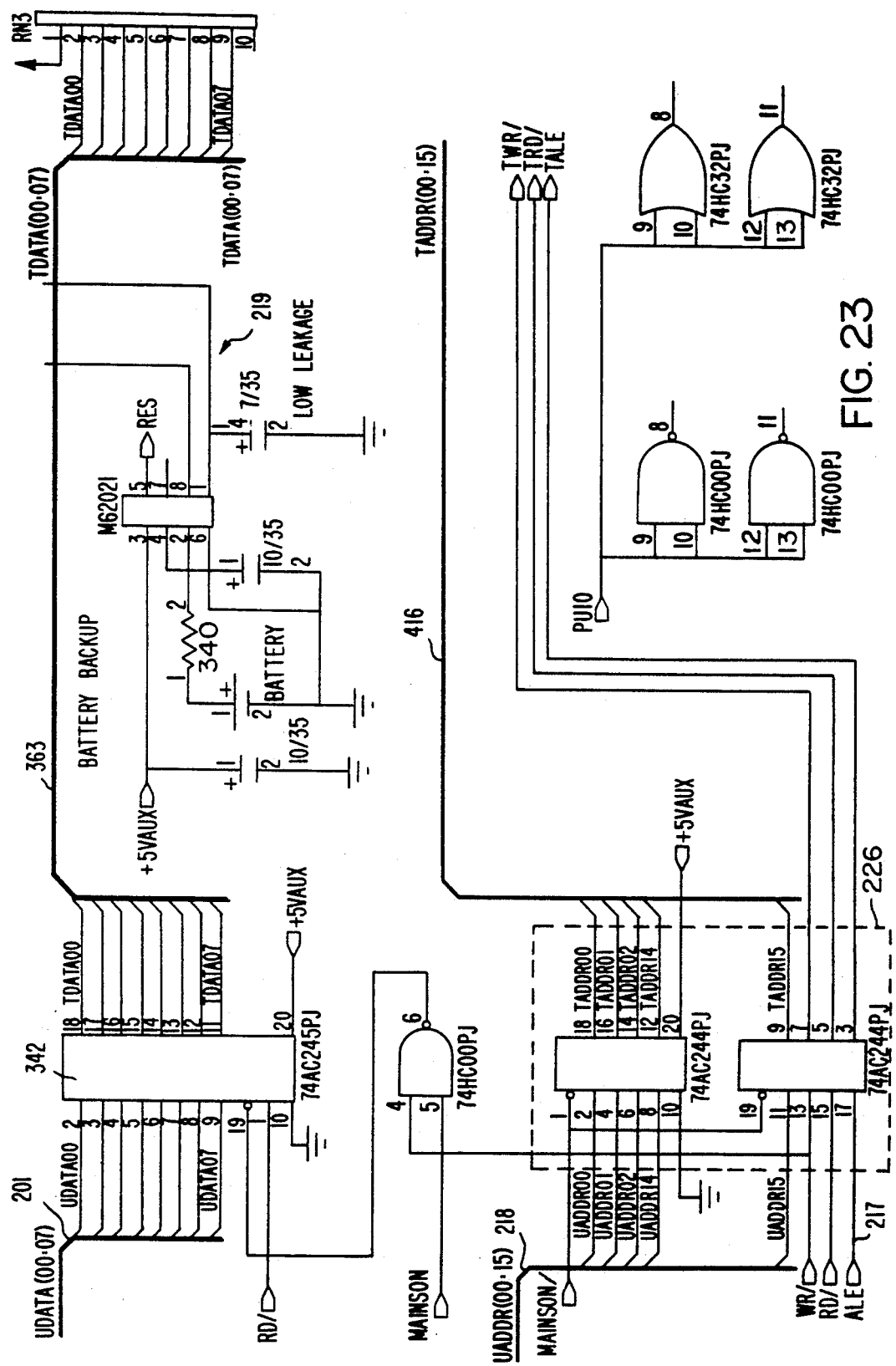
FIG. 23 of the drawings is a schematic circuit diagram illustrating the battery backup, the auxiliary 5 V supply source and the address buffer for the digital board.
Figure 24A:
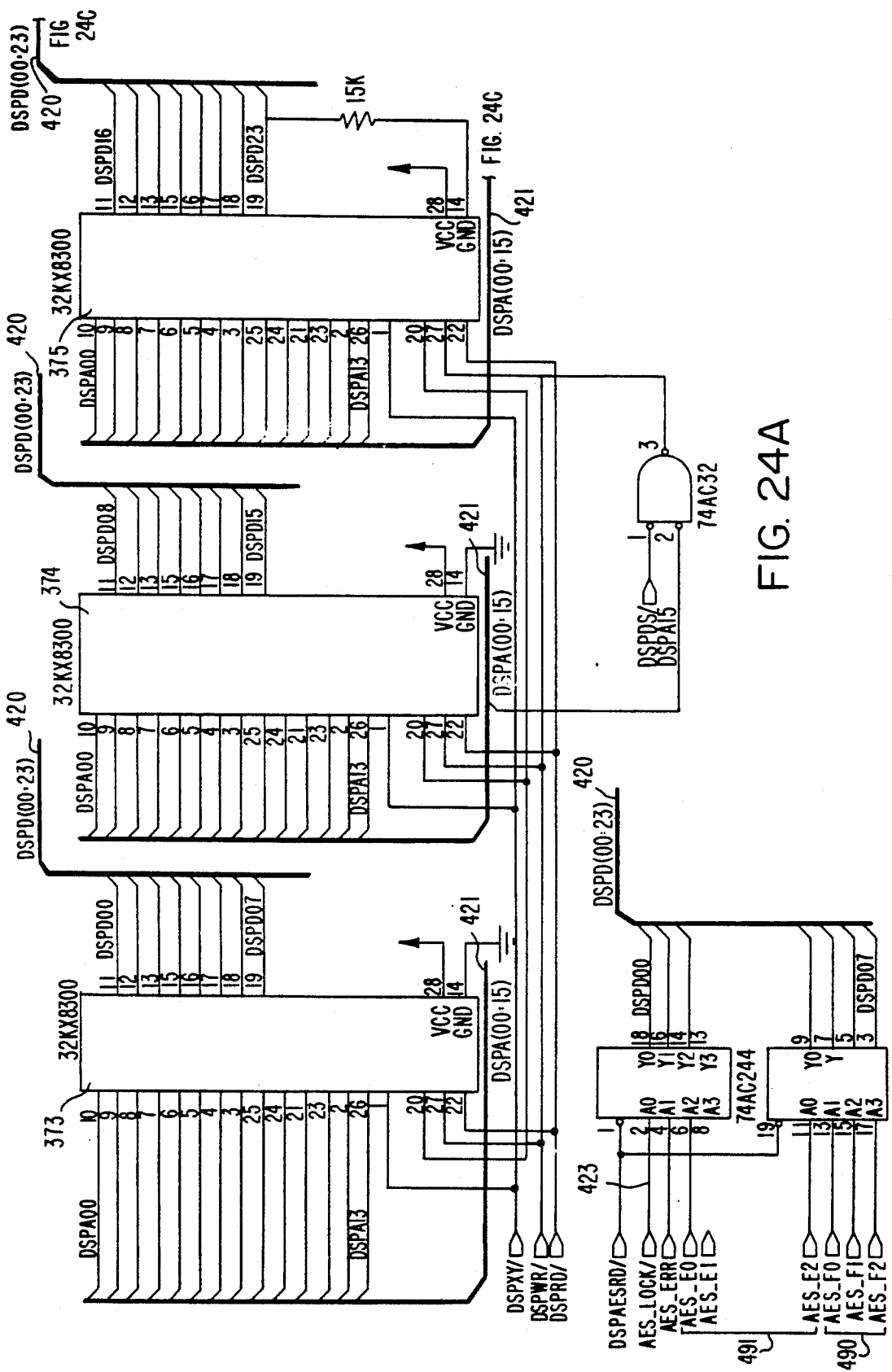
FIG. 24A of the drawings is a portion of a schematic circuit diagram illustrating the digital signal processing integrated circuit and associated memory and framing GAL on the digital board.
Figure 24B:
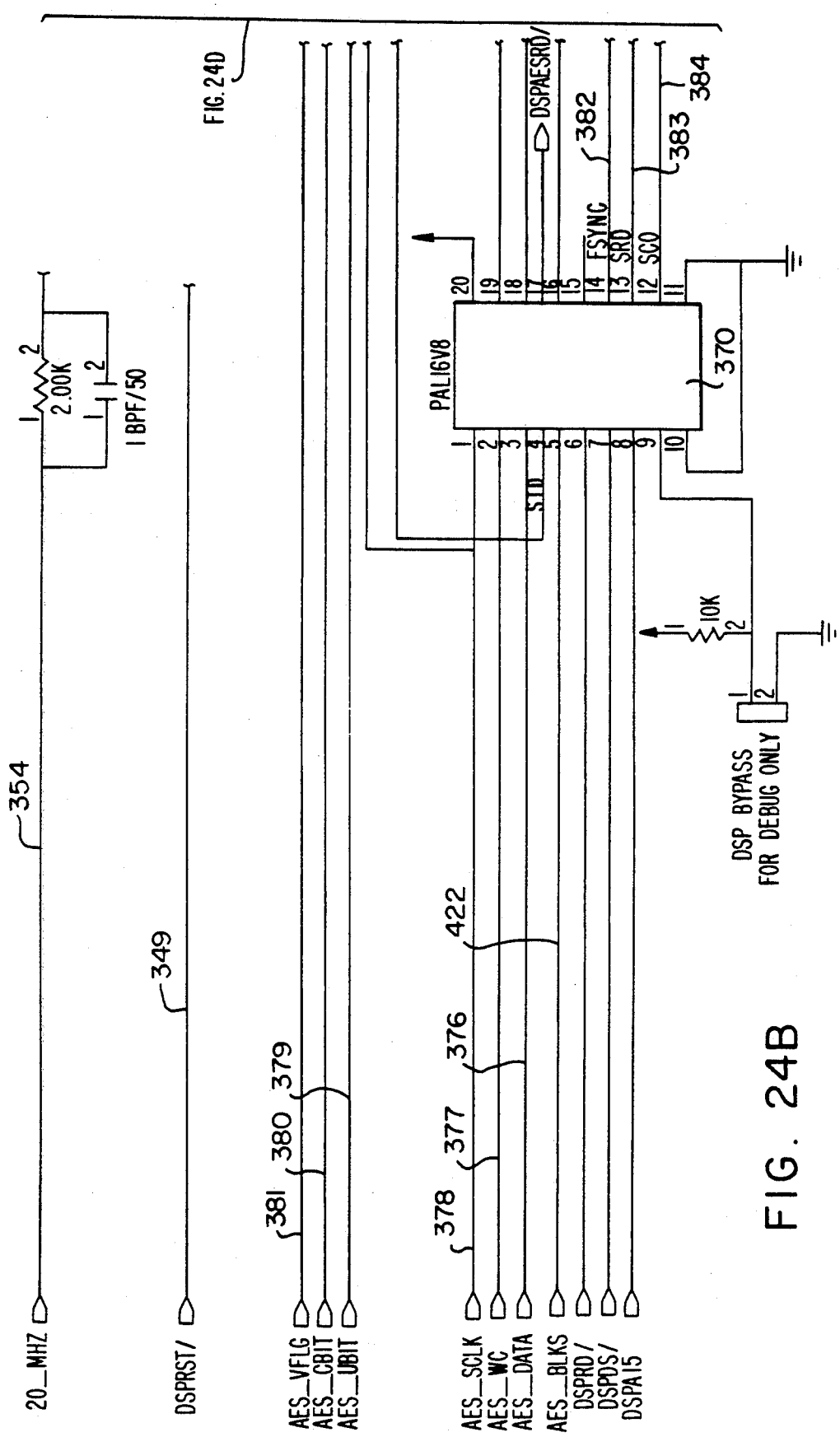
FIG. 24B of the drawings is a portion of a schematic circuit diagram illustrating the digital signal processing integrated circuit and associated memory and framing GAL on the digital board.
Figure 24C:
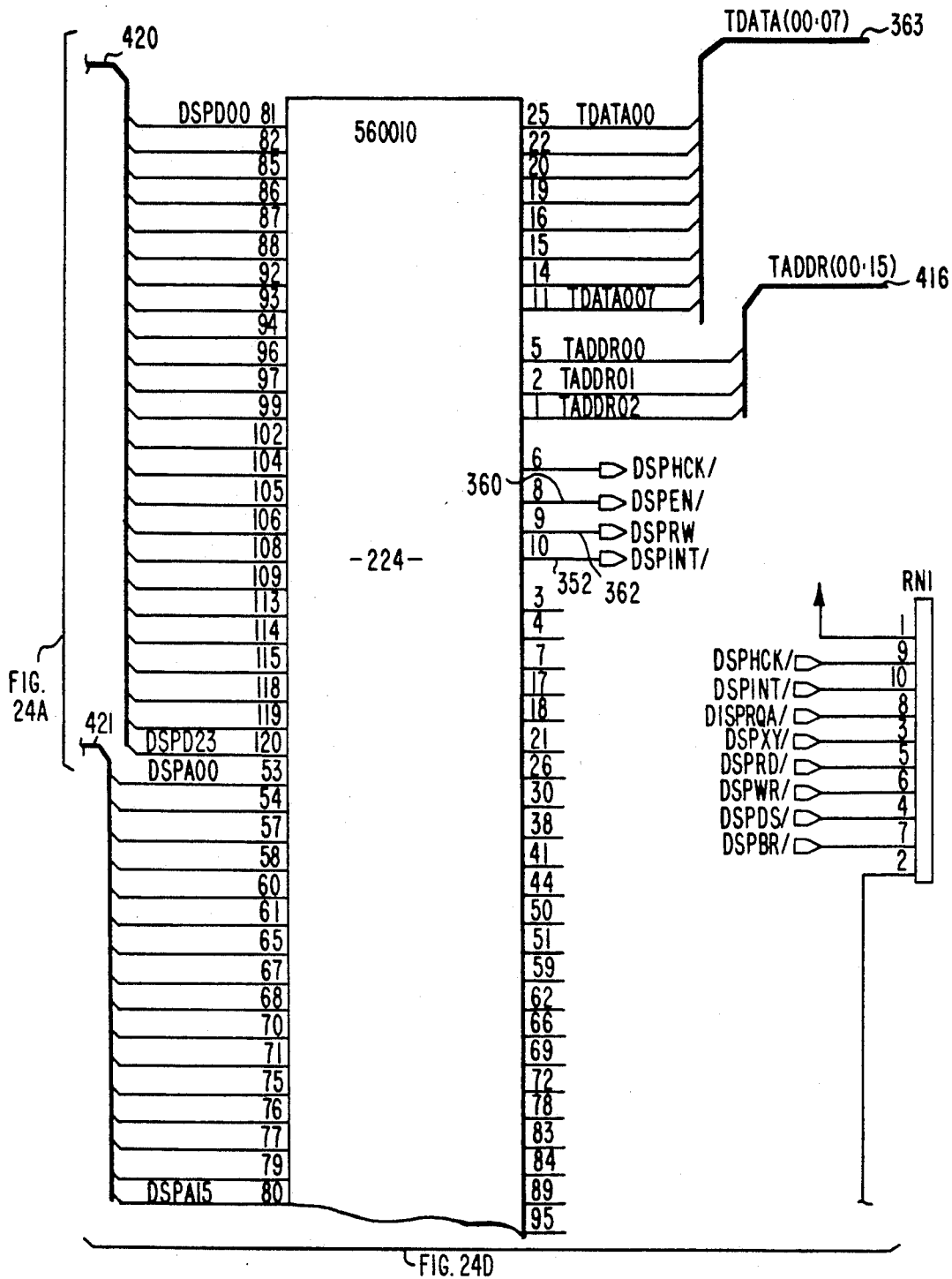
FIG. 24C of the drawings is a portion of a schematic circuit diagram illustrating the digital signal processing integrated circuit and associated memory and framing GAL on the digital board.

FIG. 23 of the drawings is a schematic circuit diagram illustrating the battery backup and auxiliary +5 V supply source 219 which is implemented using a standard chip, low leakage capacitor and a current limiting resistor for SRAM 222 shown in FIG. 22B. Also shown is the circuitry for transceiver 342 and tri-state buffer 226, both of which buffer data from data bus 201 and address bus 218 placing it onto tri-stated T-data bus 363 and T-address bus 416.

FIGS. 24A, 24B, 24C and 24D of the drawings together comprise a schematic circuit diagram illustrating the digital signal processing chip 224, associated memory 373-375 and frequency synchronization circuitry 370 of digital board 102. DSP 224 is driven by 20 MHzCLK signal 354 generated on digital board 102. 20 MHzCLK 354 is buffered by a transistor to protect DSP 224 when the +5 V supply is turned off. DSP 224 is reset by DSPRST signal 349 which is generated by microcontroller 215.

Figure 25A:
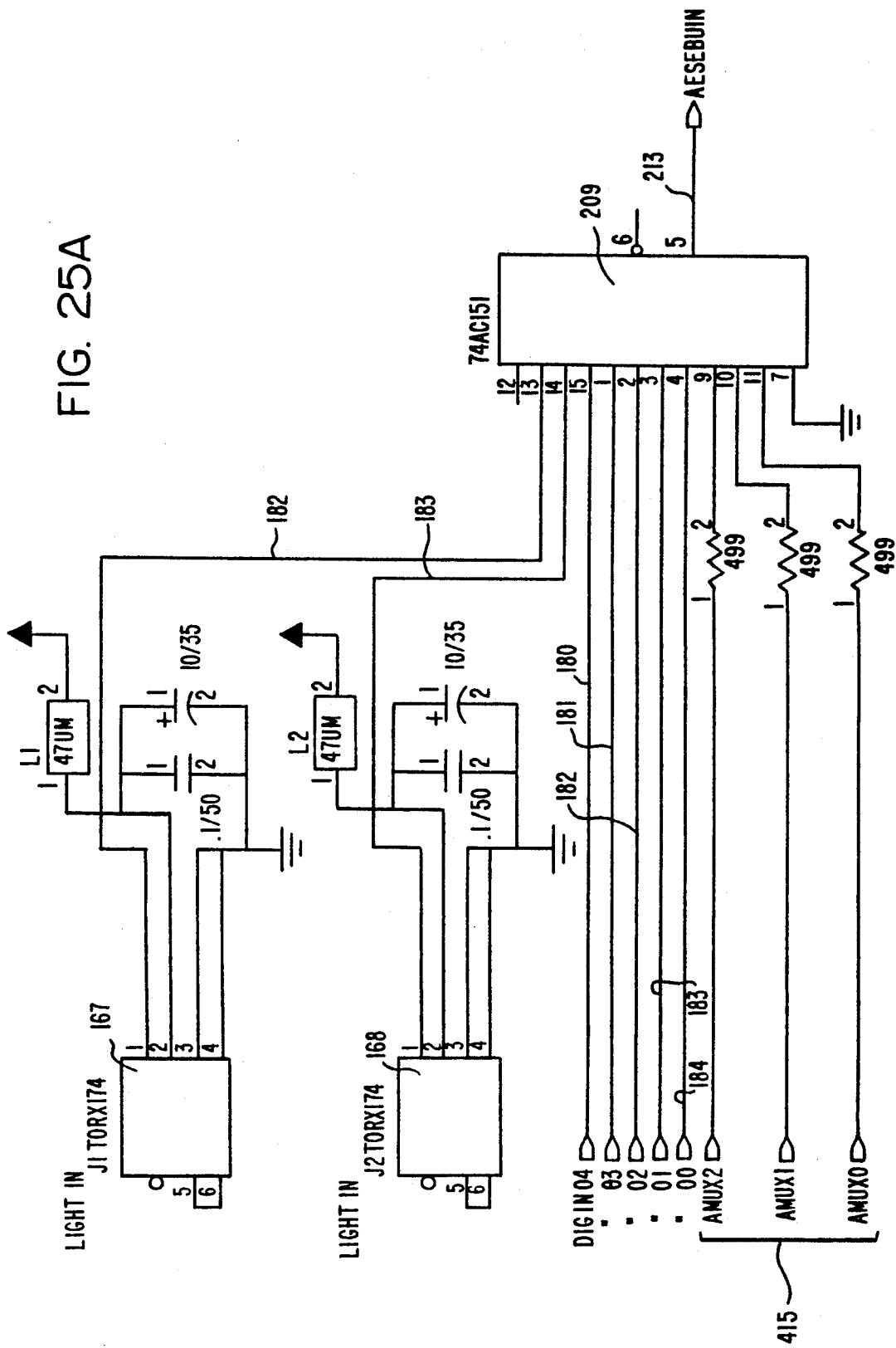
FIG. 25A of the drawings is a portion of a schematic circuit diagram illustrating the audio signal selection multiplexer/digital interface, the digital audio interface receiver and the interface-CPU status register of the digital board.
Figure 25B:
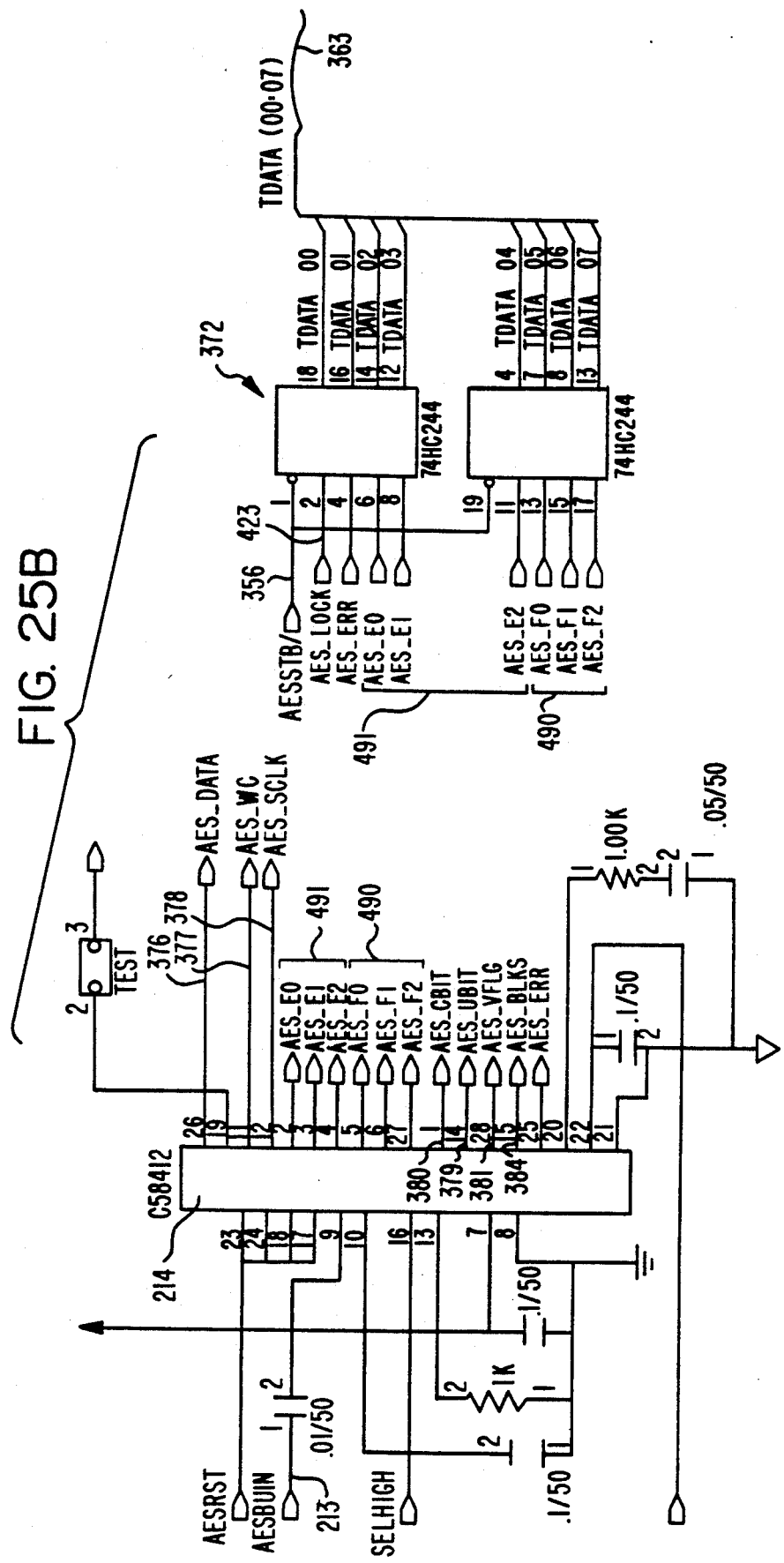
FIG. 25B of the drawings is a portion of a schematic circuit diagram illustrating the audio signal selection multiplexer/digital interface, the digital audio interface receiver and the interface-CPU status register of the digital board.

FIGS. 25A and 25B of the drawings together comprise a schematic circuit diagram illustrating audio signal selection multiplexer/digital interface 209, digital audio interface receiver 214 and digital audio interface receiver-CPU status register 372 on digital board 102. "TOSLINK" decoders 167 and 168 decode optical input-1 and optical input-2 shown on FIG. 4 resulting in digital audio inputs 182 and 183 which are fed along with digital audio signals 180, 181, 182, 183 and 184 into digital audio multiplexer 209. The user-selected input selection switch is encoded by microcontroller 215 into multiplexer select code 415 which operably connects one of the digital audio signals to multiplexer-output 213 for processing in digital audio interface receiver 214.

Digital audio interface receiver 214 searches multiplexer-output 213 for landmarks in incoming digital audio signal 101 such as channel status (CBIT), error codes, and sampling rate. Once digital audio signal 101 is located, parsed and on-board PLL 320 (shown in FIG. 7) matches the incoming sampling rate, digital audio interface receiver 214 shifts out the digital audio word, AES_DATA 376, in serial clocked by AES_SCLK 378 and sends out incoming sampling rate, AES_WC 377, to main PLL 389 on analog board 106. The beginning of each channel status block is flagged by AES_BLKS 384 as a signal to DSP 224.

Digital audio interface receiver-CPU status register 372 is comprised of tri-state buffers which transmit digital audio interface receiver 214's status on T-data bus 363 when microcontroller 215 signals the need for digital audio interface receiver status data. Digital audio interface receiver 214 monitors whether it has locked on the incoming sampling rate, AES_LOCK 423, encodes sampling rate 490 and 3-bit encoded error code 491 which is later decoded by microcontroller 215.

Figure 26A:
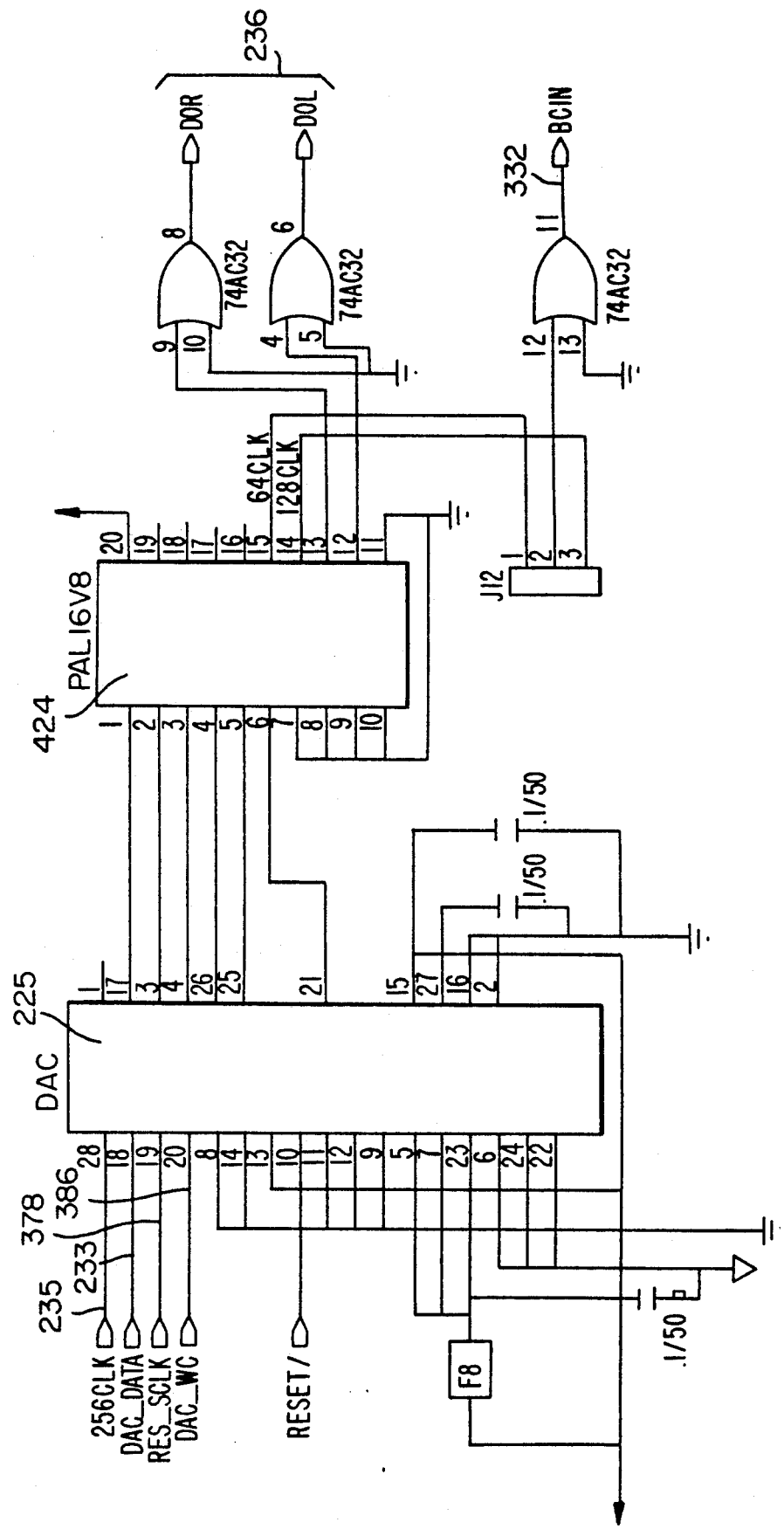
FIG. 26A of the drawings is a portion of a schematic circuit diagram illustrating the delta-sigma modulator, decoding GAL and reset circuitry of the digital board.
Figure 26B:
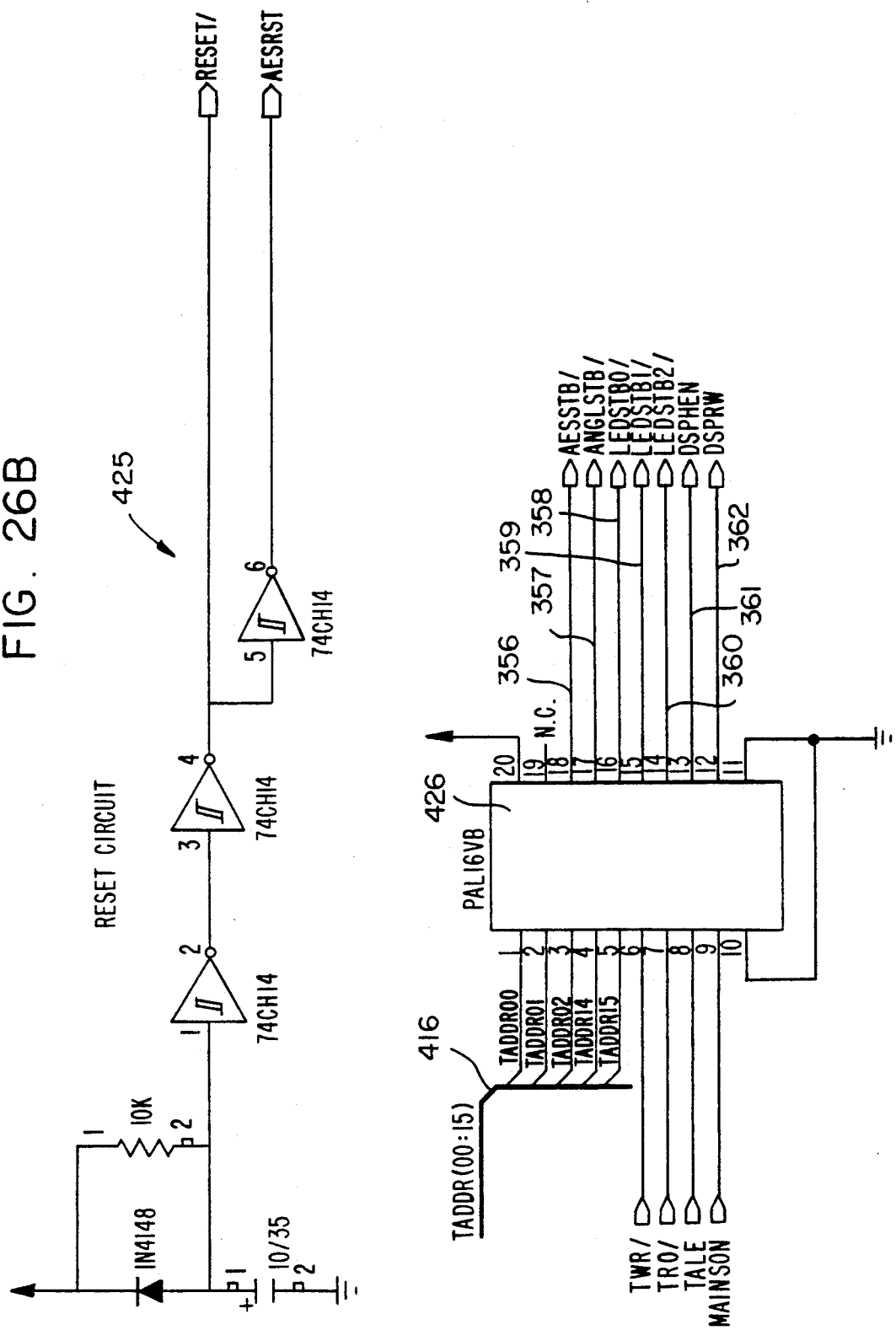
FIG. 26B of the drawings is a portion of a schematic circuit diagram illustrating the delta-signal modulator, decoding GAL and reset circuitry of the digital board.

FIG. 26A and 26B of the drawings together comprise a schematic circuit diagram illustrating the delta-sigma modulator 225, decoding PAL 424 and reset circuitry 425 of digital board 102. Delta-sigma modulator 225 shifts in, at AES_SCLK 378 rate, DSP digital audio output 233 which has been dithered to an 18-bit format, balanced, attenuated in the digital domain and phase inverted (where desired) by DSP 224. Delta-sigma modulator 225 upsamples DSP digital audio output 233 by 128 times the incoming sampling rate 386. This conversion is referred to as "noise-shaping." Digital audio data 233 feeds into an 8 times oversampling interpolation filter which generates 7 intermediate sample values between each of the incoming samples by use of a large finite impulse response (FIR) filter, resulting in digital audio data at 8 times DAC_WC 386. This data is then fed into a delta-sigma modulation circuit which operates at 16 times the oversampled data rate for a total oversamplinq ratio of 128. This modulator circuit uses a fifth-order noise-shaper, which allows reduction of the word size down to a single bit per channel with each bit being available at 128 times DAC_WC 386. By shaping the resultant quantization noise spectrum such that the audio band has a minimal amount, at the expense of large amount of out-of-band noise. DSM digital audio data 236 and its associated clock 332 are optocoupled to the audio data paths shown in FIG. 6. DSM_clock 332 is used by shift register circuit 286 also shown in FIG. 6.

Reset circuit 425 is a standard RC circuit and is buffered by a number of inverting Schmitt triggers providing a low noise sharp edged signal which is fed to the digital-to-analog converter and the digital audio interface receiver 214.

Figure 27:
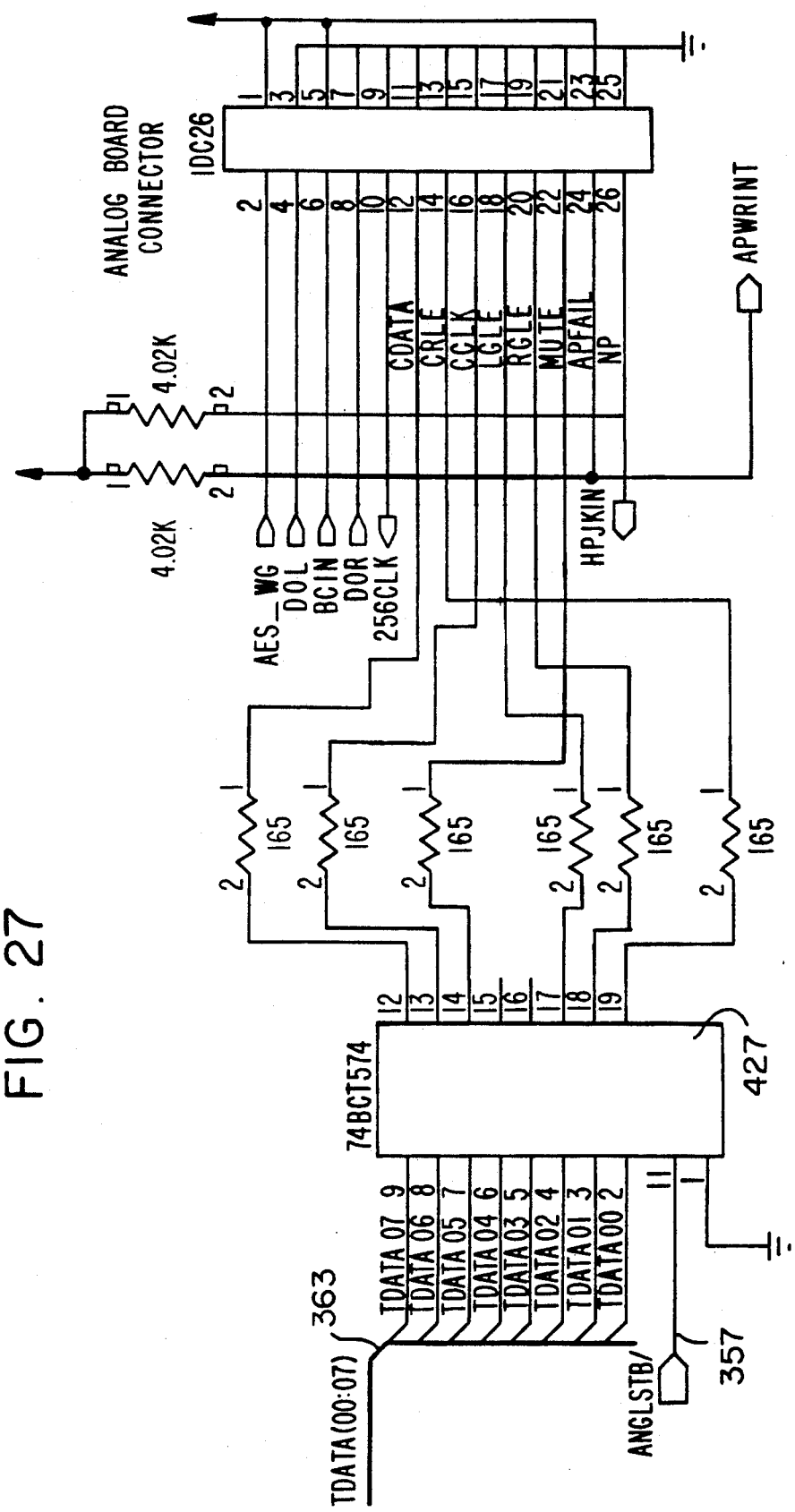
FIG. 27 of the drawings is a schematic circuit diagram of the analog latch of the digital board.

FIG. 27 of the drawings is a schematic circuit diagram of analog latch 427 of digital board 102. The analog latch is used to transmit gain and control information to analog board 106. CDATA 237 is the serial control information in analog latch 427 for analog board 106, along with CCLK and the three latch enable signals which are multiplexed onto T-data bus 363 when enabled by microcontroller 215.

Figure 28:
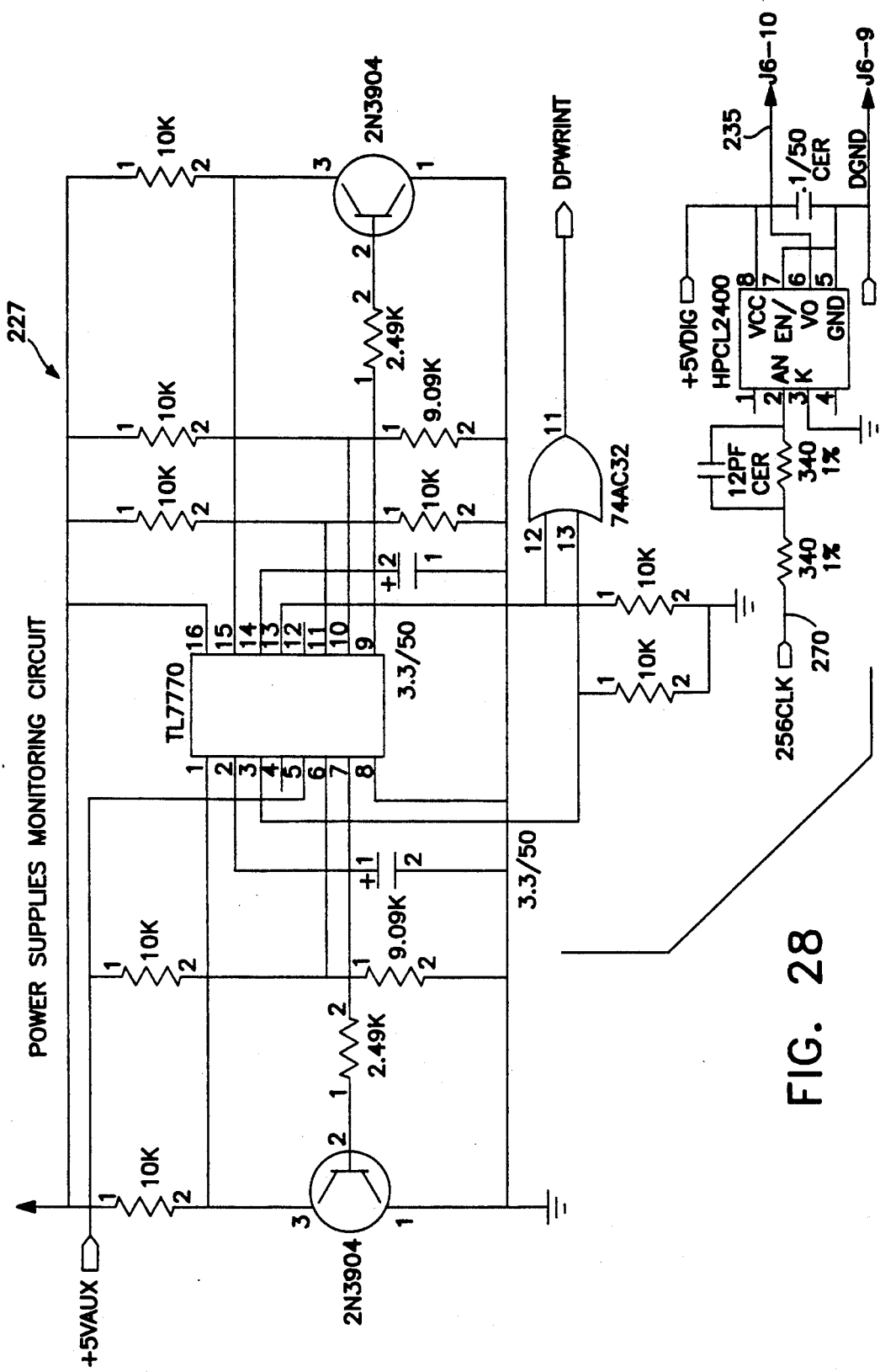
FIG. 28 of the drawings is a schematic circuit diagram of the power supply monitoring circuit of the digital board.

FIG. 28 of the drawings is a schematic circuit diagram of the power supply monitoring circuit 227 of digital board 102. Monitoring circuit 227 monitors the +5 V and +5 VAUX for both under and over voltage conditions and generates interrupts to microcontroller 215 if either condition occurs.

Figure 29A:
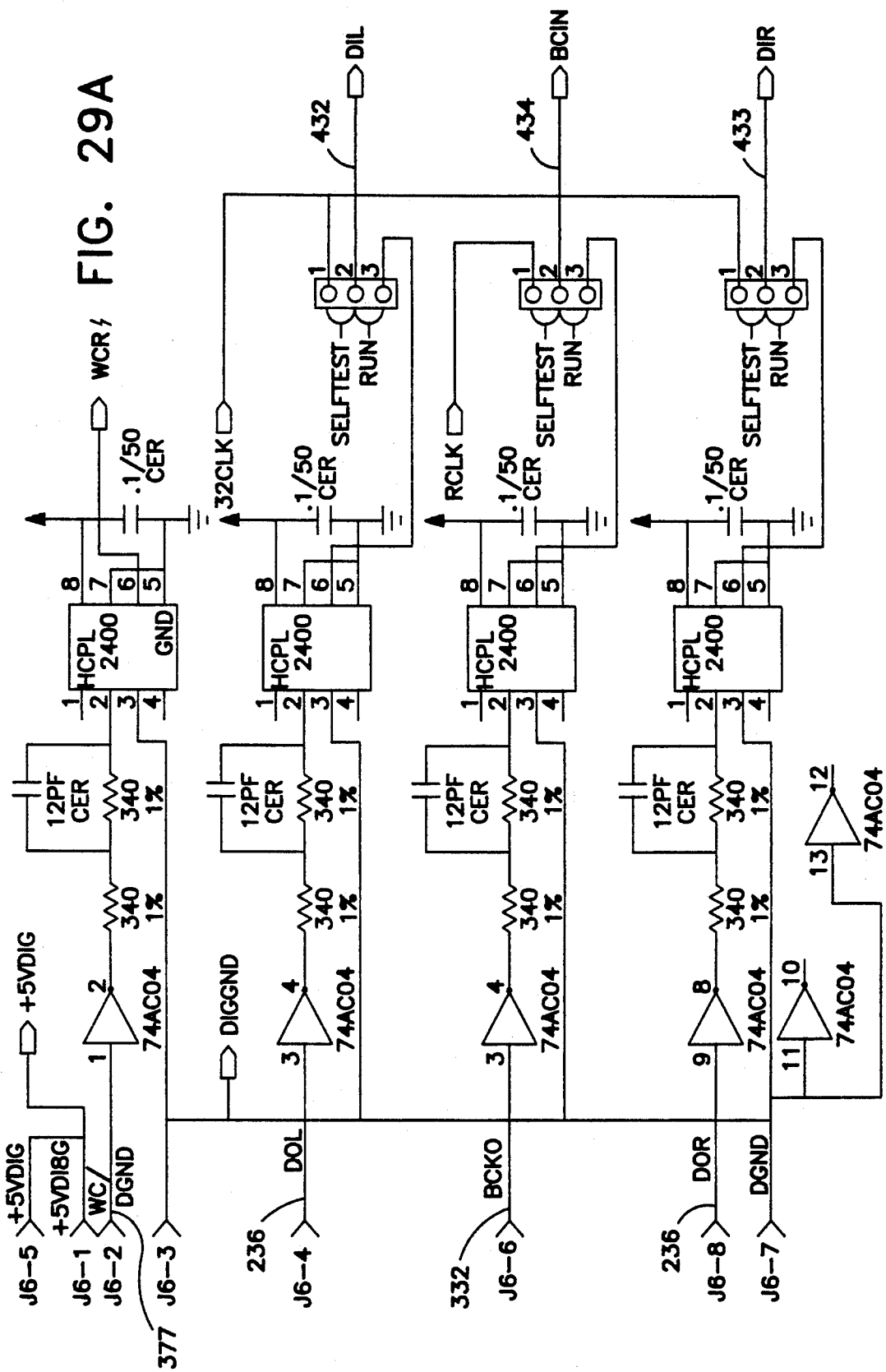
FIG. 29A of the drawings is a portion of a schematic circuit diagram illustrating the optocouplers located on the analog board which provide an interface between the digital board and the analog board.
Figure 29B:
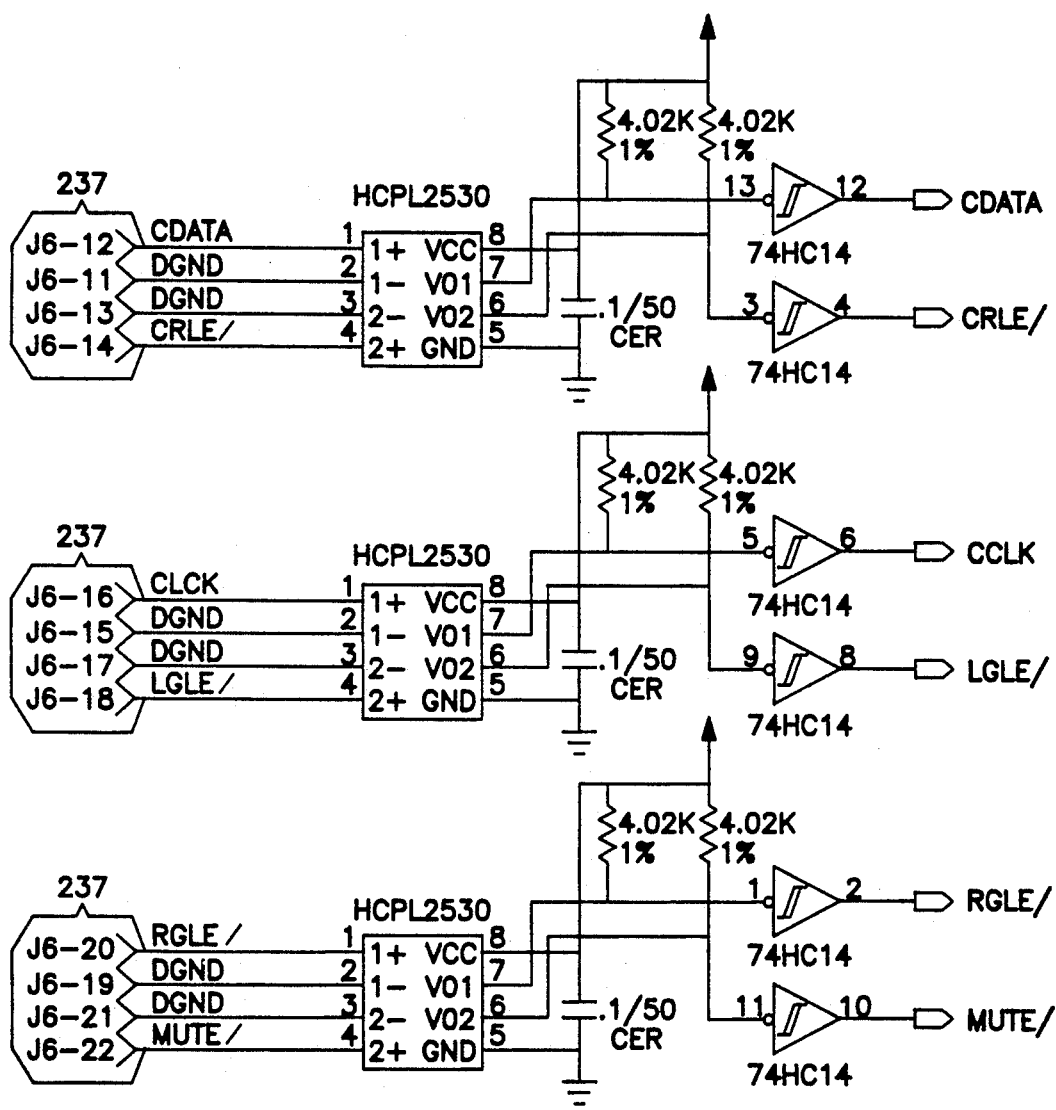
FIG. 29B of the drawings is a portion of a schematic circuit diagram illustrating the optocouplers located on the analog board which provide an interface between the digital board and the analog board.
Figure 29C:
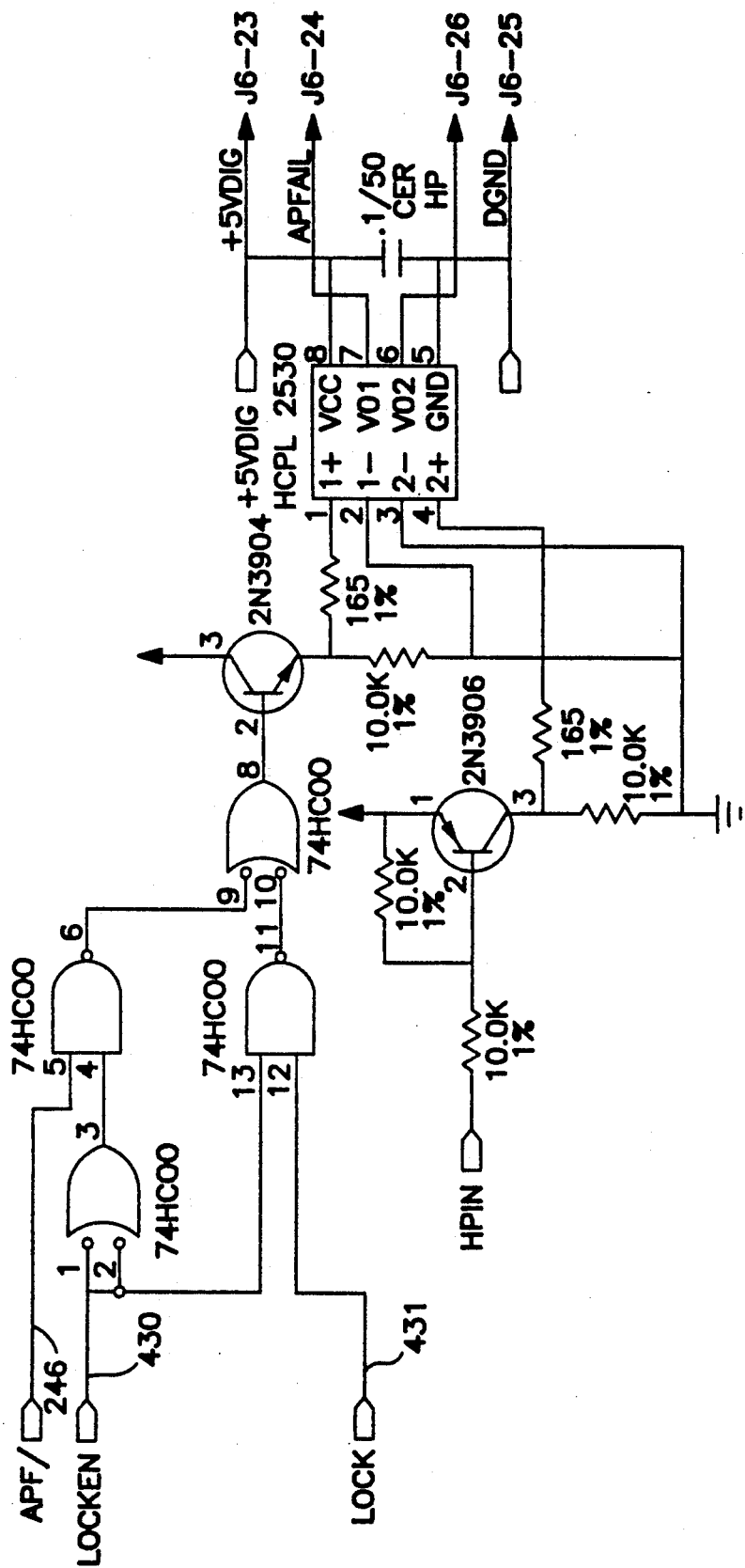
FIG. 29C of the drawings is a portion of a schematic circuit diagram illustrating the optocouplers located on the analog board which provide an interface between the digital board and the analog board.

FIGS. 29A, 29B and 29C of the drawings together comprise a schematic circuit diagram illustrating optocouplers 293, 294, 295, 296 and 297 on analog board 106. There are actually two types of optocouplers in the disclosed embodiment of the invention: high-speed single optocouplers and low-speed dual optocouplers. The function of the optocouplers is to transmit the signals between digital board 102 and analog board 106 while isolating the relatively noisy digital board supplies from the analog circuitry. Most signals travel from the digital board 102 to analog board 106 with the exception of APFAIL 238 which indicates analog board voltage power failure and 256CLK 235 generated by PLL 289. The additional transistors shown with APFAIL optocoupler 297 are used to increase current drive to LED's internal to optocoupler 297.

Figure 30A:
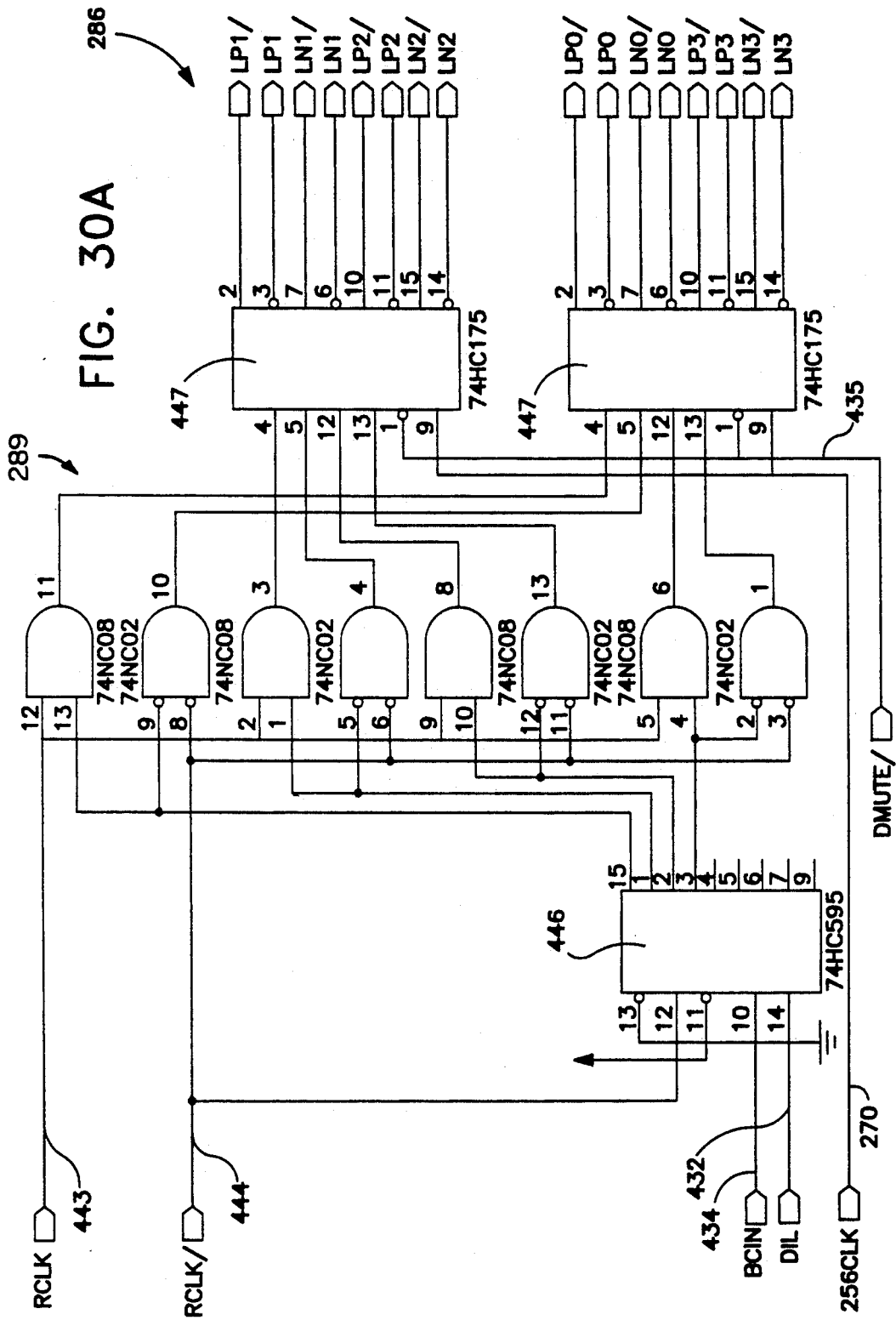
FIG. 30A of the drawings is a portion of a schematic circuit diagram of the return-to-zero and of the analog board.
Figure 30B:
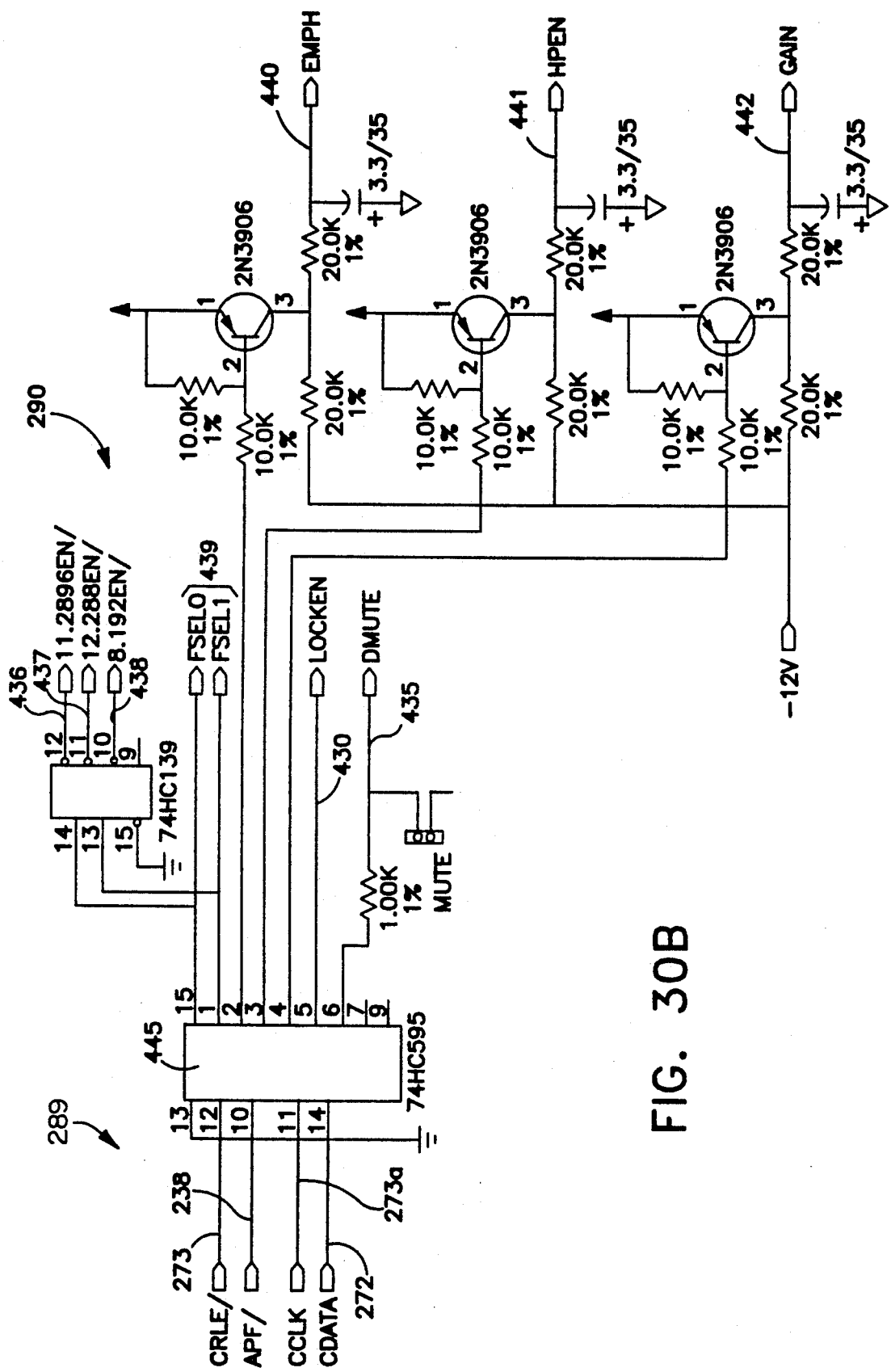
FIG. 30B of the drawings is a portion of a schematic circuit diagram of the return-to-zero and of the analog board.
Figure 30C:
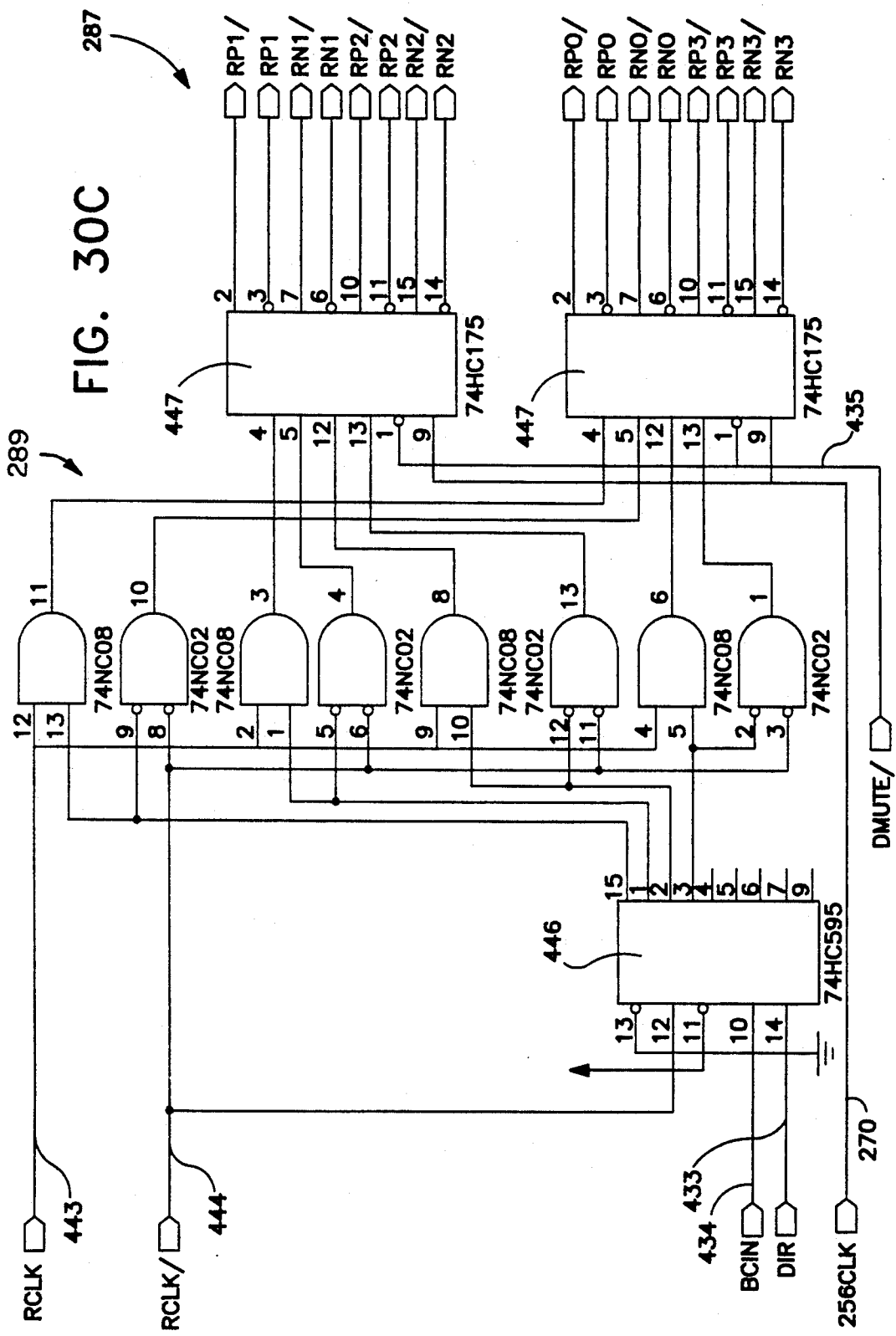
FIG. 30C of the drawings is a portion of a schematic circuit diagram of the return-to-zero and of the analog board.

FIGS. 30A, 30B and 30C of the drawings together comprise a schematic circuit diagram of the left and right channel return-to-zero circuits 286 and 287 and control register 290 of analog board 106. DIL 432 is fed into shift register 446 which shifts in the serial digital audio data 432 at the upsample clock rate 434. The first four outputs of shift register 446 are each separately AND'ed with both RCLK 443 and RCLK/444, the complement of RCLK/443, using four AND gates and four inverted input AND gates (NOR gates). The result of the logic operation is to hold any bit of data for half the bit cell period, thereby performing a return-to-zero function. This data is reclocked using low jitter clock 270 by latch 447 for use in digital-to-analog converter 282.

Control register 290 consists of serial-to-parallel latch 445 which accepts serial transmission of analog board control data 272 at rate of CCLK 273a. The control data available includes sample rate bits 439; emphasis/440 signaling a pre-emphasized source and thus enabling the de-emphasis circuitry from digital audio interface receiver 214; HPEN/441 enabling headphone output, and gain 442 causing audio outputs to be reduced in level by 10 dB from microcontroller 215. The sample rate signal 439 is decoded into enable signals 436, 437 and 438 enabling one of the three separate oscillators in PLL 289.

Figure 32A:
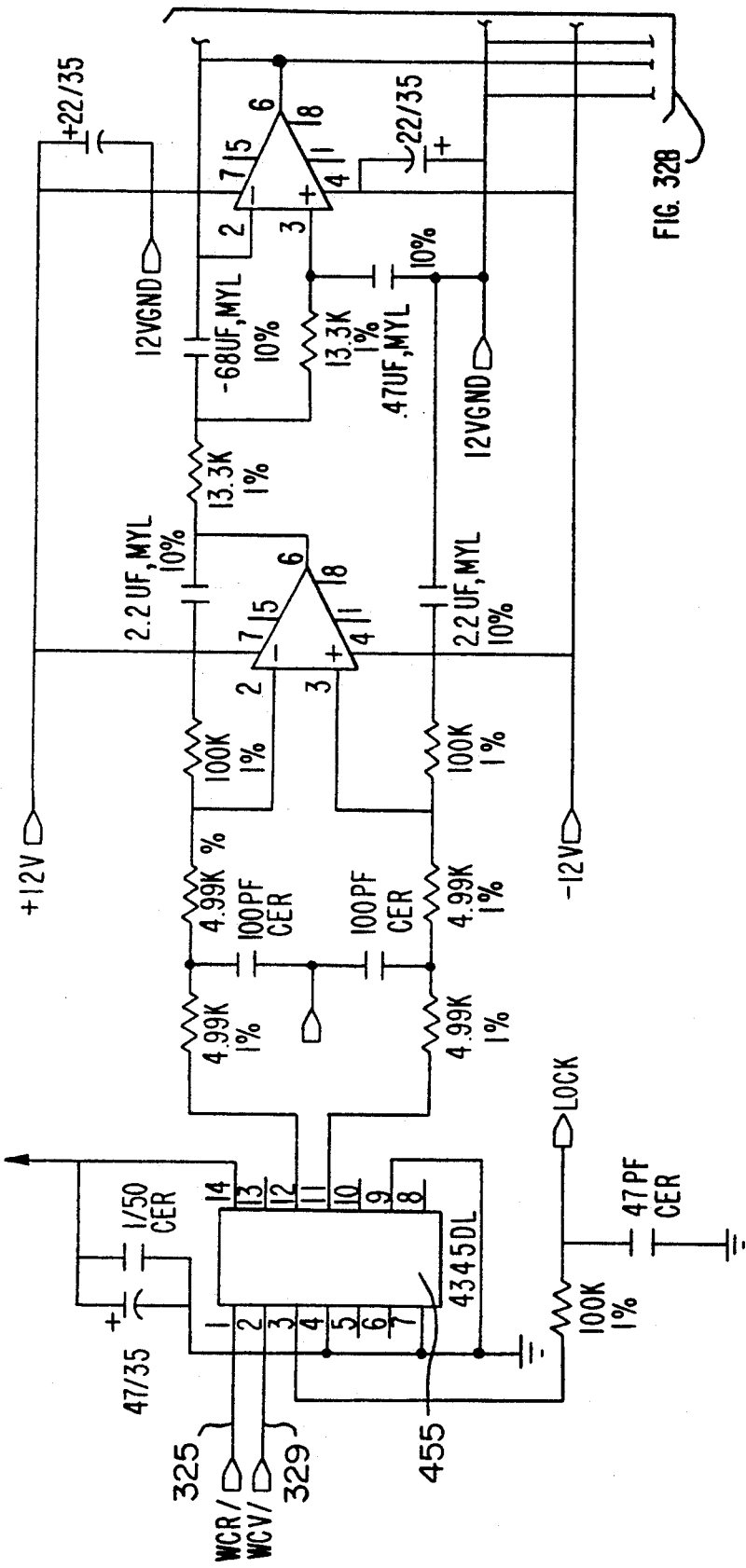
FIG. 32A of the drawings is a portion of a schematic circuit diagram of the main phase lock loop located on the analog board.
Figure 32B:
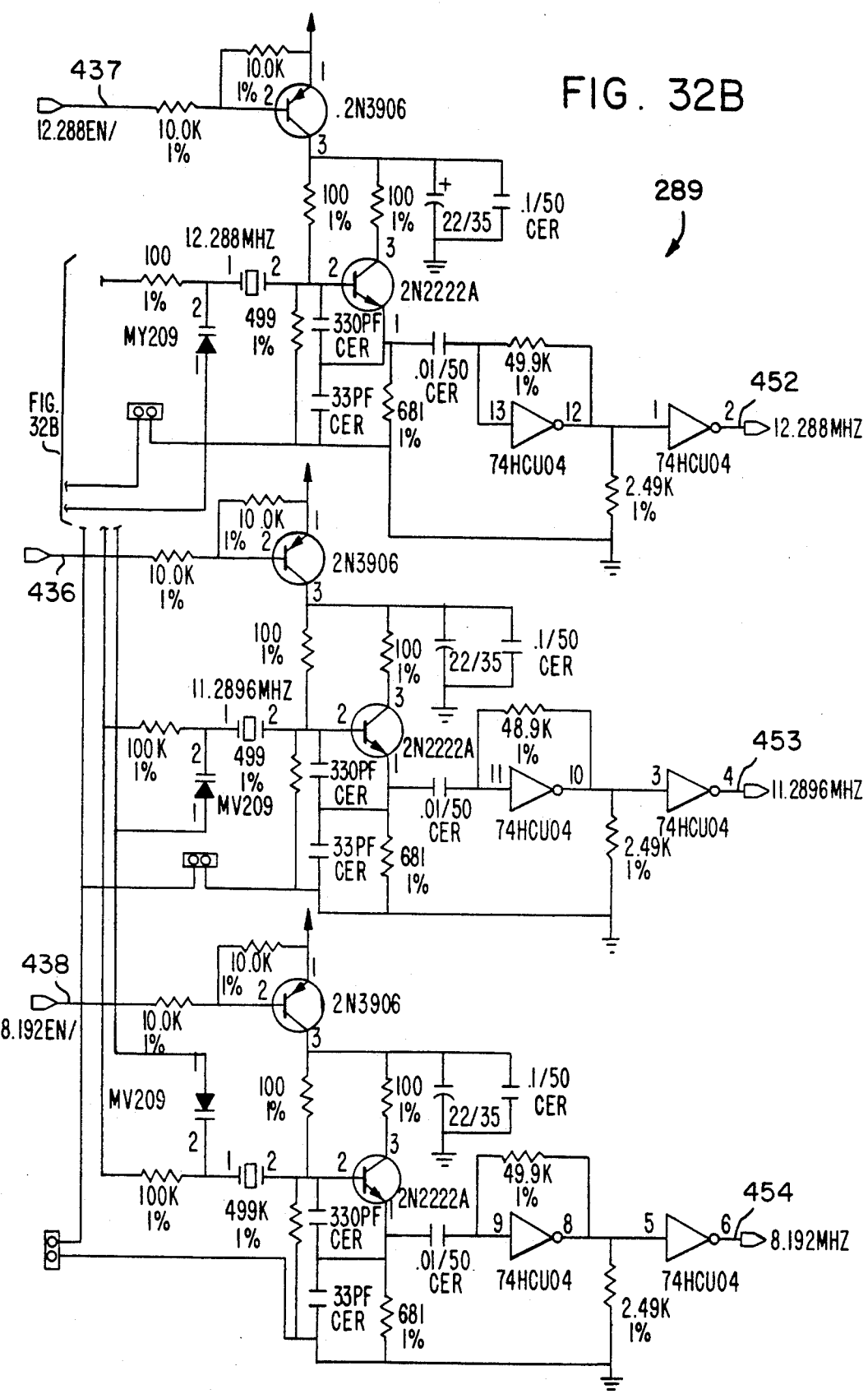
FIG. 32B of the drawings is a portion of a schematic circuit diagram of the main phase lock loop located on the analog board.

FIGS. 32A and 32B of the drawings together comprise a schematic circuit diagram of the phase lock loop (PLL) 289 of analog board 106. This is the main PLL for apparatus 100 which creates a low-jitter clock for digital-to-analog converter 282 based on sampling rate clock 325 determined by PLL 320 embedded in digital audio interface receiver 214 (as shown in FIG. 7) from digital audio input 101. PLL 289 is a frequency multiplying type, taking the sample rate clock at 32 KHz, 44.1 KHz or 48 KHz and generating a phase synchronized clock at 256 times the incoming frequency. Unlike most PLL's, which consist of a phase comparator, a loop filter, a VCO (voltage controlled oscillator) and a divider; PLL 289 incorporates three voltage controlled oscillators, each utilizing a quartz crystal tuned to one of the three output frequencies. Each separate PLL is isolated by PNP transistor controlled by 12 MHz enable 437, 11 MHz enable 436 and 8 MHz enable 438 respectively to cut off supply voltages to inactive circuits extinguishing any noise other than the minimal noise generated by the appropriate crystal oscillator.

Incoming digital audio sampling rate clock 325 feeds one reference input of phase comparator 455, a high speed CMOS edge triggered device (therefore insensitive to duty cycle) with complimentary outputs. These outputs then enter a differential loop filter built around a precision, low bias-current opamp. The characteristics of the loop filter are very low bandwidth (in the disclosed embodiment, it is about 3 Hz) with an over-damp response (in the disclosed embodiment, the damping factor approaches 2). The low-band width of the filter will ensure that any incoming clock jitter is heavily filtered.

The loop filter is followed by a 2nd order Sallen-key low-pass filter which in the disclosed embodiment has a cut-off frequency of 16 Hz. This filter has a Bessel-type response which will not add any additional over-shoot during acquisition, thereby reducing the required tuning range of the voltage controlled oscillators. The filter output drives three Colpitts-type voltage controlled crystal oscillators. Each oscillator contains a varactor diode which shunts the crystal, thereby allowing voltage tuning of the oscillator frequency. These voltage controlled crystal oscillators have a much higher Q (and therefore greater noise immunity) than comparable LC type oscillators, though their "pull" or tuning range of +/−300 PPM is quite limited, but adequate for non-vary speed applications. Each oscillator is followed by a high-speed CMOS inverter configured as a linear amplifier in order to boost the roughly 500 mV peak-to-peak output level up to CMOS logic level. Another inverter section further squares-up and buffers the outputs. Intermediate outputs 452, 53, and 454, representing each possible timing multiplied by 56, are fed into multiplexer 451 (shown in FIG. 3I) which using the sample rate selector 439 enables one onto 256CLK 264. 256CLK is connected to a "divide by 256" circuit 328 implemented by counters 456 and 457, shown in FIG. 3I. Counters 456 and 457 are 10 both 4-bit synchronous counters whose outputs are reclocked by quad D flip-flop 458. Output RCLK 443 and its complement RCLK/44 is the low-jitter clock equal to the up sampling data rate which is used in return-to-zero 286. Output WCV/329 is the feedback clock which closed the loop by connecting to phase comparator 455 and is the PLL rate divided by 256.

Figure 33A:
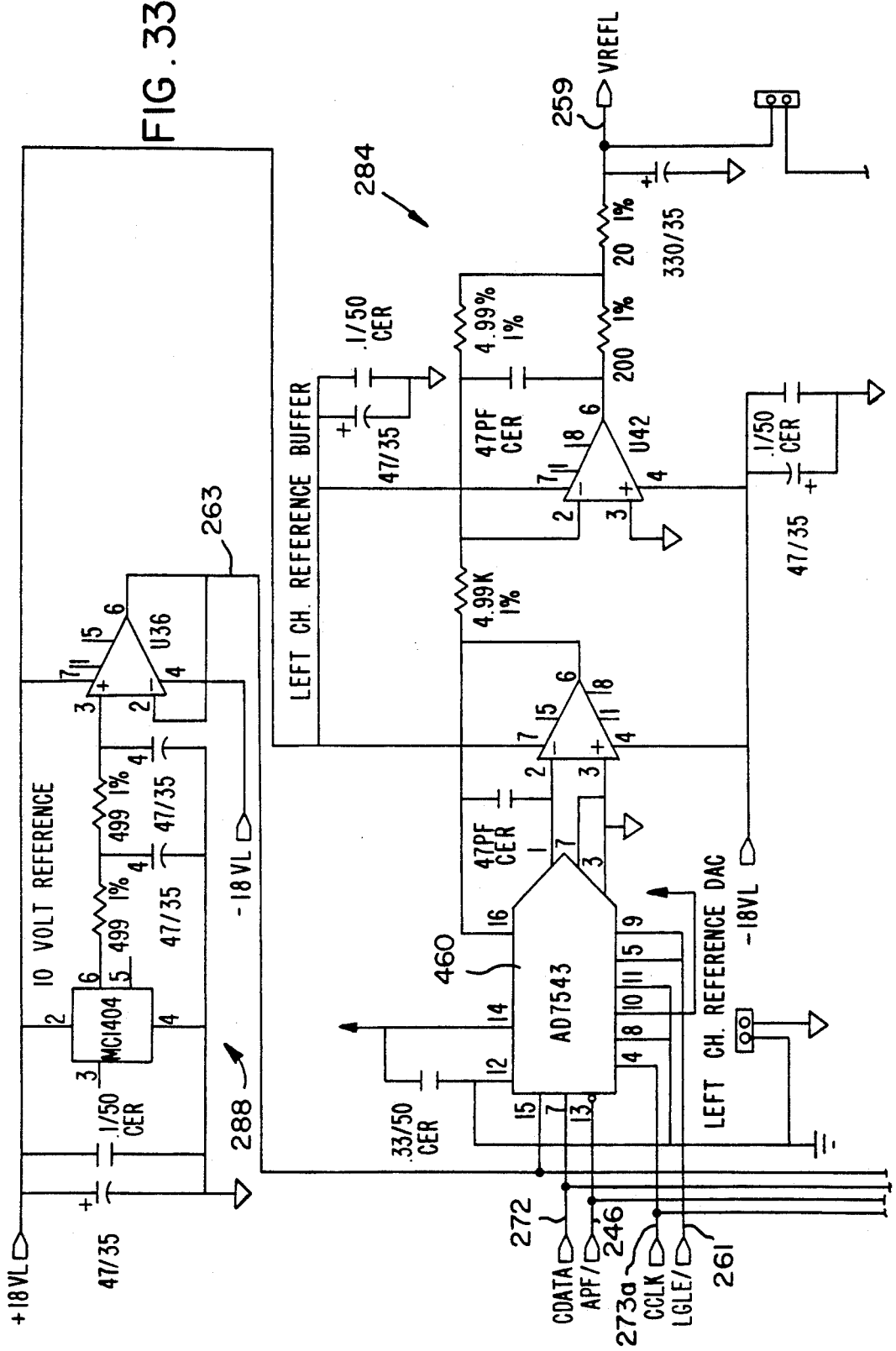
FIG. 33A of the drawings is a portion of a schematic circuit diagram of the digital-to-analog converter voltage reference circuits.
Figure 33B:
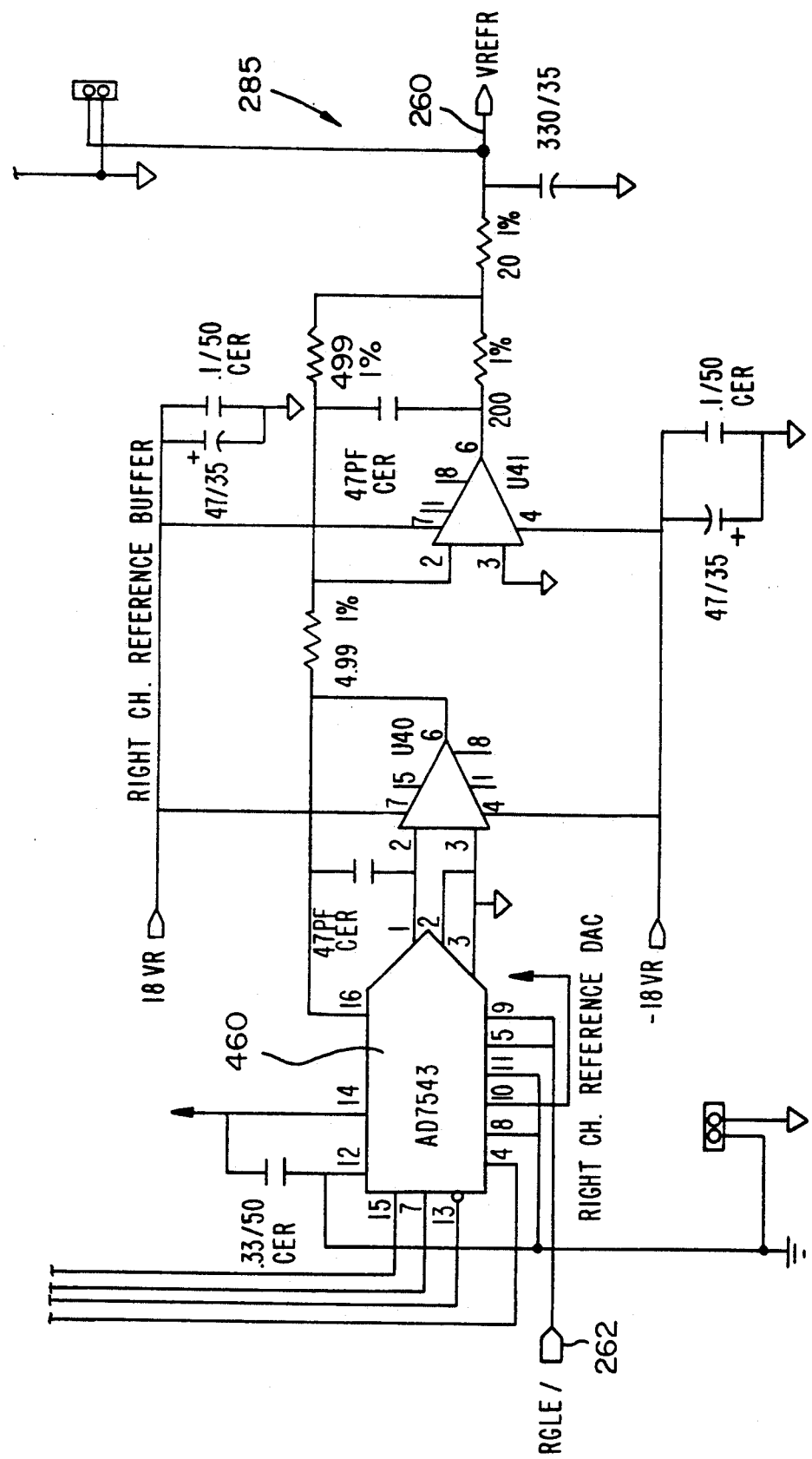
FIG. 33B of the drawings is a portion of a schematic circuit diagram of the digital-to-analog converter voltage reference circuits.
Figure 34A:
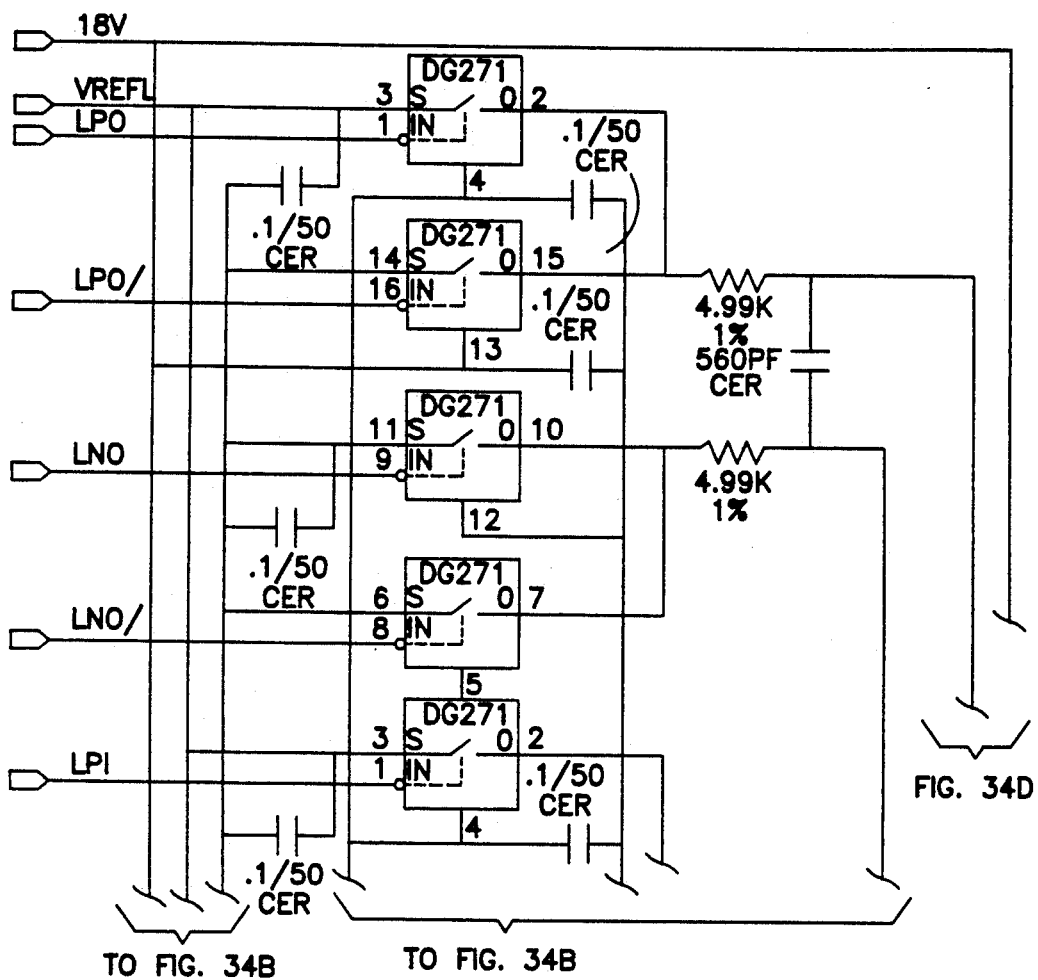
FIGS. 34A, 34B, 34C and 34D of the drawings are portions of a schematic circuit diagram of the left channel digital-to-analog converter (identical to the right channel digital-to-analog converter)
Figure 34B:
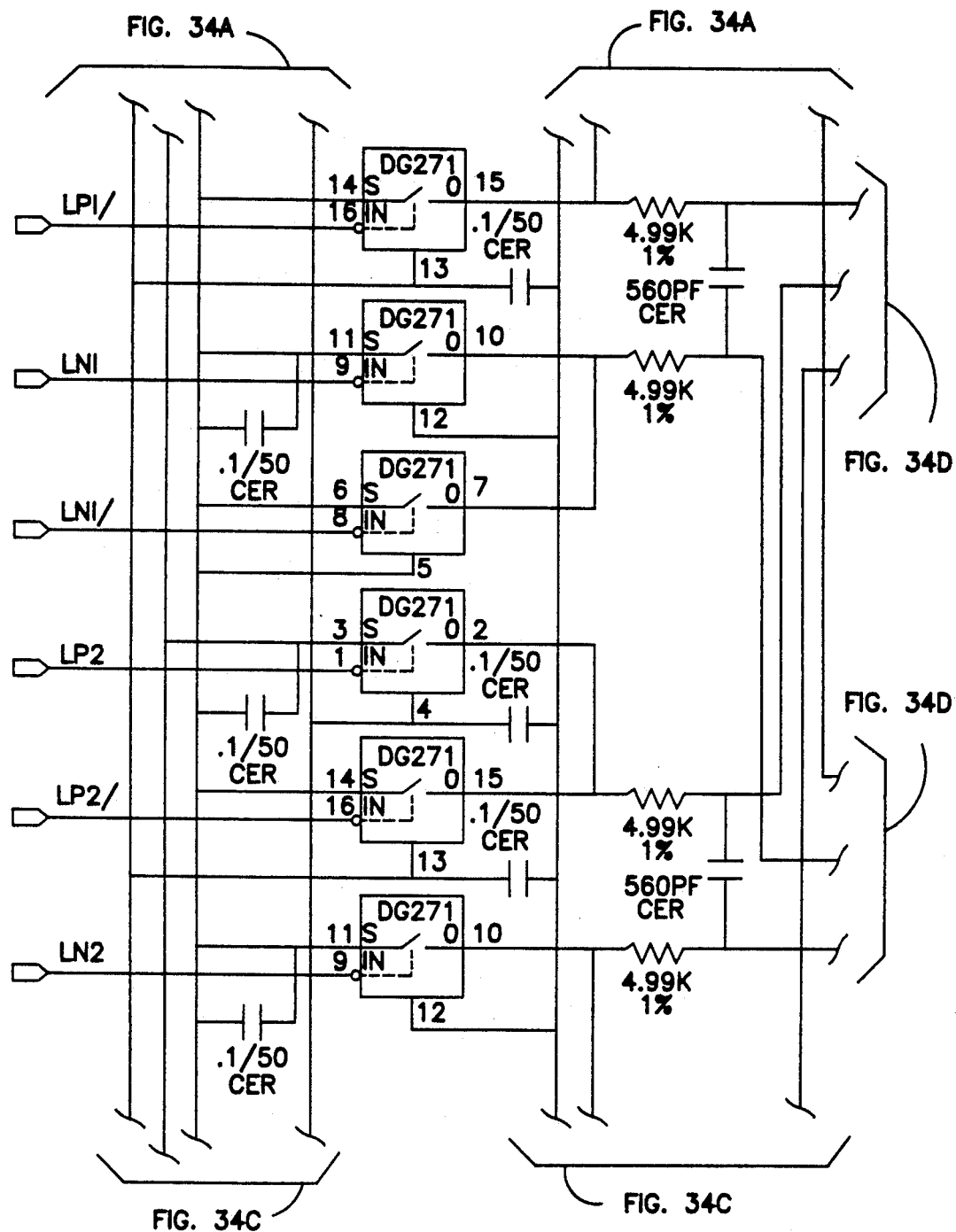
Figure 34C:
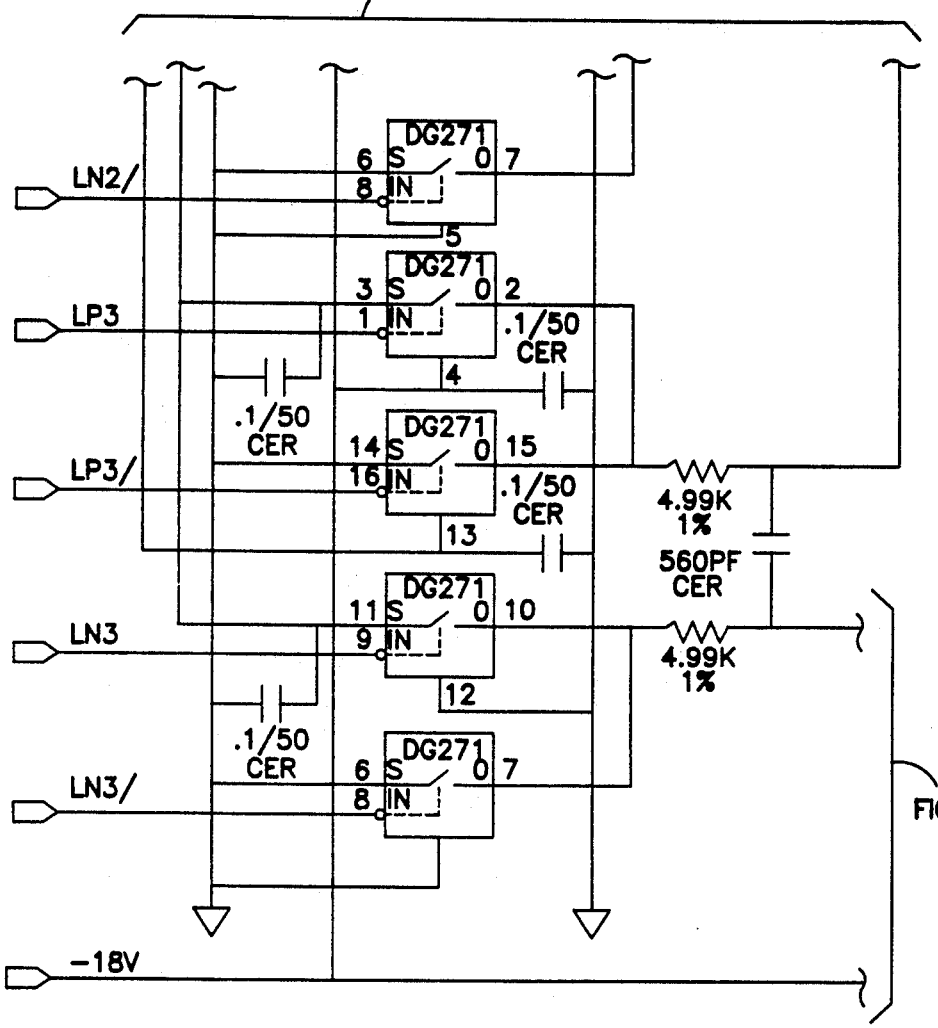
Figure 34D:
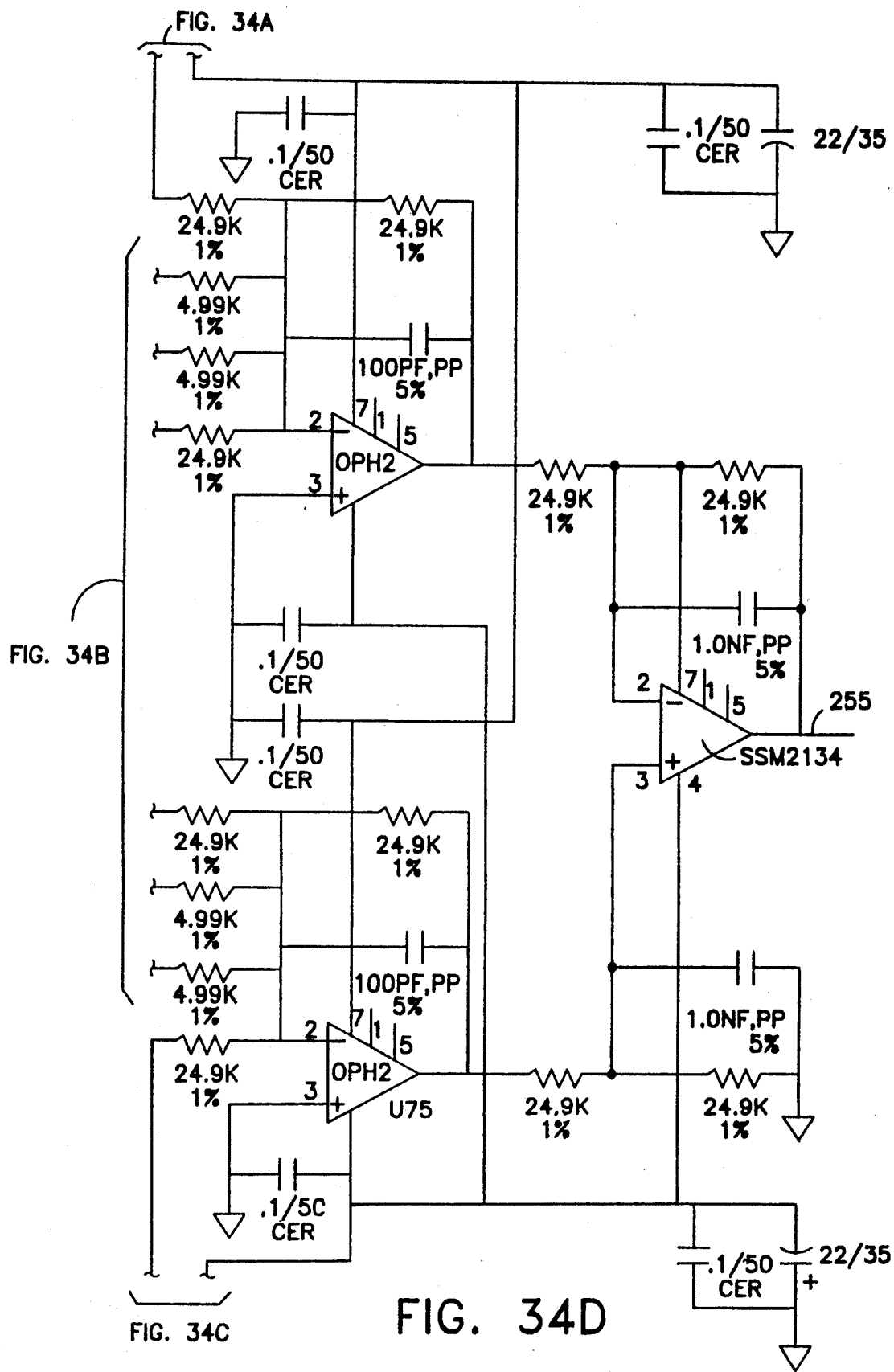

FIGS. 33A and 33B of the drawing together comprise a schematic circuit diagram of the digital-to-analog converter voltage reference circuit 288, left gain register 284 and right gain register 285. Voltage reference circuit 288 is a 10 V low noise reference circuit. A 10 V reference 263 is used only for the reference voltage to the two 12-bit multiplying digital-to-analog converters 460. The gain control/balance function is performed in both the analog and digital domains. Due to limitations in the linearity of the analog gain control circuitry at very low levels, the range of the control will be restricted to 20 or 30 dB. At the lower limit of this gain control circuit, any further attenuation will be performed in the digital domain by DSP 224, before the converter. Analog gain change is performed by varying the voltage references for the PDM digital-to-analog converters. The gain information is transmitted as CDATA 272 from microcontroller 215 in serial, MSB first fashion, along with a data clock signal 273a and two latch enable signals, one for the left channel (LGLE/261), and one for the right channel (RGLE/262). These signals feed a pair of serial input 12-bit multiplying digital-to-analog converters 460, one for each channel. This allows each channel's gain to be set individually. Left gain register 284 received CDATA 272 from microcontroller 215 which includes gain information for both the left and right channels. CDATA 272 is latched into multiplying digital-to-analog converter 460 when LGLE/261 is activated and APFAIL 246 (signaling a power problem) is not forcing multiplying digital-to-analog converter 460 clear. Multiplying digital-to analog converter 460 is capable of a 0.02 dB step-size for 20 dB range or 0.06 dB step over 30 dB range. The gain control data is log converted by microcontroller 215 to reflect the user input and step size and shifted into multiplying digital-to-analog converter 460 on CCLK 273a it is then multiplied by the +10 V reference voltage. Multiplying digital-to-analog converter 460 is a current outputs device such that its output is converted to a voltage by precision opamp resulting in inverted polarity which is then fed into a second opamp in inverting configuration which output 259 is current limited and is fed into PDM digital-to-analog converter 282.

FIGS. 34A, 34B, 34C and 34D of the drawings together comprise a schematic circuit diagram of the left channel digital-to-analog converter 283 which is identical to the right channel digital-to-analog converter 282.

The incoming digital audio data is clocked by 256CLK 270, the low jitter clock produced by PLL 289 to match the phase of the incoming sampling rate signal but multiplied by 256. For each actual digital audio data bit there are three other associated signals used in the PDM digital-to-analog converter 282 (namely, the complement of the data, the negative of the data and the complement of the negative data. These signals control switches in a manner such that when the digital audio data is a "1" switch 1 outputs VREF, switch 2 is open, switch 3 is open and switch 4 is closed latching zero volts. This operation is similar for each of the other three digital audio bits. The outputs of switch 1 and 2 are tied together and connected to opamp 1 in an inverting summer configuration. The outputs of switches 3 and 4 are tied together and connected to opamp 2 in an inverting summer configuration, but the output is then the negative of what it should be. The outputs of opamp 1 and opamp 2 are fed into a difference amplifier which effectively takes the negative of opamp 2 and adds it to the opamp 1 output. This effectively cancels out any noise introduced in the return-to-zero circuit 287 and digital-to-analog converter 282 producing a clean low noise analog audio signal 255.

Figure 35:
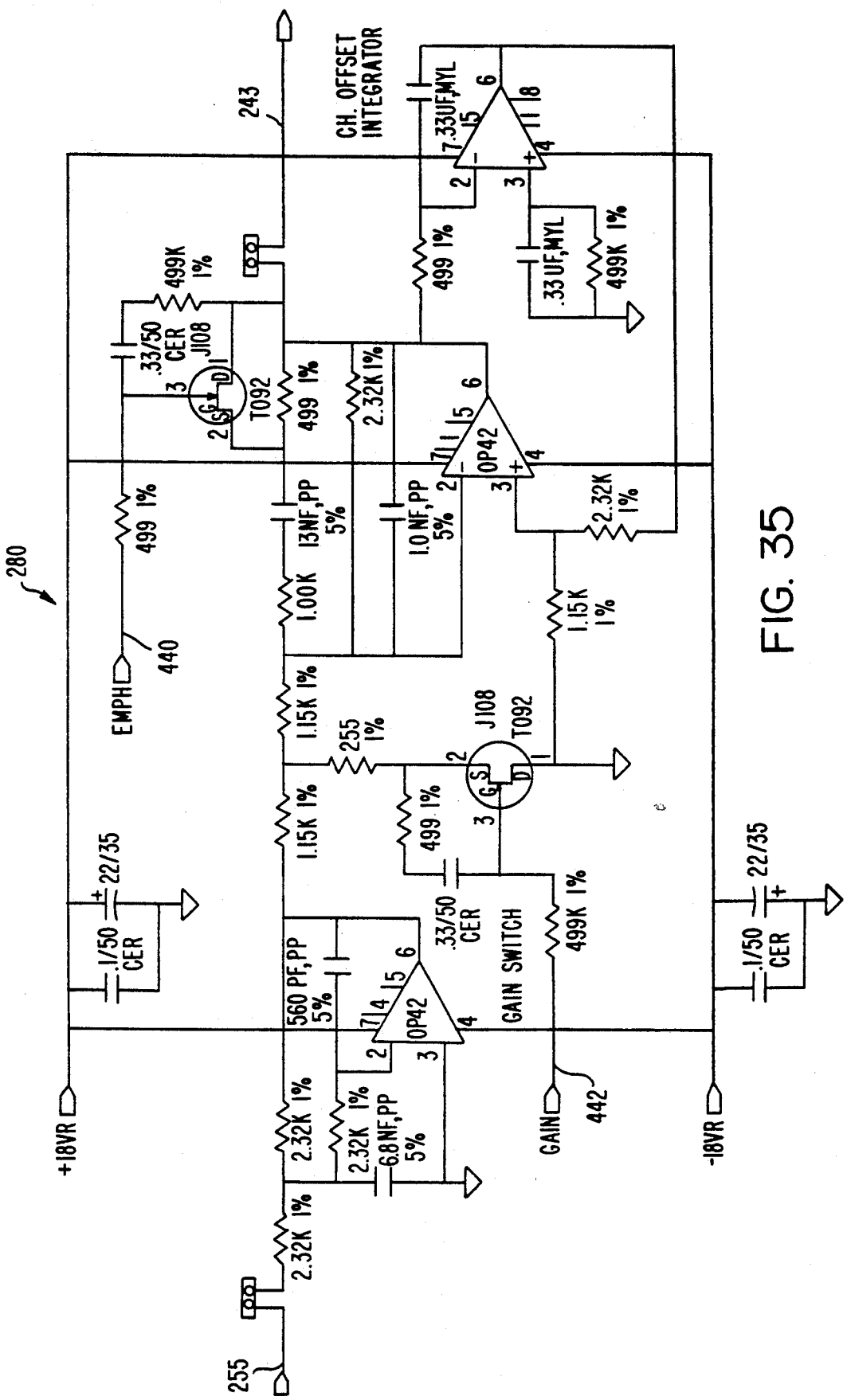
FIG. 35 of the drawings is a schematic circuit diagram illustrating the left channel low-pass filter of the analog board (identical to the right channel low-pass filter)

FIG. 35 of the drawings is a schematic circuit diagram illustrating the left channel low-pass filter 280 of the analog board 106. The low-pass filter receives the output signal 256 from the digital-to-analog converter which are fed into 3rd order Chebyshev design low-pass filters These filters have extremely linear phase response throughout the audio pass-band. Since the audio signals have already passed through digital and analog FIR filters, the primary responsibility of the analog filter is to remove the 128 time converter operating frequency and the out-of-band noise created by the noise-shaping circuitry of the delta-sigma modulator 225. The filter is composed of a 2nd order multiple feedback section, followed by a single-pole section. The input to the second stage incorporates a "T" network with a FET shunting to a resistor at the ground. When the FET is turned on, the signal in the disclosed embodiment is attenuated by +10 dB, allowing the output level range of the unit to better match the receiving device. Like the de-emphasis circuit, AC biasing is added to the gate to insure proper operation at high signal amplitudes. The state of the gain switching circuits has no effect at all on filter response.

The D.C. servo amplifier uses a very low offset amp in an inverting integrator configuration. It monitors the low-pass output signal from the channel, integrates it and feeds the resulting error back into low-pass filter 280. The resultant high-pass characteristic of the completed loop will give a cut-off frequency below 1 Hz.

Figure 36:
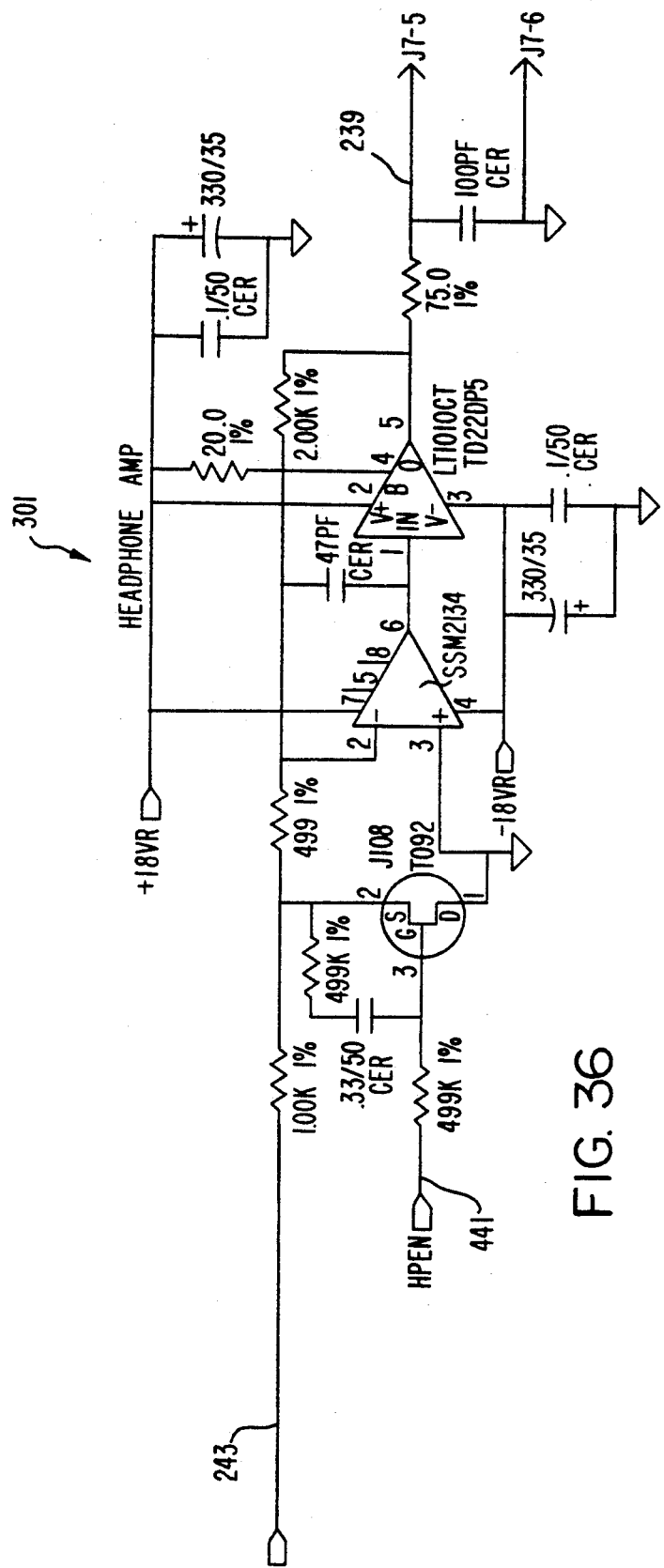
FIG. 36 of the drawings is a schematic circuit diagram of the left channel headphone amplifier (identical to the right channel amplifier)
Figure 37:
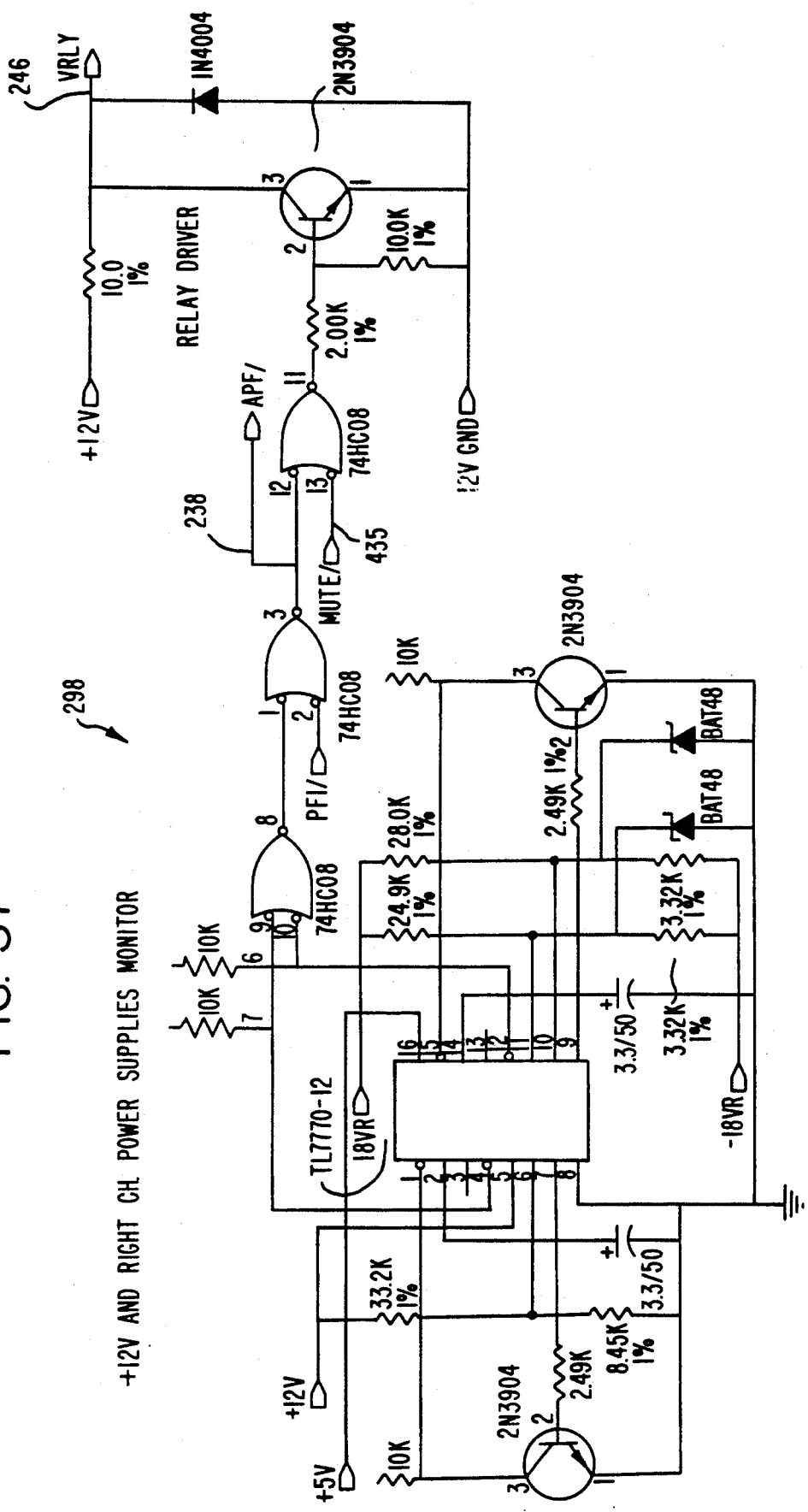
FIGS. 37, 38, 39A and 39B of the drawings are schematic circuit diagrams of the analog board power supply and monitor circuits.
Figure 38:
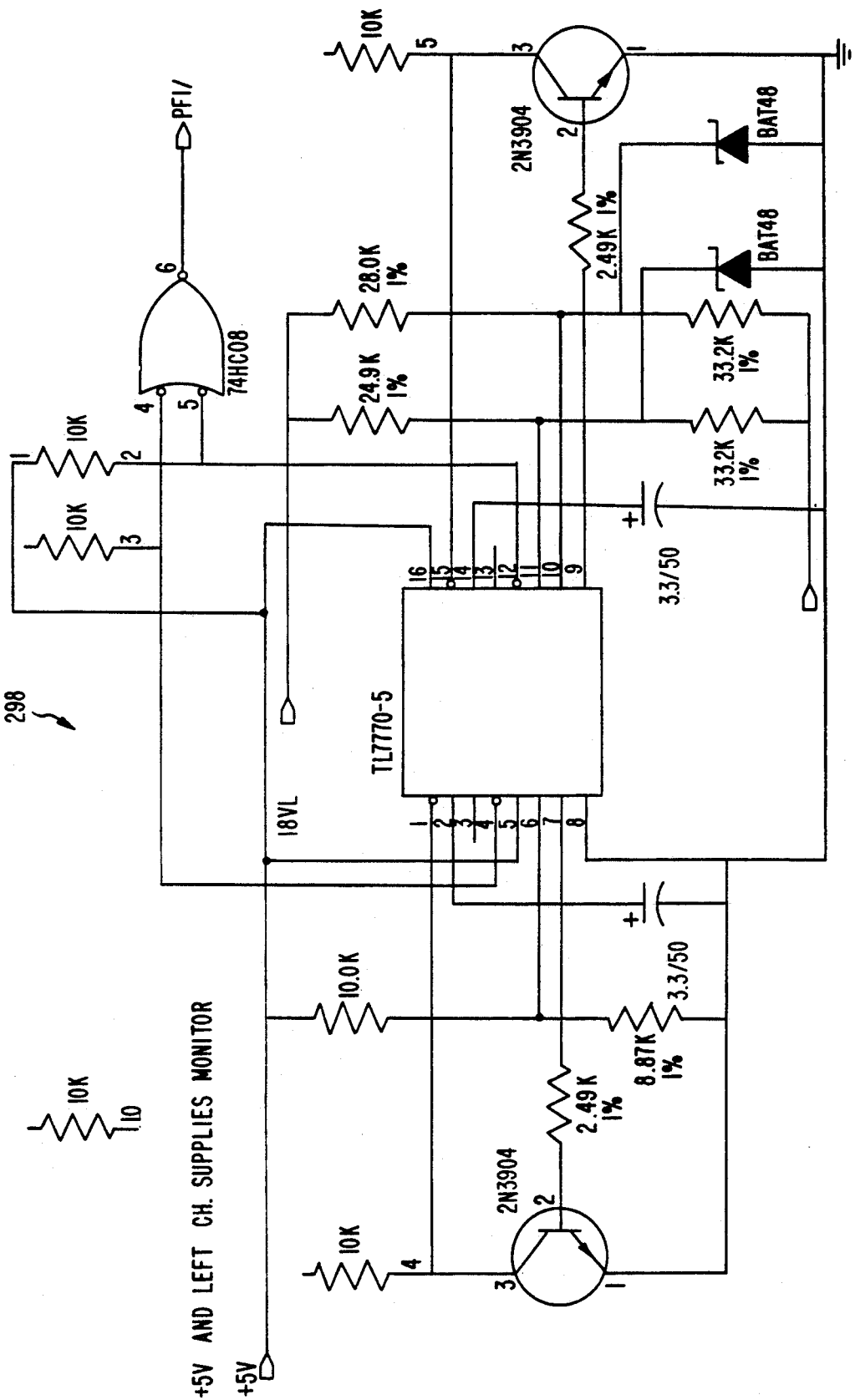
Figure 39A:
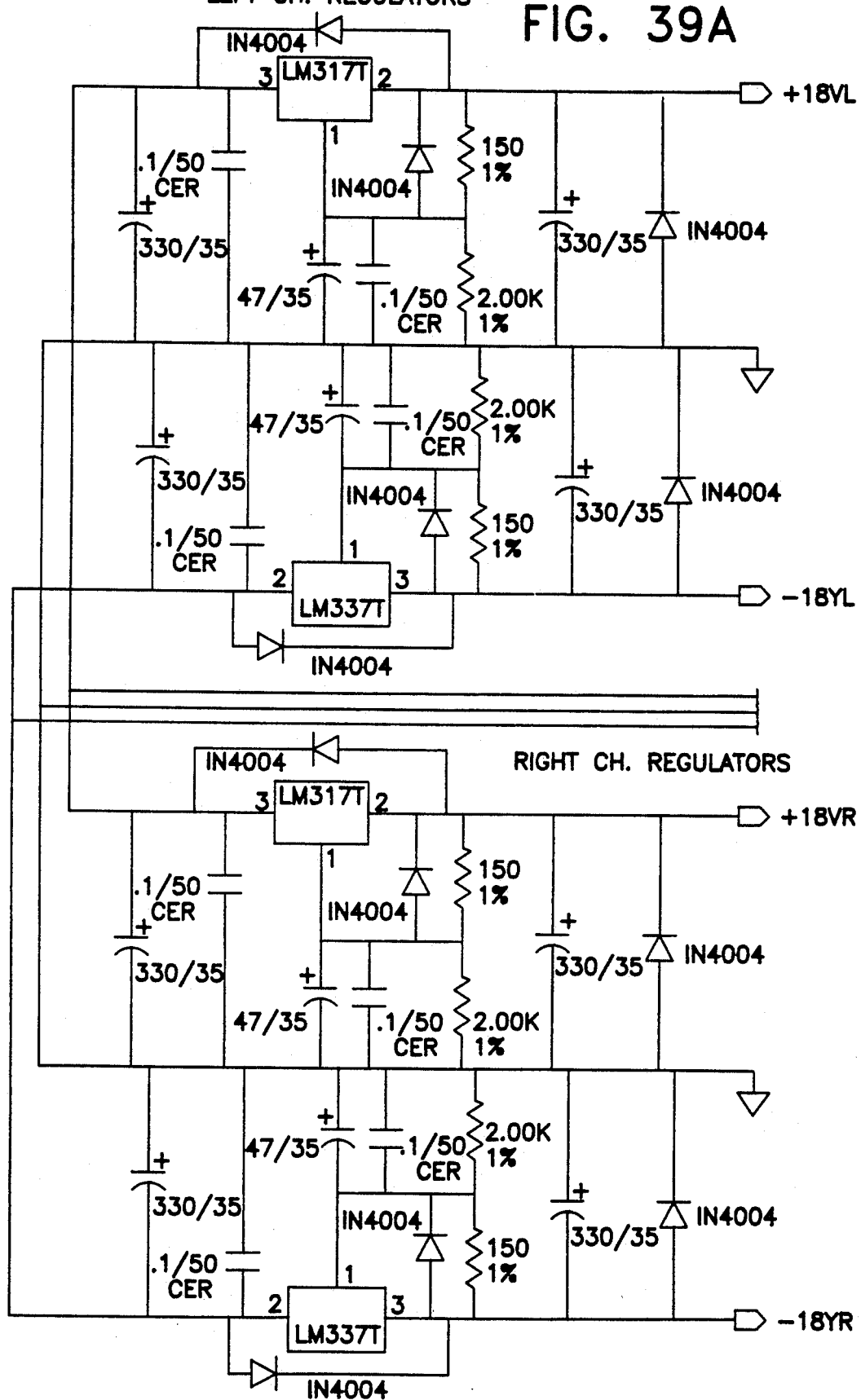
Figure 39B:
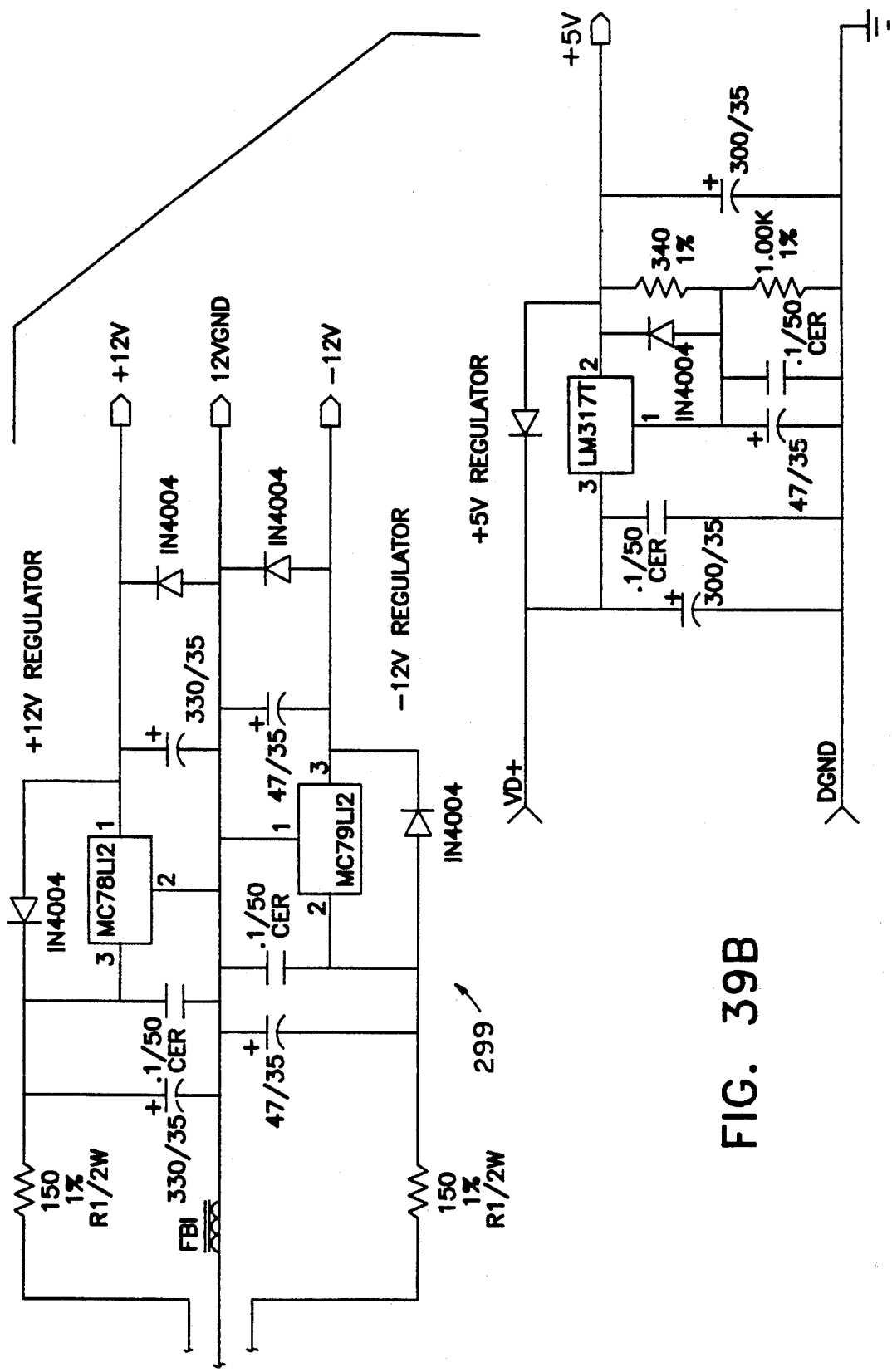

FIG. 36 of the drawings is a schematic circuit diagram of the left channel headphone amplifier. The signal received by the channel headphone amplifier is the output from the low-pass filter de-emphasis circuit 280 and 281. It is a single-ended version of the balanced output drivers described below, with a low-noise opamp driving a high-current unity gain buffer enclosed within the loop. The buffer amp is current limited at better than 150 mA in the present embodiment of the invention, and is capable of driving 8 Ohm loads. The circuit's gain and output impedance have been optimized in the current embodiment of the invention for 32 Ohm headphone set, the most common in use. This input circuit is muted by a FET unless the headphone jack is plugged in. Headphone enable 441 is signaled by microcontroller 215 when it detects that a headphone has been inserted into the headphone jack through various control signals. This results in an adjustment of the signal gain which then enables the FET allowing the analog audio signal 107 to appear on 239 and 240.

FIGS. 36, 37, 38, 39A and 39B of the drawings are schematic circuit diagrams of the analog board power supply 299, and analog supplies monitors 298, and should be readily understandable by those skilled in the art.

Figure 40A:
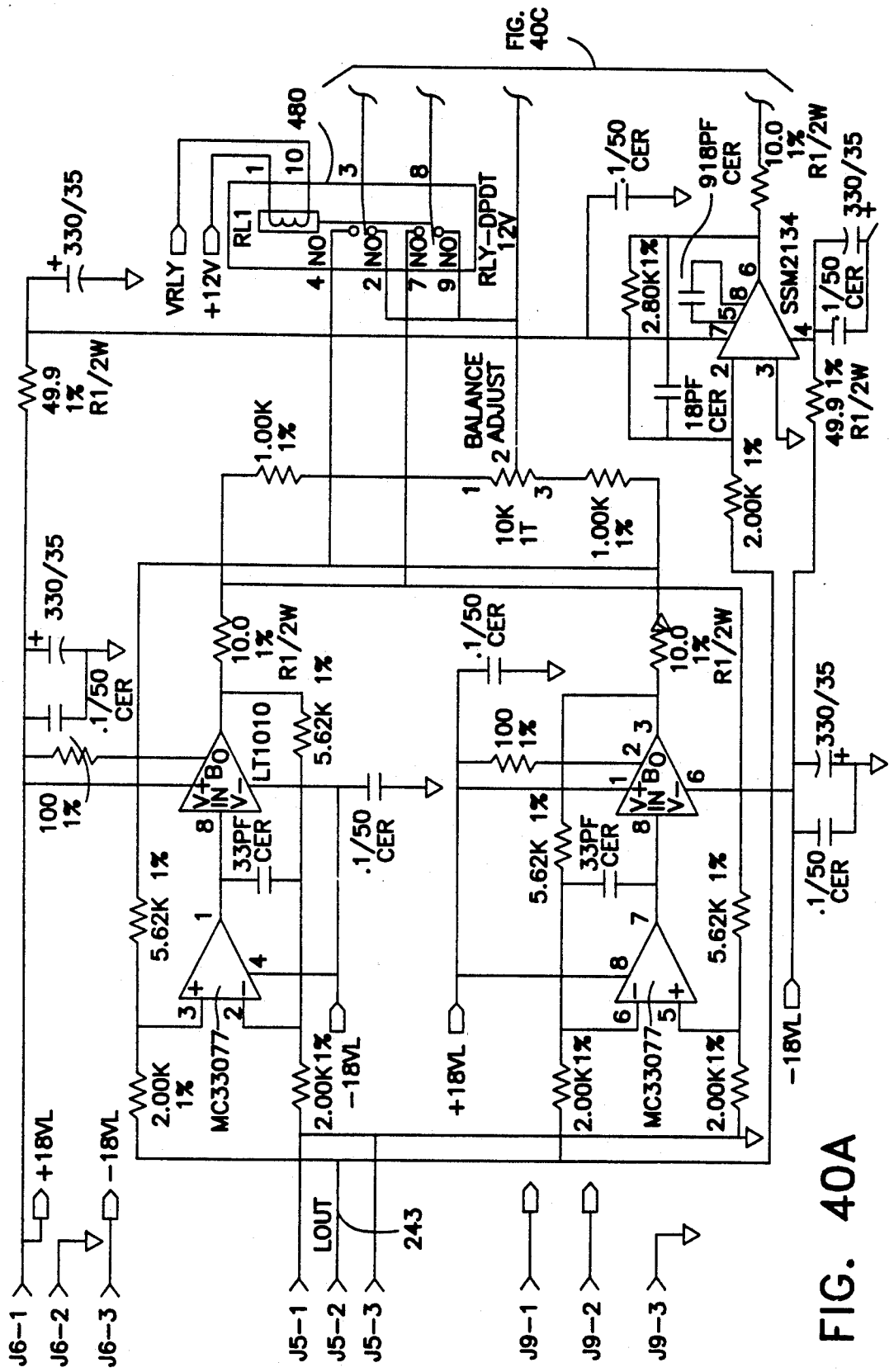
FIG. 40A of the drawings is a portion of a schematic circuit diagram of the output amplifier board of the present invention.
Figure 40B:
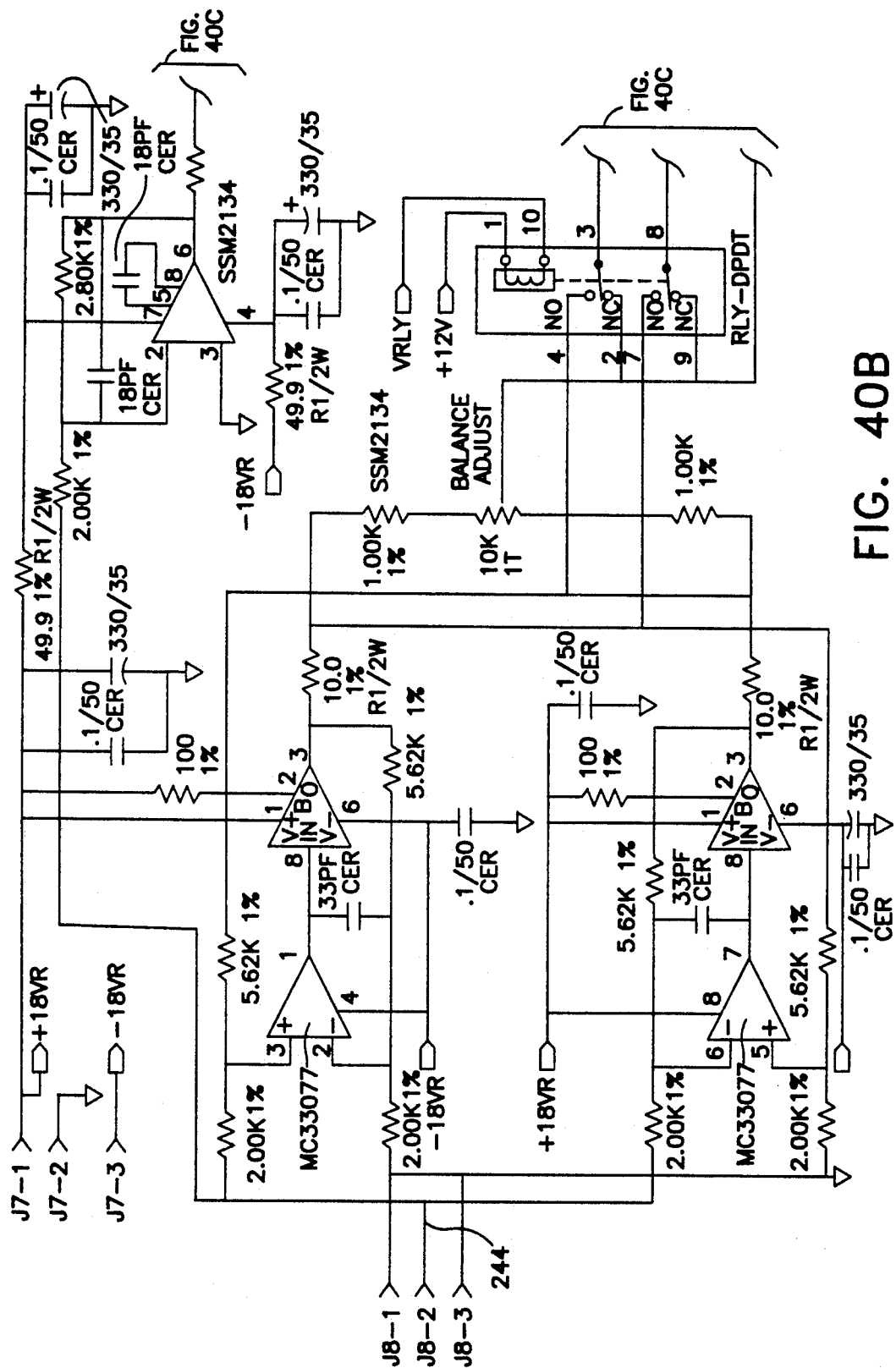
FIG. 40B of the drawings is a portion of a schematic circuit diagram of the output amplifier board of the present invention.

FIGS. 40A, 40B and 40C of the drawings together comprise a schematic circuit diagram of the output amplifier section 108 of apparatus 100. Output amplifier section 108 receives analog audio signals from the left audio channel 143 and right audio channel 244 which are then fed into a 2-stage opamp circuit, the operation of which should be readily understandable by those skilled in the art. The output of these opamp circuits are then sent into relays 480 which are responsible for cutting off any output signal in the case of voltage failure in the analog circuit. The output of the relay circuit is available on two types of audio output plugs, XLR-M 163 and 164 and RCA 174 and 179.

Figure 41:
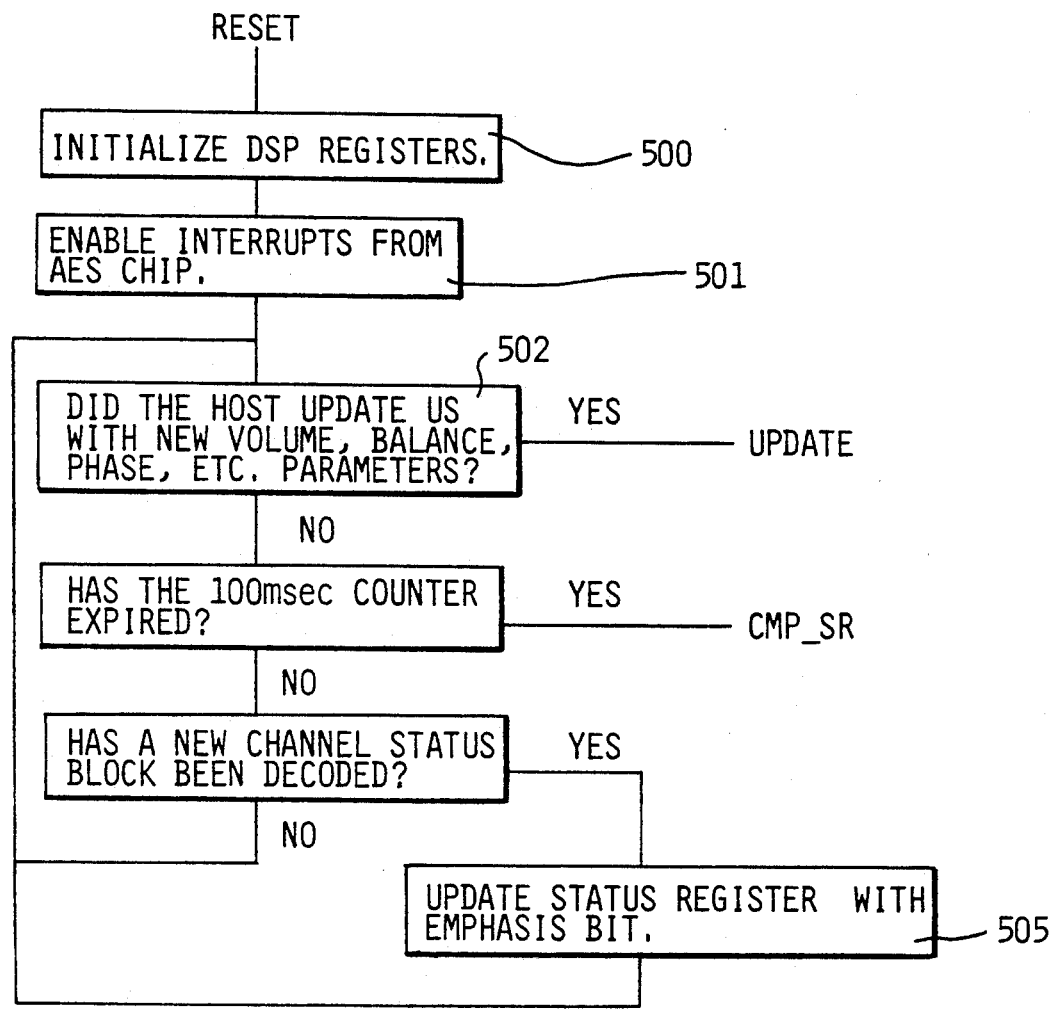
FIGS. 41-46 of the drawings are flow diagrams of the software routines downloaded to the digital signal processor for performing gain control and dithering of digital audio signal words.

FIG. 41 of the drawings is the flow diagram for the main loop of digital signal processor 224. There are two separate flow charts to the digital signal processor code: sample interrupt and main loop. The sample interrupt flow chart describes the process that gets invoked for every sample received by the digital signal processor 224 from digital audio interface receiver 214. The main loop flow chart describes the process that takes place whenever digital signal processor 224 is not busy with the sample interrupt flow chart (shown in FIGS. 45 and 46), and it is primarily involved in communicating with microprocessor 215. In other words, the sample interrupt flow chart describes the interrupt service routine that gets called when digital signal processor 224 is interrupted with a new left or right channel sample 383 from digital audio interface receiver 214; the main loop flow chart is a simple background loop that is continuously being interrupted by the sample interrupt routine.

There is actually a third process running in digital signal processor 224; a communications process that continuously sends the host microcontroller status/error information, as well as the currently computed left (ANLGL) and right (ANLGR) analog gains which microprocessor 215 then transmits to analog board 106.

Digital signal processor 224 receives a reset signal DSPRST/349, from microprocessor 215. Upon this reset signal, digital signal processor 224 performs action 500, initializing the various internal registers; RAM's 373, 374 and 375; and AES-DSP status register 372. Then, action 501 enables the interrupts from digital audio interface receiver 214, Fsynch 382 and signal 384, such that they interrupt digital signal processor 224 when digital audio data becomes available. Then, digital signal processor 224 determines whether microprocessor 215 has sent new user inputted data to digital signal processor 224 which needs to be acted upon. Action 502 branches upon an update from microprocessor 215 to subroutine "update," shown in FIG. 42. If there has been no update by microprocessor 215, digital signal processor 224 continues into action 503 which determines whether or not the digital signal processor internal 100 millisecond counter has counted down to zero. If the counter is zero, digital signal processor 224 branches out to CMP_SR (compute sampling rate) shown in FIG. 44 or else continue to action 504 which determines if a new channel status block has been decoded. This action analyzes AES_CBIT 380 which contains the emphasis indicator for the incoming digital audio word. If a new channel status block is not available digital signal processor 224 loops back to action 502; and determines whether microprocessor 215 has sent new updated user inputted information.

Figure 42:
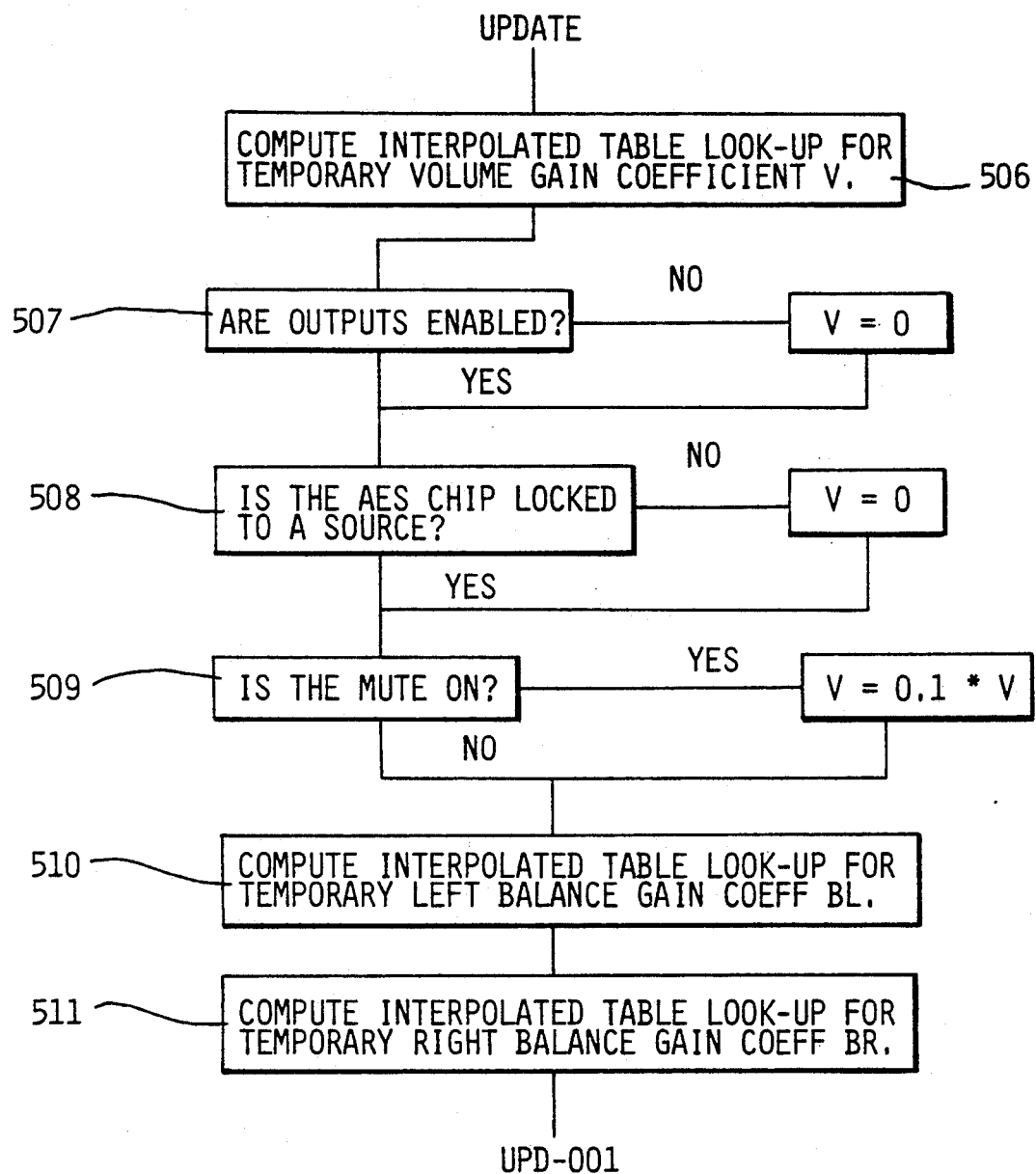

FIG. 42 of the drawings is a flow diagram of the "update" subroutine for digital signal processor 224. The "update" sub-routine is called by main loop program shown in FIG. 41 and is responsible for updating the user parameters when the user has inputted a new parameter. In action 506, digital signal processor 224 looks at the encoded signal from microprocessor 215 for the position of volume knob 146 and interpolates the volume knob position to a temporary gain coefficient, V, from a table look up which is located in RAM internal to DSP 224. After interpolating V, "update" continues, with action 507 determining whether the audio outputs are enabled. Outputs are disabled if the voltage supplies fail and/or data is unavailable. If outputs are disabled then DSP 224 sets V to zero else it merely continues on to action 508 where a determination of whether digital audio interface receiver 214 has locked on to a source is made by analyzing AES_LOCK found in AES-DSP status register 372. If digital audio interface receiver 214 has not locked on to the incoming sampling rate then digital signal processor 224 sets the V to zero, else action 508 continues on to action 509 in which digital signal processor 224 determines whether mute switch 144 is on. If mute switch 144 is on, digital signal processor 224 sets V to 10% V as interpolated from volume knob 146 information supplied by microprocessor 215. If mute is not on, digital signal processor 224 leaves V and continues onto action 510 and 511 in which it analyzes data from microprocessor 215 corresponding to the displacement and rotation of balance optical encoder 143 shown in FIG. 3. The displacement and rotation of optical encoder 143 represents the left and right channel balance desired by the user which is interpolated by digital signal processor 224 using the various values in a data table contained in the DSP's internal data RAM to determine the interpolated values BL (balance left) and BR (balance right).

Figure 43:
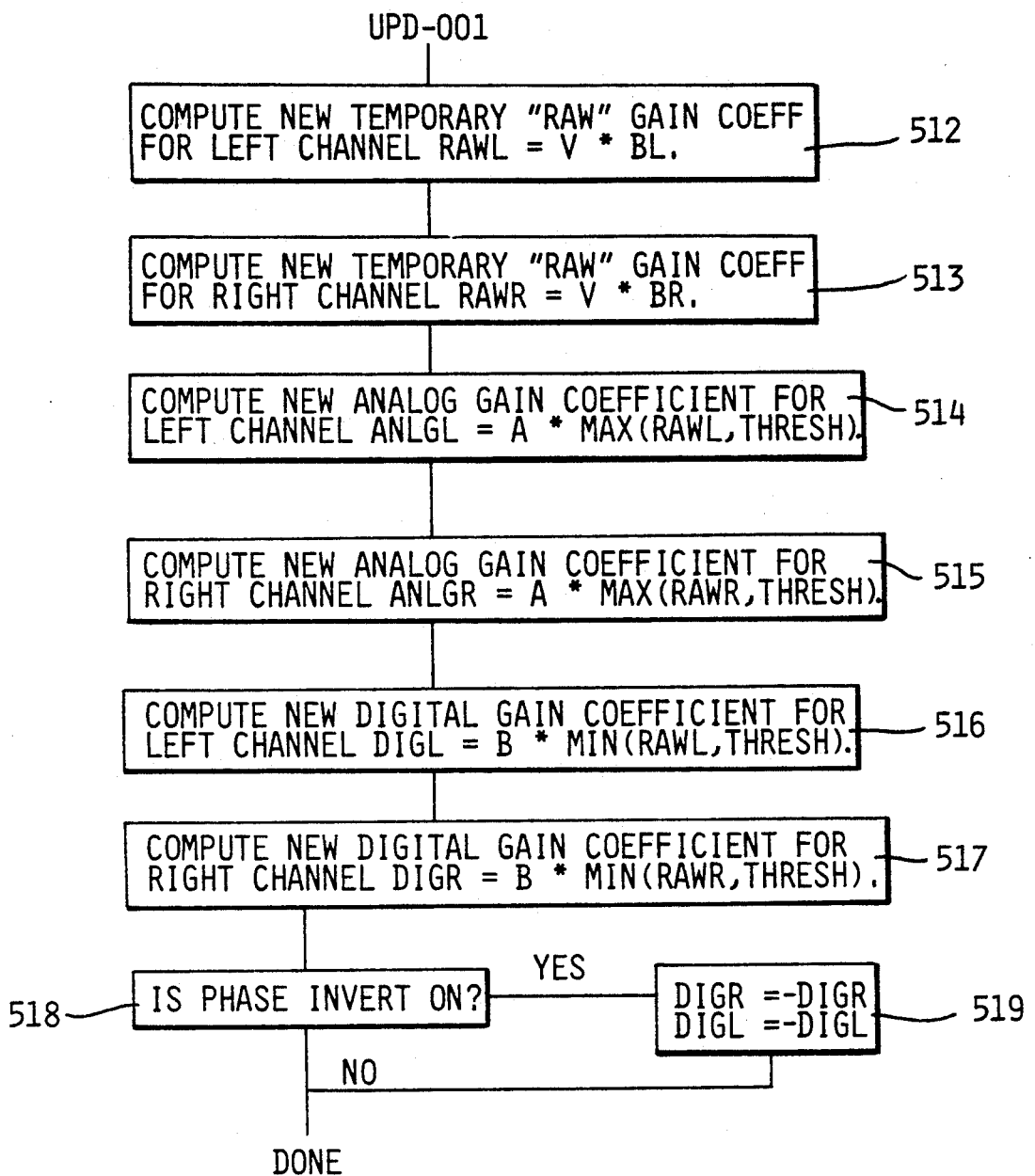

FIG. 43 which is a flow diagram representing the second half of the "update" subroutine. Digital signal processor 224 using BL and BR computes the temporary "raw" gain coefficients RAWL and RAWR for the left and right channels in actions 512 and 513 respectively. Multiplying V by BL in action 512 to determine RAWL and V by BR to determine RAWR.

The remainder of the "update" subroutine performs the hybrid digital/analog volume control. In the digital-to-analog conversion system, the analog input signal may be attenuated in 2 ways: in the digital domain, before conversion, or in the analog domain, after digital-to-analog conversion. There are advantages and disadvantages to both approaches. Attenuation in the digital domain involves performing multiplication by a gain coefficient which produces extra bits of precision which must then be dithered and truncated to 18-bits before further processing. The consequence of this overall process is that the noise floor remains constant during attenuation; the audio signal fades into a constant level of background noise. On the other hand, attenuation in the analog domain results in attenuation of both the noise and the audio signal. In order to avoid the disadvantages of either of these approaches, volume control in apparatus 100 is a unique hybrid approach taking advantage of the single-bit digital-to-analog converter architecture.

Varying the reference voltage to the single-bit digital-to-analog converter effectively controls the output volume. Attenuation in the "upper" part of the volume controls range is handled by controlling the reference voltage to each channel's single-bit digital-to-analog converter with a separate 12-bit multiplying digital-to-analog converter. This multiplying digital-to-analog converter is in turn controlled by microcontroller 215 which determines the volume knob position by performing an analog-to-digital conversion of the DC level generated by the potentiometer of the front panel sends this value to DSP 224 in which analog gain coefficients are calculated for both the left and right channels, and then communicated by multiplying digital-to-analog converters 460 through control register 290 on analog board 106. In this way, volume can be controlled digitally from the microcontroller.

When volume control is turned into the "lower" part of the attenuation range, the quantization due to the 12-bit multiplying digital-to-analog converter will make the volume steps audible. Therefore, once the volume knob is turned past a certain threshold, THRESH, the digital signal processor 224 will start to attenuate the digital signal, with 12-bit multiplying digital-to-analog converter 460 remaining constant thus supplying a constant reference voltage to DAC 282. THRESH is estimated to be approximately $-30$ to $-40$ dB below full scale. Volume is therefore controlled digitally below this threshold but, by this time, the floor noise has been reduced by 30 to 40 dB, minimizing the disadvantage of the digital control discussed above.

This hybrid digital/analog gain control is accomplished by computing left channel analog gain (action 514) and right channel analog gain (action 515), left channel digital gain (action 516) and right channel digital gain (action 516). Analog gain for each channel is computed by determining the maximum of RAWL (from action 512) and THRESH for the left channel and the maximum of RAWL (from action 513) and THRESH for the right channel and separately multiplying each by a coefficient A resulting in ANLGL and ANLGR. Coefficient A is a device-dependent constant which shifts the most significant bits of the gain coefficient right such that they fit into the width of multiplying digital-to-analog converter 460. For instance, where the gain coefficient has M bits and the multiplying digital-to-analog converter is N bits wide, coefficient A equals $\frac{1}{2}\exp(M\text{-}N)$. ANLGL and ANLGR are the analog gain signals which are sent microprocessor 215 which in turn sends them to multiplying digital-to-analog converters 460 to vary the voltage reference on PDM digital-to-analog converters 282 and 283.

Computation of the digital gain coefficient DIGL (action 516) and DIGR (action 517) requires determining the minimum of RAWL and THRESH and them minimum of RAWR and THRESH. Once these minimums have been determined, they are multiplied by a coefficient B resulting in DIGL for the left channel and DIGR for the right channel. Coefficient B is a device-dependent constant and is equal to 1/THRESH to make DIGR and DIGL fractional values which are required for proper multiplication in digital signal processor 224.

The final step of the "update" subroutine is to determine whether or not microprocessor 215 has sent a phase inversion signal which is user inputted by switch 156 shown on FIG. 3. If there was a phase invert signal action 518 branches to invert both the right and left gain coefficients in action 519 which will result in the phase inversion of the digital audio signal. Once actions 518 (and 519) are completed, the "update" subroutine is finished and control is returned to the main loop flow chart found on FIG. 41.

Figure 44:
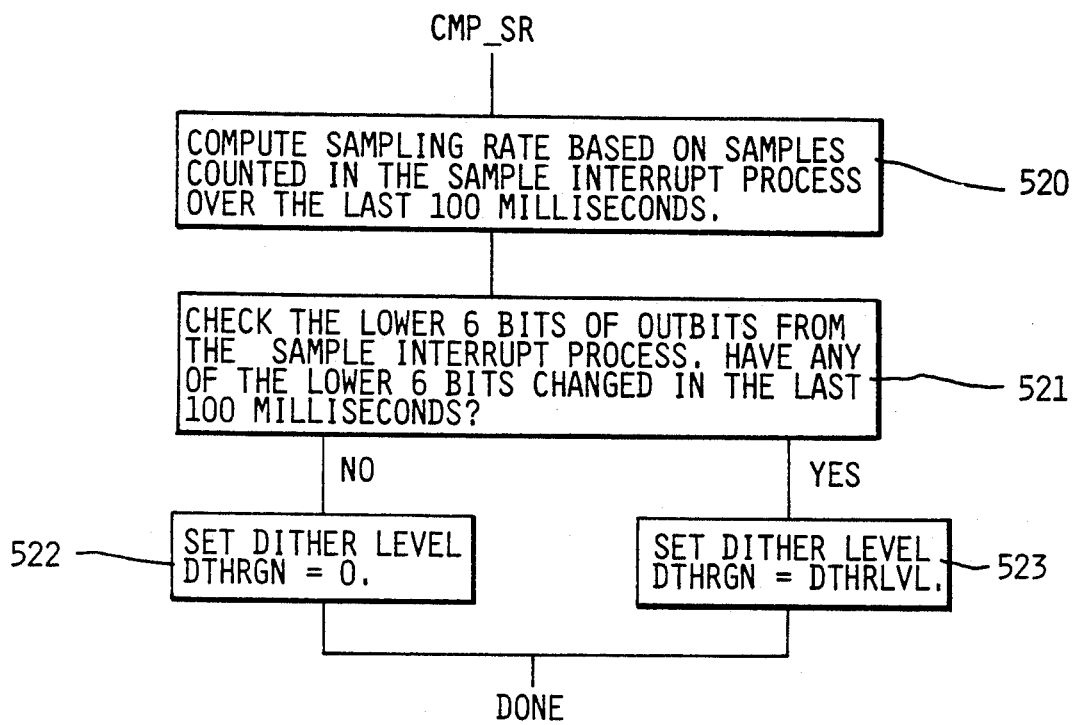

FIG. 44 of the drawings is a flow diagram of the "compute sample rate", "CMP_SR," subroutine for digital signal processor 224. The main loop flow chart shown in FIG. 41 calls upon "compute sample rate", "CMP_SR," subroutine once it has determined that the internal 100 millisecond counter has expired. This subroutine determines the sample rate used internally in digital signal processor 224. Action 520, the digital signal processor 224 takes the number of input digital audio bits accumulated in the last 100 millisecond period and divides them by the 100 millisecond constant resulting in the sampling rate of the data in KHz. Once the sampling rate has been determined, "compute sampling rate" subroutine determines whether the last 6 bits in the digital audio bit queue have changed in this time period. If any of the last 6 bits have changed, action 523 sets the dithering level such that the bits above 18 bits of precision can be dithered, thus retaining the dynamic range and low noise response desired in apparatus 100. If the 6 bits have not changed in action 521, then 522 turns off dithering. Once the dithering has been determined, control is returned to the main loop flow chart found in FIG. 41.

Figure 45:
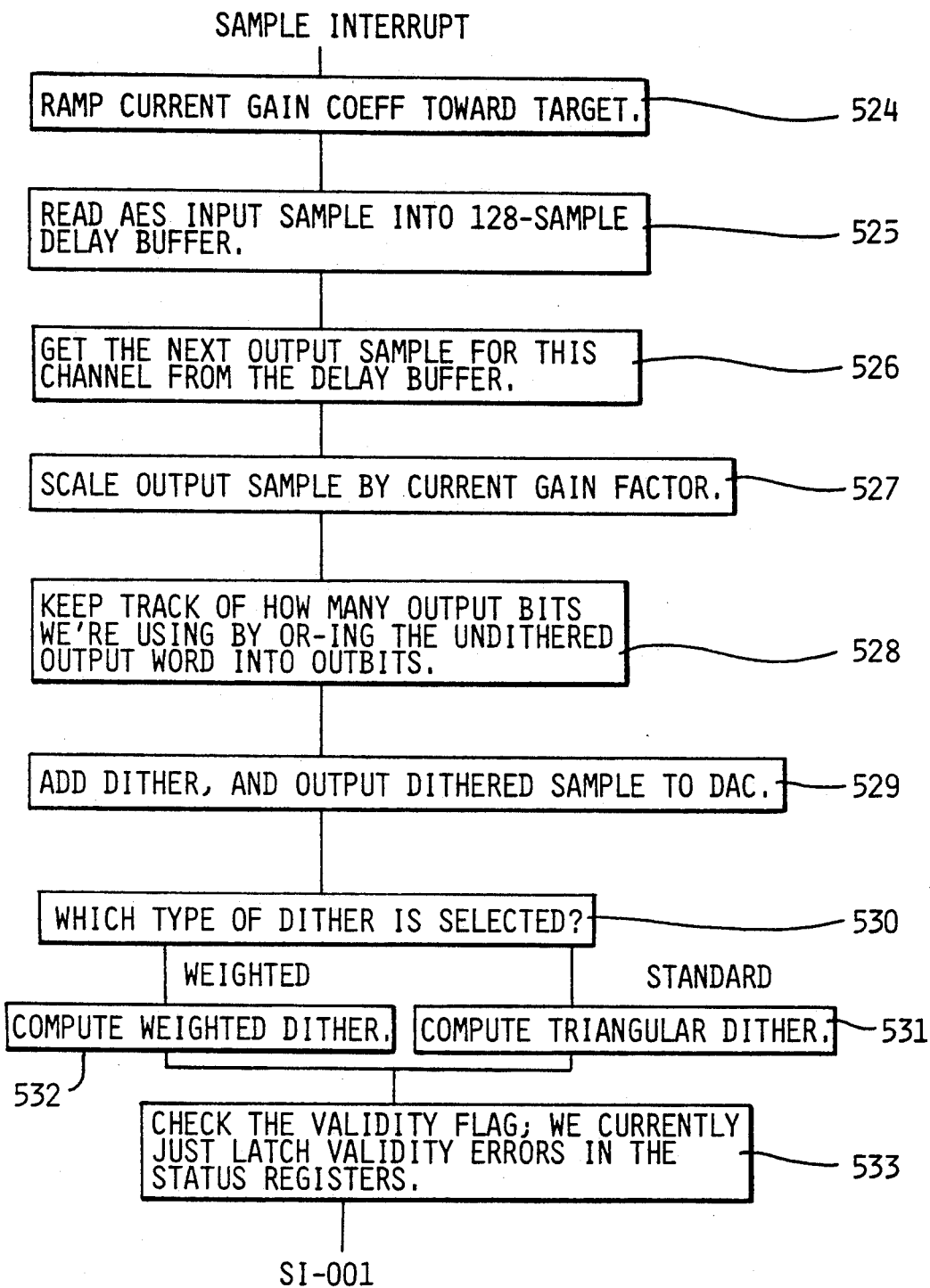
Figure 46:
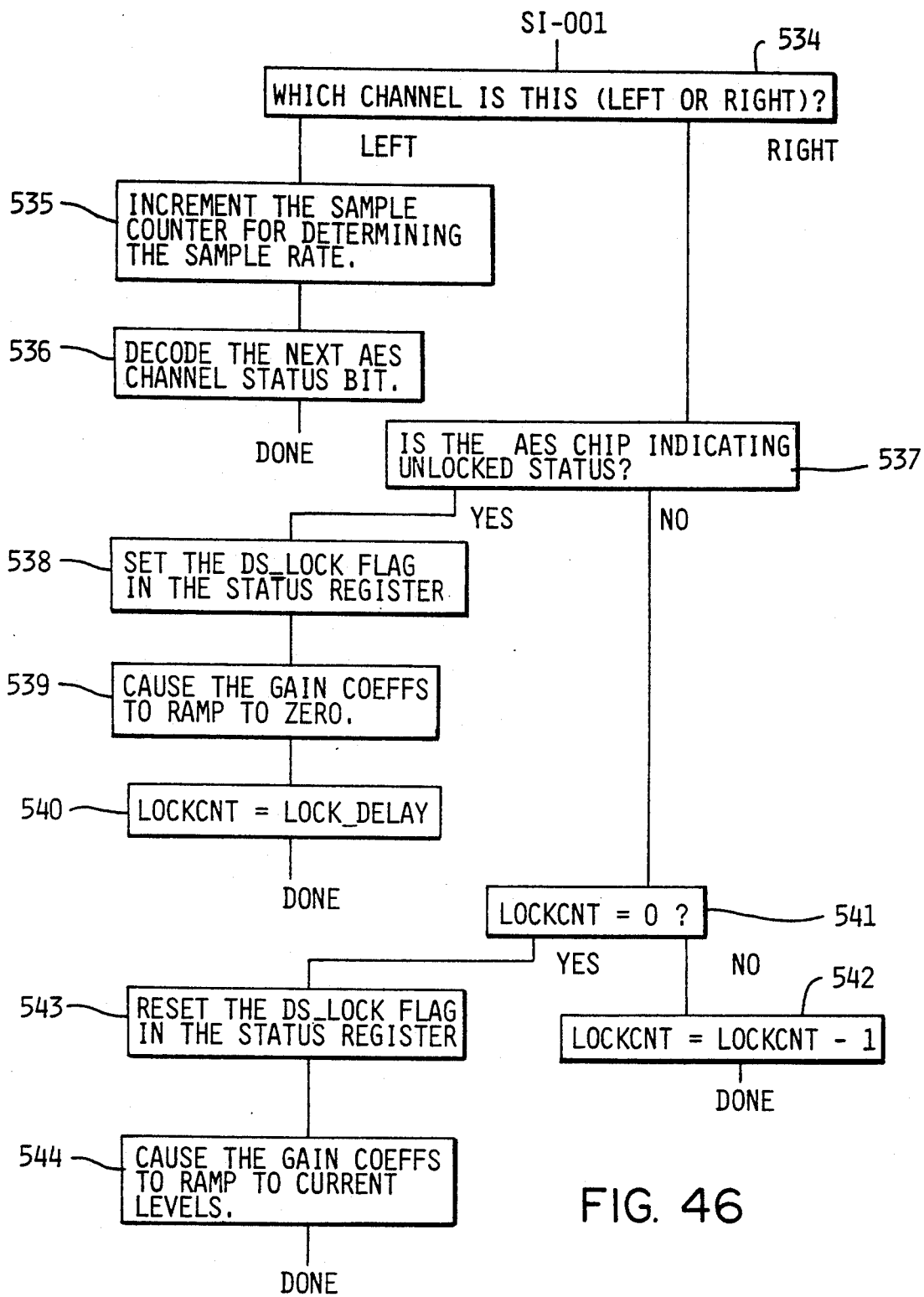

FIG. 45 of the drawings is a flow diagram illustrating a sample interrupt processing flow chart for digital signal processor 224. The sample interrupt begins with action 524 which takes the current gain and ramps towards the target gains ANLGL, ANLGR, DIGL and DIGR. Gain settings that are within the range of multiplying digital-to-analog converter 460 are performed with analog gain and digital signal processor 224 digital gain is set to a maximum (no attenuation). Below this range the digital signal processor 224 gain value is lowered. Every volume knob position therefore has a corresponding digital value for the analog and digital signal processor gain coefficients.

So, essentially the current gain coefficient is raised by incremental amounts until it reaches the updated target values in action 524. At completion of 524, digital signal processor 224 continues into action 525 in which the digital signal processor 224 reads in data from the digital audio interface receiver 214 on line SRG 383 and places this digital audio word into the 128 digital audio word size delay buffer which is implemented in data RAM internal to DSP 224. Next, the digital signal processor 224 obtains the next output sample from the delay buffer and in action 527, its scales were sampled by the current gain factors DIGL and DIGR. Digital signal processor 224 continues in its sample interrupt mode in action 528 by keeping track of how many of the output bits from the sample delay buffer are being used by OR-ing the undithered output word into the out bit register. In action 529, the digital signal processor continues by adding dither and output dithered sample to the digital-to-analog converter. At this point, digital signal processor 224 determines which type of dither was use selected by accessing microprocessor 215 and looking for the status data responsible. From this, it branches into either the Triangular, Weighted, or Standard dither formula which it computes in 532 and 531 respectively using the dither equations known in the prior art. Following dithering, in action 533, the digital signal processor checks the AES_VFLG (validity flag) 381 and currently latches that validity error into the status register. Following the determination of validity, the digital signal processor 224 determines which channel's data it is currently processing in action 534.

In action 534, if the current data is right channel digital audio data then action 537 determines, using AES-DSP status register 372, whether or not digital audio interface receiver 214 has locked on the incoming sampling rate of digital audio data 213. If AES_LOCK indicates "unlock" then digital signal processor 224 continues with action 538 setting DSP_LOCK flag in status register 372 and ramps the digital gain coefficients to zero in action 539. In action 540, LOCKCNT is set equal to the constant LOCK_DELAY to stall the DSP for enough time for digital audio interface receiver 214 to lock. If digital audio interface receiver 214 has locked upon the incoming sample rate of digital audio data 213, then AES_LOCK indicates a "lock" and digital signal processor 224 determines if digital audio interface receiver 214 has really locked onto the signal (LOCKCNT is equal to zero). If digital audio interface receiver 214 has really locked onto the signal the DSP_LOCK flag is reset to indicate that digital audio interface receiver 214 has recently locked and the gain coefficients are ramped to DIGL and DIGR. If the LOCKCNT is not equal to zero, then digital signal processor 224 sets lock count equal to lock count minus one (in action 542).

If it is processing left digital audio data, it continues in action 535 by incrementing the sample counter used by "compute sample rate" subroutine shown in FIG. 44. In action 536, DSP 224 decodes the next AES_CBIT to determine whether or not the incoming digital audio word has been pre-emphasized.

What is claimed is:

1. In a digital-to-analog converter—preamplifier apparatus of the type which serves as an interface between an external source of digital audio signal data and an external audio component, and being capable of receiving as an input audio signal data in a digital format, identifying the sampling rate of said digital audio signal data using a digital audio interface receiver, and generating as an output an audio signal in the analog domain using a digital-to-analog converter, a clock signal generation apparatus, said apparatus comprising:

voltage source means for generating a stable reference voltage;

two or more switch means each having an input and an output, the input of each of said two or more switch means being electrically connected to said voltage source means, two or more voltage controlled crystal oscillator means each having an input and an output, the input of each being electrically connected to said output of each of said two or more switch means, respectively, each of said voltage controlled crystal oscillator means generating a specific frequency;

first selection means for selecting which one of said two or more switch means shall be closed toward connecting said voltage source means to said one of said two or more voltage controlled crystal oscillator means associated with the selected one of said two or more switch means, said first selection means being controlled by the identify of said sampling rate as determined by said digital audio interface receiver;

second selection means having two or more inputs and an output, each of said two or more inputs being electrically connected to said of said outputs of each of said two or more voltage controlled crystal oscillator means, respectively, said second selection means being controlled by the identity of said sampling rate as determined by said digital audio interface receiver such that one of said two or more inputs is electrically connected to said output dependent upon said identity of said sampling rate;

divider means having an input and an output, said input being electrically connected to said output of said second selection means;

phase comparator means having two inputs and an output, one of said two inputs electrically connected to said output of said divider means, the second of said two inputs electrically connected to said digital audio interface receiver for generating a voltage representing the difference in phase between said two inputs;

differential loop filter means having an input and an output, said input electrically connected to said output of said phase comparator means, said differential loop filter means serving to filter the output of said phase comparator means toward removing any jitter, said output of said differential loop filter means connected to said input of each of said two or more voltage controlled crystal oscillator means, two or more Schmitt trigger means, said divider means, said phase comparator means and said differential loop filter means serving to generate a stable output clock signal at a frequency corresponding to said frequency of said voltage controlled crystal oscillator selected by said first selection means.

2. The invention according to claim 1 wherein:

said two or more Schmitt trigger means are each respectively electrically connected between the output of each of said two or more voltage controlled crystal oscillator means and the two or more inputs of said second selection means, said Schmitt trigger means serving to square said specific frequency signal generated by said two or more voltage controlled crystal oscillator means.

* * * * *

UNITED STATES PATENT AND TRADEMARK OFFICE
CERTIFICATE OF CORRECTION

PATENT NO. : 5,266,908

DATED : November 30, 1993

INVENTOR(S) : Michael A. Koulopoulos et al.

It is certified that error appears in the above-identified patent and that said Letters Patent is hereby corrected as shown below:

| | |
|---|---|
| Col. 1, line 61 | Delete "o" and insert instead -- on --. |
| Col. 2, line 25 | Delete "single chip" and insert instead -- single-chip --. |
| Col. 4, line 40 | Delete "ar" and insert instead -- are --. |
| Col. 6, line 3 | Delete "ar" and insert instead -- are --. |
| Col. 13, line 21 | Delete "message" and insert instead -- messages --. |
| Col. 14, line 53 | Delete "an" and insert instead -- any --. |
| Col. 18, line 23 | After "is" insert -- a --. |
| Col. 18, line 25 | Delete "100" and insert instead -- 100. --. |
| Col. 18, line 50 | Delete "DS" and insert instead -- DSM --. |
| Col. 19, line 15 | Delete "Fax" and insert instead -- Fsx --. |
| Col. 21, lines 31 and 32 | Delete "compare" and insert instead -- comprise --. |
| Col. 26, line 13 | Delete "10". |
| Col. 26, line 16 | Delete "44" and insert instead -- 444 --. |
| Col. 27, line 30 | After "filters" add -- . --. |
| Col. 32, line 68 | Delete "identify" and insert instead -- identity --. |

UNITED STATES PATENT AND TRADEMARK OFFICE
CERTIFICATE OF CORRECTION

PATENT NO. : 5,266,908
DATED : November 30, 1993
INVENTOR(S) : Michael A. Koulopoulos et al.

It is certified that error appears in the above-indentified patent and that said Letters Patent is hereby corrected as shown below:

Col. 33, line 5    Delete "said of said" and insert instead -- each of said --.

Signed and Sealed this

Twenty-eight Day of March, 1995

Attest:

BRUCE LEHMAN

Attesting Officer    Commissioner of Patents and Trademarks